US008982603B2

(12) United States Patent
Azuma et al.

(10) Patent No.: US 8,982,603 B2
(45) Date of Patent: Mar. 17, 2015

(54) CROSS POINT VARIABLE RESISTANCE NONVOLATILE MEMORY DEVICE AND METHOD OF READING THEREBY

(75) Inventors: Ryotaro Azuma, Osaka (JP); Kazuhiko Shimakawa, Osaka (JP); Yoshikazu Katoh, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 352 days.

(21) Appl. No.: 13/636,169

(22) PCT Filed: Apr. 27, 2012

(86) PCT No.: PCT/JP2012/002904
§ 371 (c)(1),
(2), (4) Date: Sep. 20, 2012

(87) PCT Pub. No.: WO2012/153488
PCT Pub. Date: Nov. 15, 2012

(65) Prior Publication Data
US 2013/0077384 A1    Mar. 28, 2013

(30) Foreign Application Priority Data

May 11, 2011    (JP) .................................. 2011-106739

(51) Int. Cl.
*G11C 11/00* (2006.01)
*G11C 11/21* (2006.01)
*G11C 13/00* (2006.01)

(52) U.S. Cl.
CPC ............... *G11C 11/21* (2013.01); *G11C 13/00* (2013.01)
USPC .......................... 365/148; 365/158; 365/163

(58) Field of Classification Search
USPC ............. 365/46, 94, 100, 129, 148, 158, 163; 257/2–5, 9, 295, 310, E21.35; 438/95, 438/96, 135, 166, 240, 365, 482, 486, 597, 438/785
See application file for complete search history.

(56) References Cited

U.S. PATENT DOCUMENTS

| 4,570,238 | A  | 2/1986 | Birrittella |
| 6,992,920 | B2 | 1/2006 | Tamai et al. |

(Continued)

FOREIGN PATENT DOCUMENTS

| JP | 2005-032401 | 2/2005 |
| JP | 2006-203098 | 8/2006 |

(Continued)

OTHER PUBLICATIONS

A Chinese Office Action (with English translation) issued Apr. 1, 2014 in CN 201280001056.8 which corresponds to the present application.

*Primary Examiner* — Harry W Byrne
(74) *Attorney, Agent, or Firm* — Wenderoth, Lind & Ponack, L.L.P.

(57) ABSTRACT

A cross point variable resistance nonvolatile memory device including: a cross point memory cell array having memory cells each of which is placed at a different one of cross points of bit lines and word lines; a word line decoder circuit that selects at least one of the memory cells from the memory cell array; a read circuit that reads data from the selected memory cell; an unselected word line current source that supplies a first constant current; and a control circuit that controls the reading of the data from the selected memory cell, wherein the control circuit controls the word line decoder circuit, the read circuit, and the unselected word line current source so that when the read circuit reads data, the first constant current is supplied to an unselected word line.

16 Claims, 25 Drawing Sheets

(56) References Cited

U.S. PATENT DOCUMENTS

| | | |
|---|---|---|
| 7,835,174 B2 | 11/2010 | Tokiwa |
| 7,916,516 B2 | 3/2011 | Wei et al. |
| 7,978,495 B2 | 7/2011 | Kawazoe et al. |
| 7,990,754 B2 | 8/2011 | Azuma et al. |
| 8,154,909 B2 | 4/2012 | Azuma et al. |
| 2004/0257864 A1 | 12/2004 | Tamai et al. |
| 2007/0195590 A1* | 8/2007 | Sugita ............................ 365/163 |
| 2009/0052225 A1 | 2/2009 | Morimoto |
| 2009/0122592 A1 | 5/2009 | Tokiwa |
| 2009/0129140 A1 | 5/2009 | Kawazoe et al. |
| 2009/0279344 A1* | 11/2009 | Toda ............................ 365/148 |
| 2010/0027320 A1* | 2/2010 | Muraoka et al. ............. 365/148 |
| 2010/0073983 A1* | 3/2010 | Hosoi ............................ 365/51 |
| 2010/0080037 A1* | 4/2010 | Inoue et al. .................... 365/148 |
| 2010/0110766 A1 | 5/2010 | Wei et al. |
| 2010/0172170 A1* | 7/2010 | Tamai et al. .................. 365/148 |
| 2010/0172171 A1 | 7/2010 | Azuma et al. |
| 2010/0321982 A1* | 12/2010 | Takagi et al. ................. 365/148 |
| 2011/0249486 A1 | 10/2011 | Azuma et al. |

FOREIGN PATENT DOCUMENTS

| | | |
|---|---|---|
| JP | 2006-216109 | 8/2006 |
| JP | 2009-117003 | 5/2009 |
| JP | 2009-163867 | 7/2009 |
| WO | 2008/105155 | 9/2008 |
| WO | 2008/149493 | 12/2008 |

* cited by examiner (a)

(b)

CROSS POINT VARIABLE RESISTANCE NONVOLATILE MEMORY DEVICE AND METHOD OF READING THEREBY

TECHNICAL FIELD

The present invention relates to a cross point variable resistance nonvolatile memory device and a method of reading performed by the cross point variable resistance nonvolatile memory device, that is, a nonvolatile memory device having cross point memory cells that use variable resistance elements, and a method of reading performed by the cross point variable resistance nonvolatile memory device.

BACKGROUND ART

In recent years, research and development are conducted on a nonvolatile memory device having memory cells that use variable resistance elements. A variable resistance element is an element that has a property that a resistance value changes (the variable resistance element changes between a high resistance state and a low resistance state) according to an electrical signal and enables information to be written through this change in resistance value.

One structure of memory cells using variable resistance elements is a cross point structure. In the cross point structure, each memory cell is placed at a different one of cross points of orthogonally arranged bit lines and word lines so as to be provided between a bit line and a word line. Various types of such cross point variable resistance nonvolatile memory devices are developed in recent years (for example, see Patent Literatures (PTLs) 1 and 2).

PTL 1 discloses a nonvolatile memory device having memory cells that use bidirectional variable resistors in the cross point structure. More specifically, PTL 1 discloses that a varistor, for instance, is used as a bidirectional nonlinear element included in each memory cell, in order to reduce a leakage current which flows into an unselected memory cell, and that reading is performed by applying, at the time of reading, a read voltage Vr to a selected bit line, VSS to a selected word line, and a voltage lower than the read voltage Vr to an unselected word line and an unselected bit line.

PTL 2 also discloses a nonvolatile memory device having a cross point memory cell array in which each memory cell including a bidirectional variable resistor and a bidirectional nonlinear element is placed at a different one of cross points of word lines arranged in parallel with each other and bit lines arranged orthogonal to the word lines, so as to form a matrix. PTL 2 discloses that the bidirectional nonlinear element is designed to reduce a leakage current that flows through unselected memory cells. Since, however, an amount of leakage current depends on an array size of a memory cell array, an increase in array size causes a significant increase in leakage current. In response to such a problem, PTL 2 discloses, as a method of reducing a leakage current, a means for applying a predetermined voltage to an unselected word line and an unselected bit line, thereby enabling more stable reading.

CITATION LIST

Patent Literature

[PTL 1]
Japanese Unexamined Patent Application Publication No. 2006-203098 (FIG. 7)
[PTL 2]
International Patent Application Publication No. 2008/149493

SUMMARY OF INVENTION

Technical Problem

The method of applying a voltage to an unselected word line and the like increases in theory a read margin. However, in a cross point variable resistance nonvolatile memory device using memory cells where a current flowing through variable resistance elements drastically changes in response to a variation in applied voltage, the variation in applied voltage causes a significant impact, and therefore an actual read margin in consideration of the variation in applied voltage is reduced.

In view of the above problem, the first object of the present invention is to provide (i) a nonvolatile memory device that is a cross point variable resistance nonvolatile memory device using memory cells having current characteristics sensitive to a voltage variation, and increases an actual read margin in consideration of a variation in electrical signal such as applied voltage, to enable stable reading, and (ii) a method of reading performed by the cross point variable resistance nonvolatile memory device.

Moreover, in view of a problem that a change of a current flowing into unselected word lines via unselected cells causes electromagnetic noise (EMI), the second object of the present invention is to provide a cross point variable resistance nonvolatile memory device that operates stably, and a method of reading performed by the cross point variable resistance nonvolatile memory device.

Solution to Problem

A cross point variable resistance nonvolatile memory device according to one aspect of the present invention includes: a cross point memory cell array having a plurality of memory cells each of which includes a variable resistance element and a bidirectional current steering element and is placed at a different one of cross points of a plurality of bit lines extending in an X direction and a plurality of word lines extending in a Y direction, the variable resistance element reversibly changing between at least two states including a low resistance state and a high resistance state when voltages of different polarities are applied to the variable resistance element, and the bidirectional current steering element being connected in series with the variable resistance element and having nonlinear current-voltage characteristics; a decoder circuit that selects at least one of the memory cells from the memory cell array by selecting at least one of the bit lines and at least one of the word lines; a read circuit that reads data from the selected memory cell; a first current source that supplies a first constant current; and a control circuit that controls the reading of the data from the selected memory cell, wherein the control circuit controls the decoder circuit, the read circuit, and the first current source so that when the read circuit reads data, a first voltage for reading outputted from the read circuit is applied to a selected bit line that is one of the bit lines which is selected by the decoder circuit, a second voltage is applied to a selected word line that is one of the word lines which is selected by the decoder circuit, and the first constant current is supplied to an unselected word line that is, among the word lines, a word line not selected by the decoder circuit.

Advantageous Effects of Invention

The present invention allows a variable resistance nonvolatile memory device having the above configuration to increase an actual read margin in consideration of variation in electrical signal such as an applied voltage, to enhance the stability of read characteristics.

In addition, the present invention suppresses a major change of current, and thus reduces electromagnetic nose (EMI) caused by the change of current.

Figure 16B:
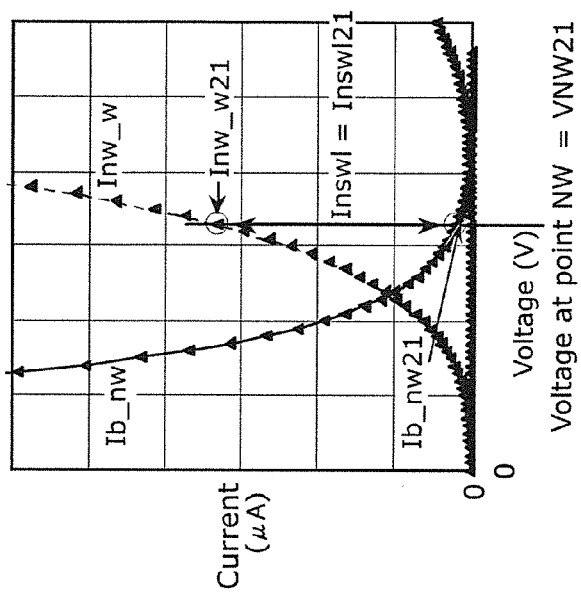
Figure 16A:
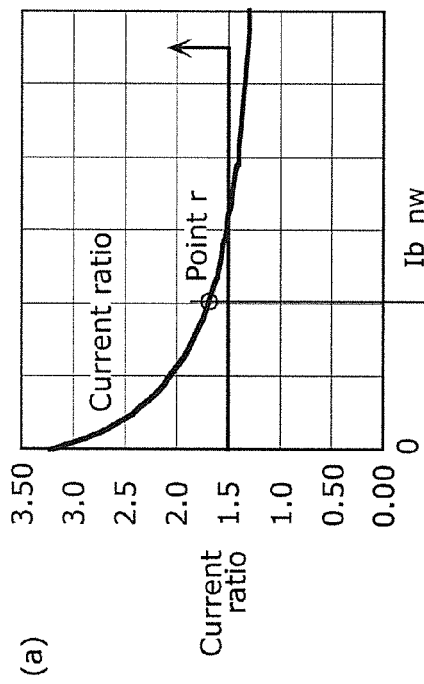

(a) of FIG. 16A is a graph showing a Isel (LR)/Isel (HR) current ratio relative to a leakage current Ib_nw, and (b) of FIG. 16A is a graph showing a sense current Isen relative to a leakage current Ib_nw.

FIG. 16B is an I-V characteristic graph for a memory cell.

Figure 17:
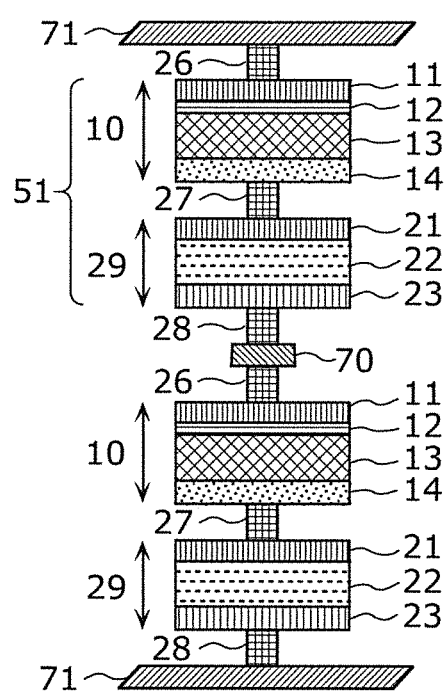

FIG. 17 is a memory cell cross section diagram when memory cells are stacked in two layers.

Figure 18:
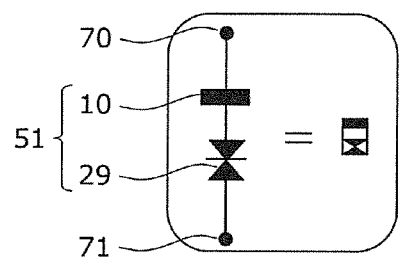

FIG. 18 is a diagram illustrating a representation of a memory cell.

Figure 19:
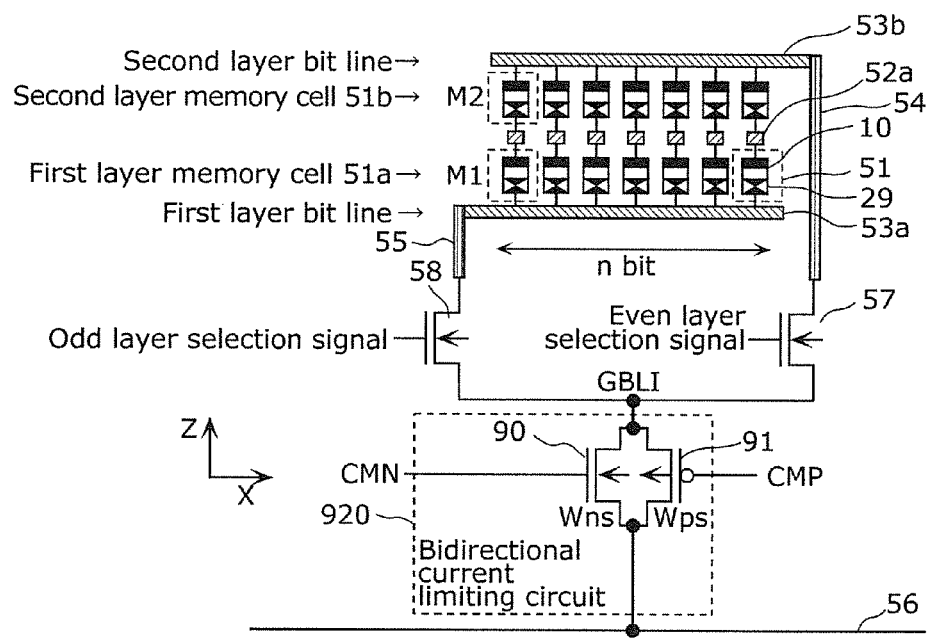

FIG. 19 is a cross section diagram of a two-layer cross point memory cell array according to an embodiment of the present invention.

Figure 20:
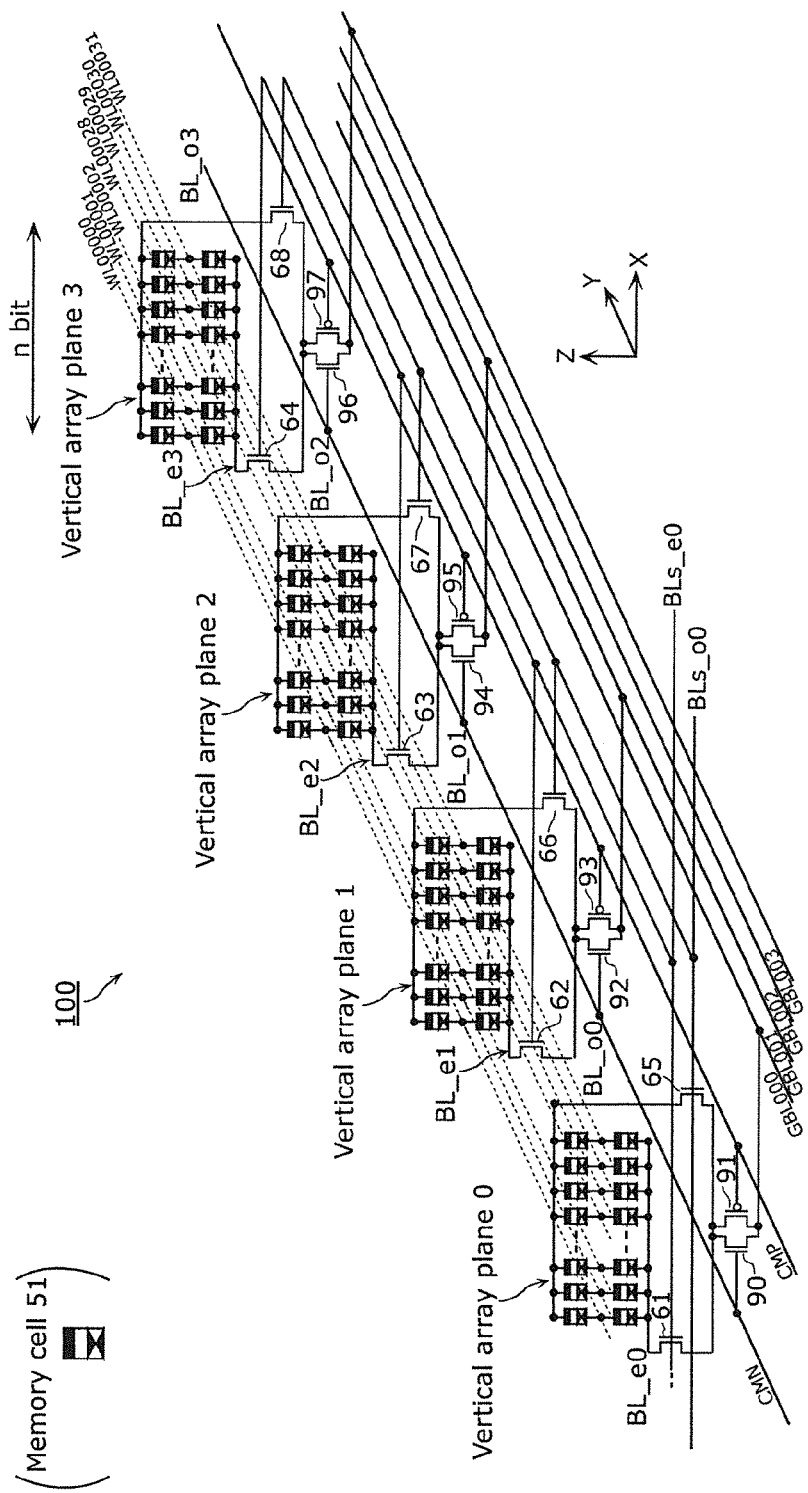

FIG. 20 is a circuit diagram showing a configuration of a memory cell array according to Embodiment 1 of the present invention.

Figure 21:
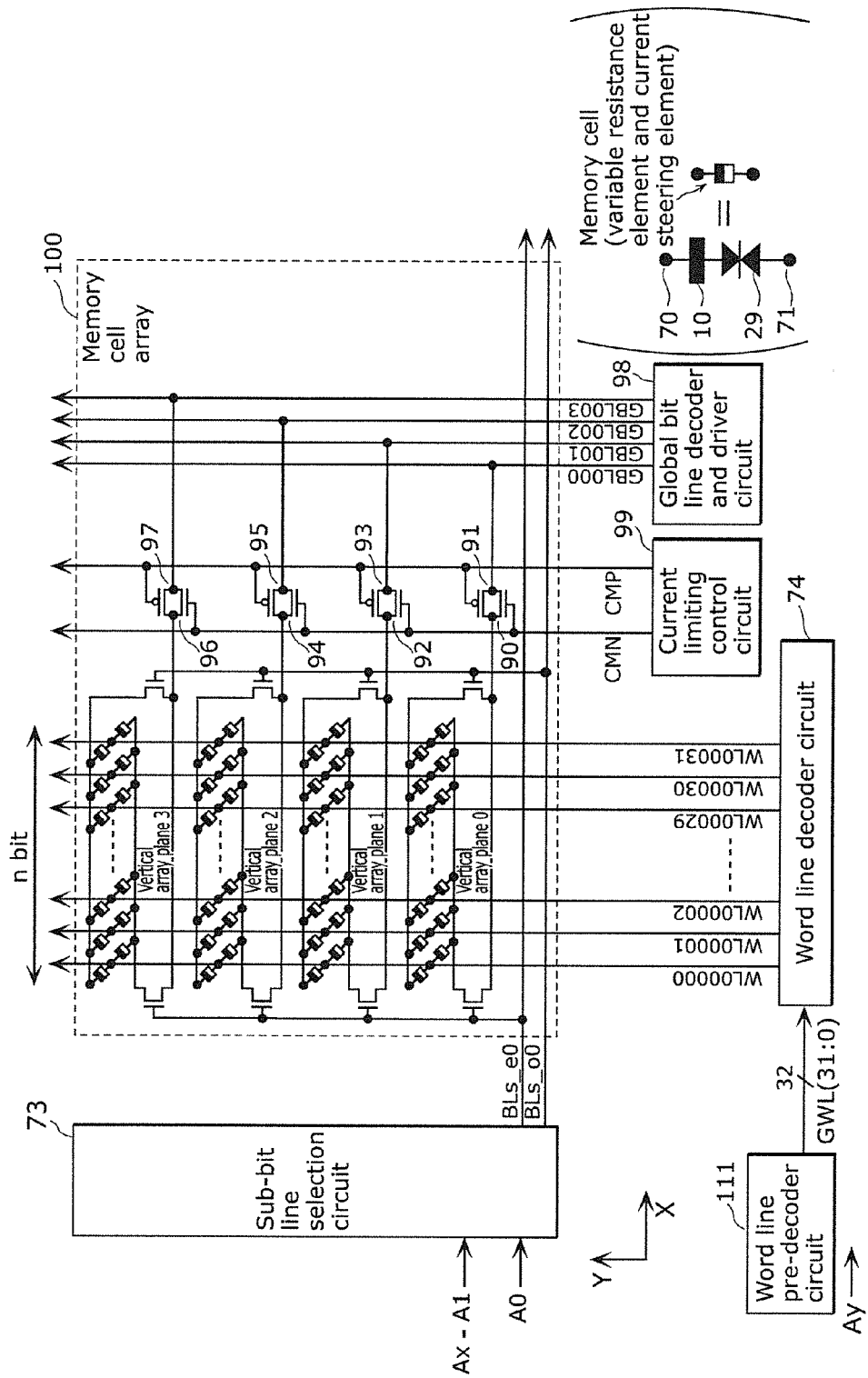

FIG. 21 is a circuit diagram showing the memory cell array shown by FIG. 20 and peripheral circuitry of the same.

Figure 22:
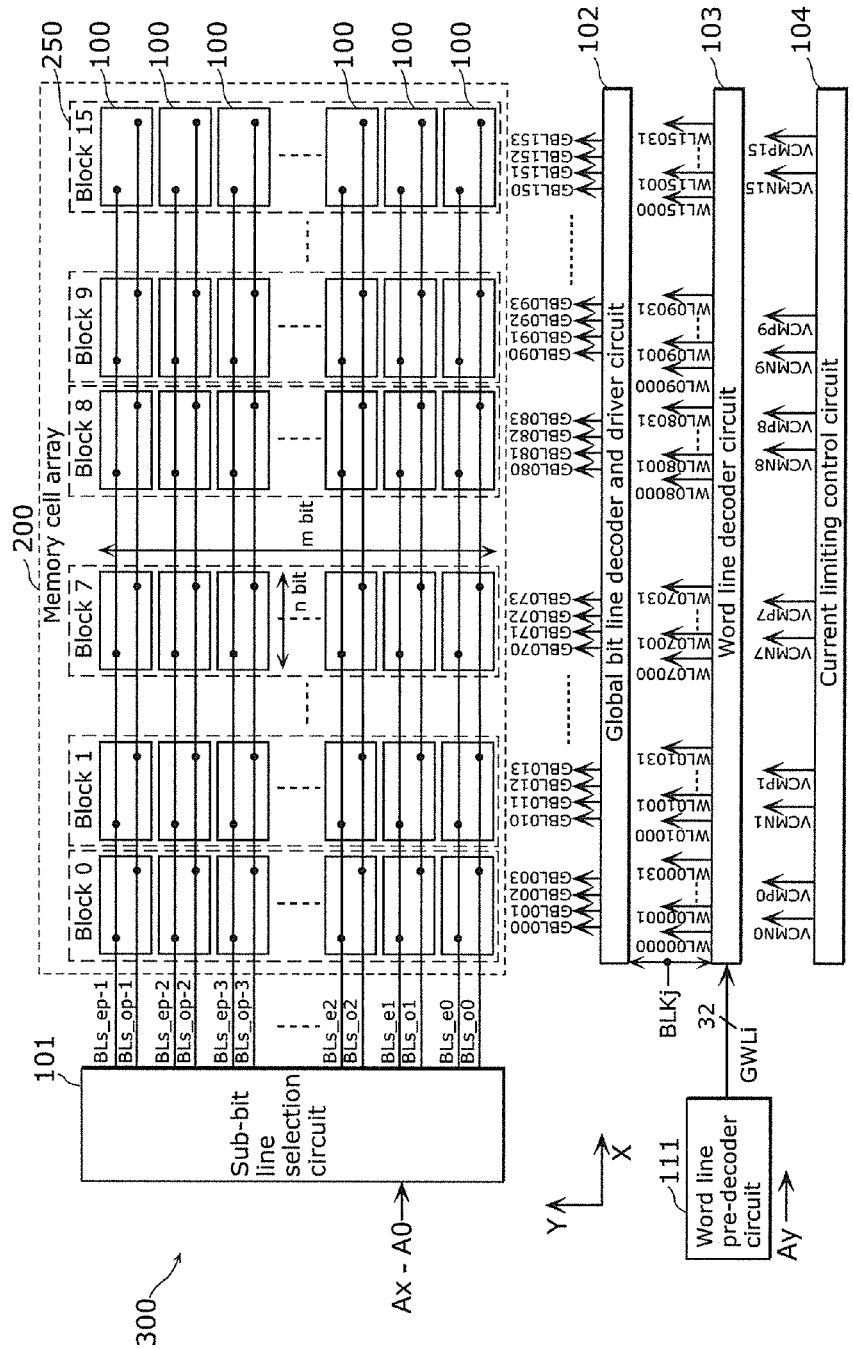

FIG. 22 is a circuit diagram showing a main part of a cross point variable resistance nonvolatile memory device using a plurality of memory cell arrays shown by FIG. 20.

Figure 23:
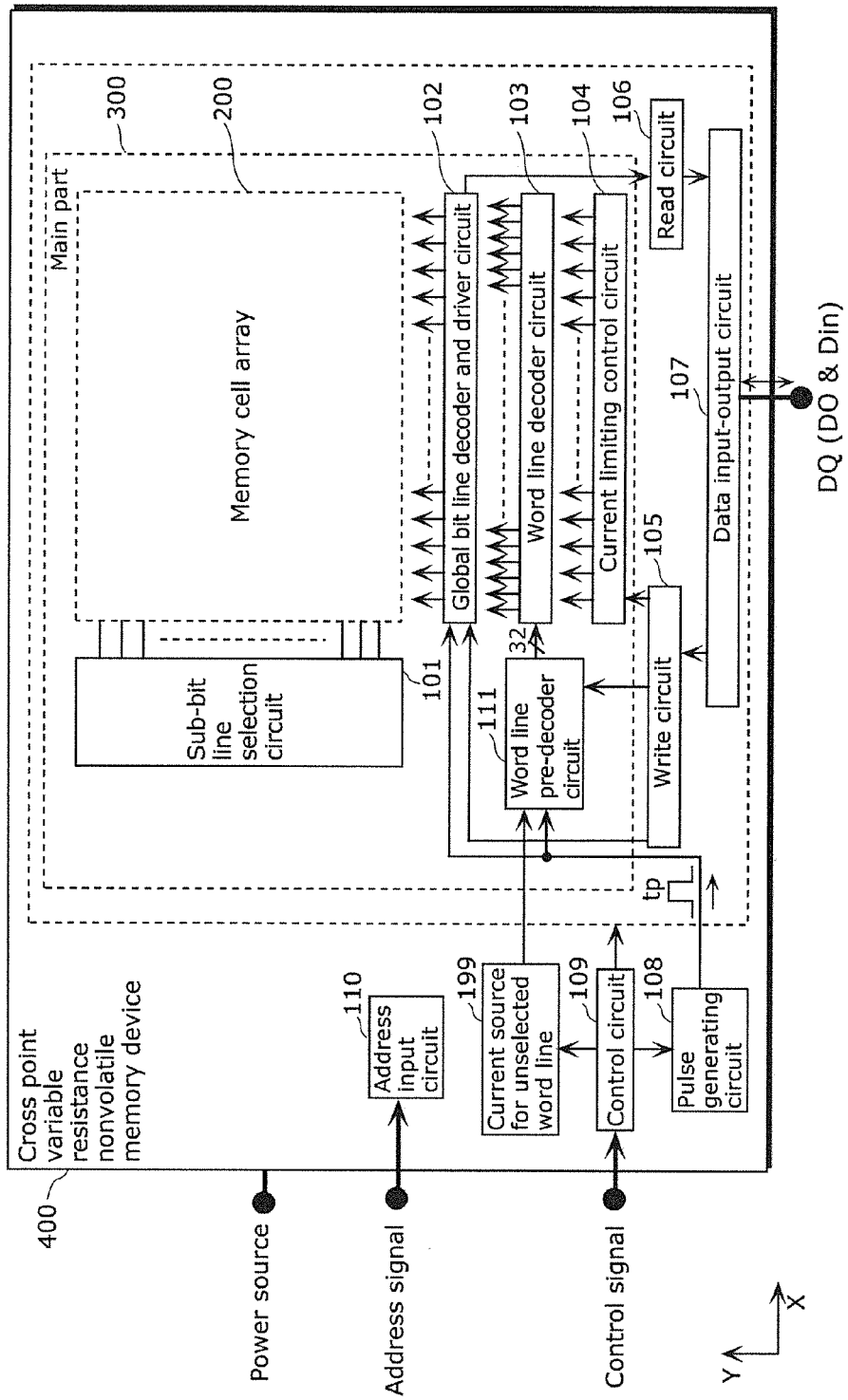

FIG. 23 is a circuit diagram showing a configuration of a cross point variable resistance nonvolatile memory device according to Embodiment 1 of the present invention.

Figure 24:
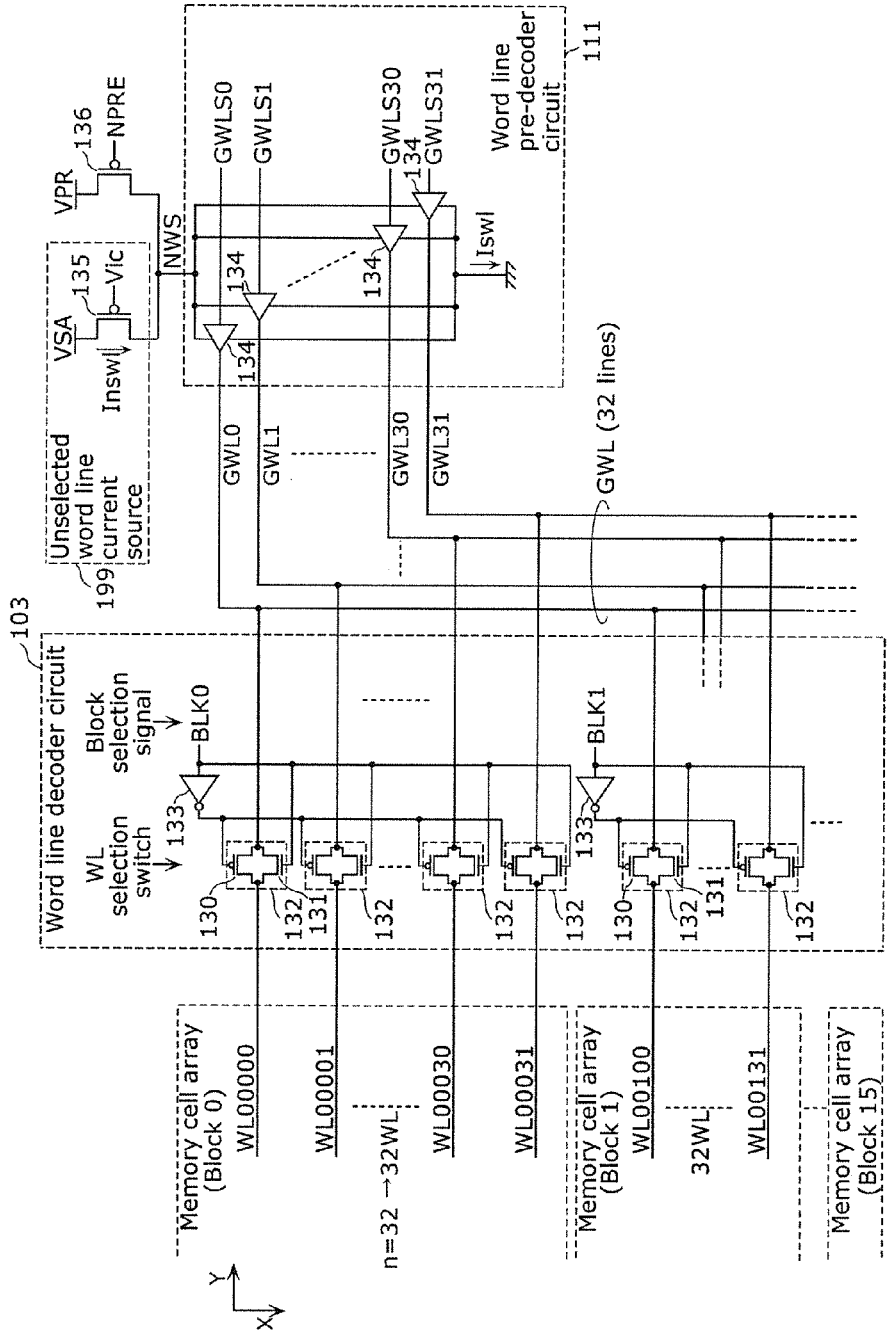

FIG. 24 is a circuit diagram showing exemplary word line control peripheral circuitry according to Embodiment 1 of the present invention.

Figure 25:
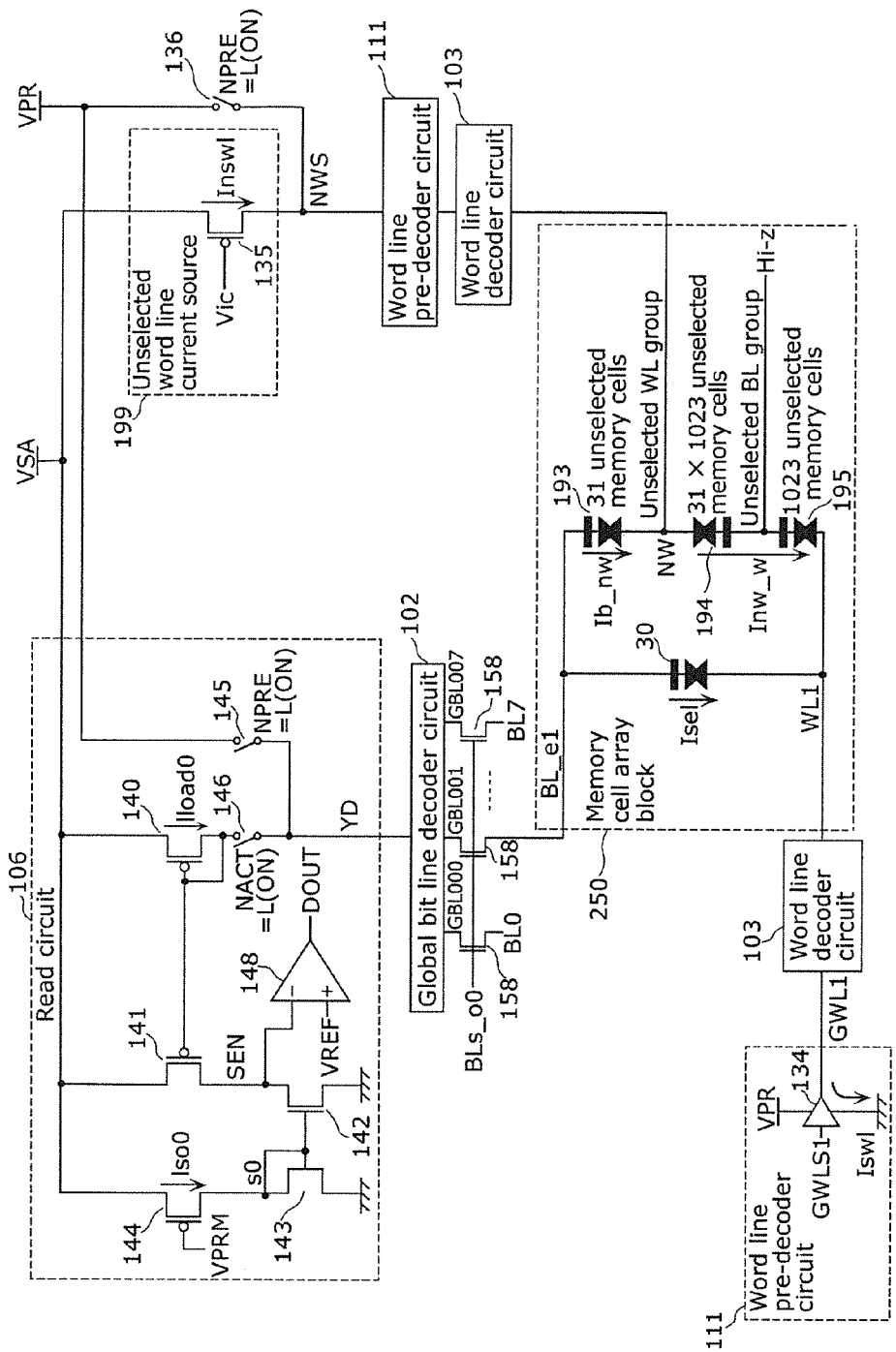

FIG. 25 is a circuit diagram showing exemplary peripheral circuitry for reading according to Embodiment 1 of the present invention.

Figure 26:
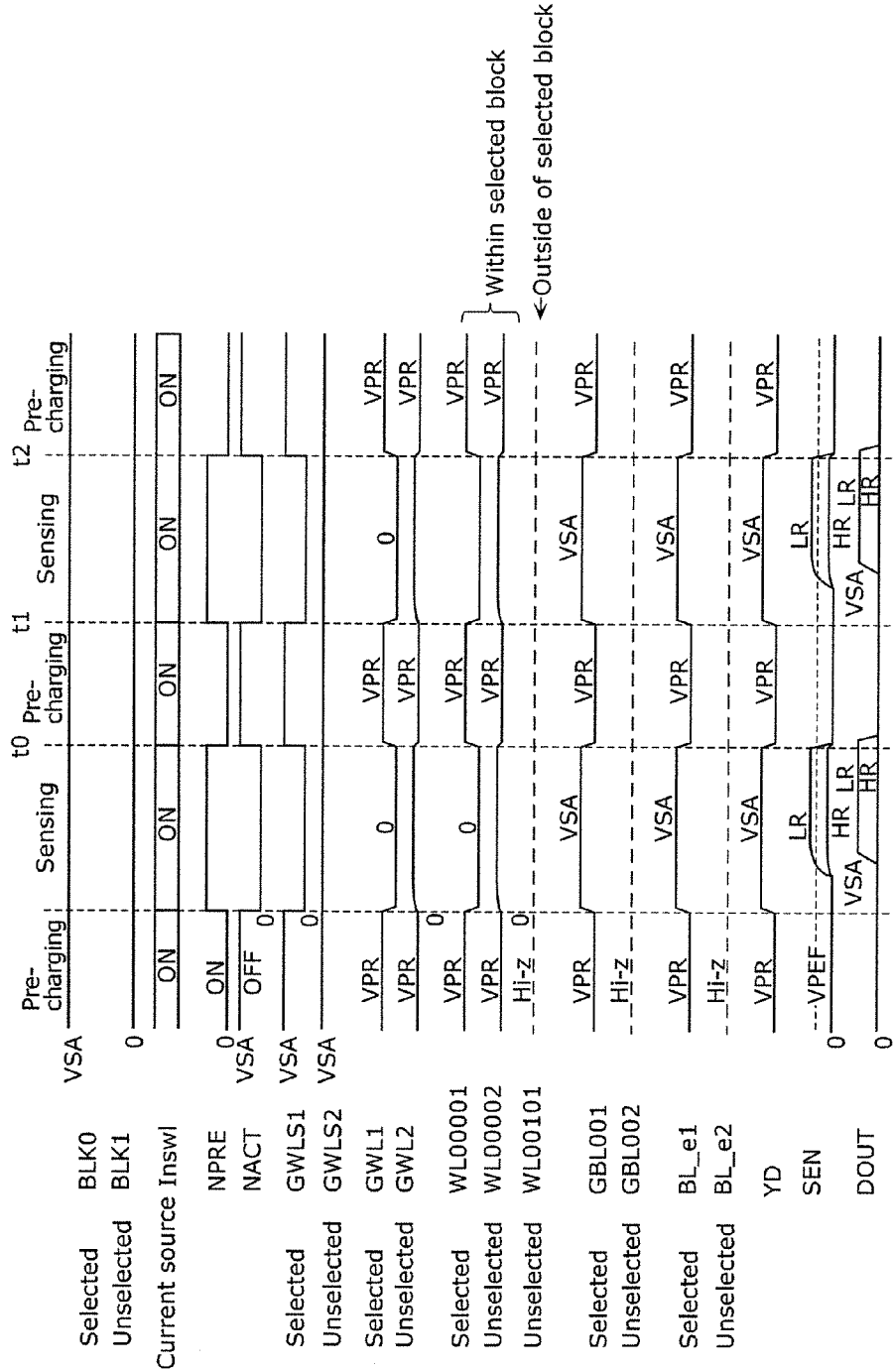

FIG. 26 is a diagram showing a read sequence for a cross point variable resistance nonvolatile memory device according to Embodiment 1 of the present invention.

Figure 27:
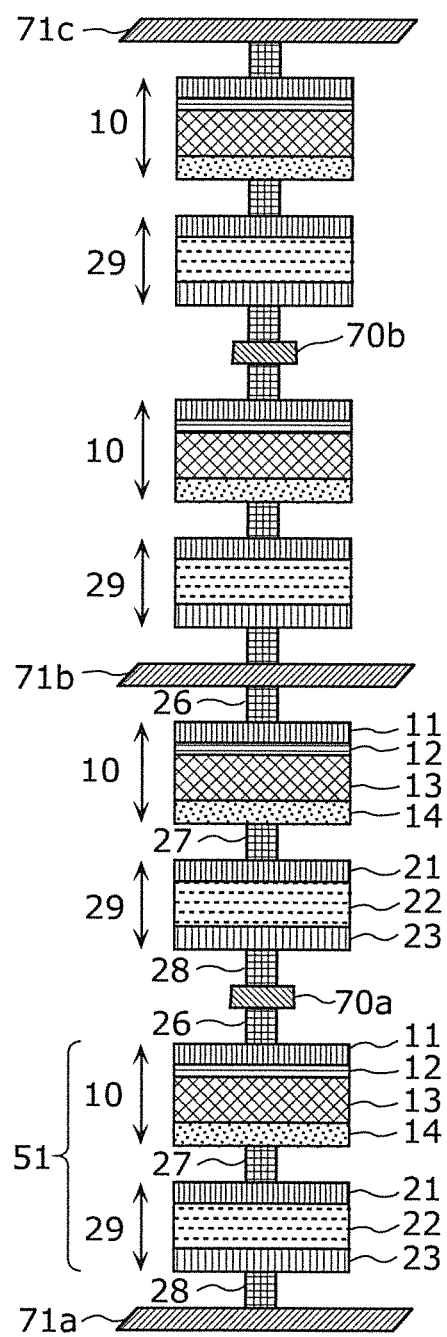

FIG. 27 is a memory cell cross section diagram when memory cells are stacked in four layers according to Embodiment 2 of the present invention.

Figure 28:
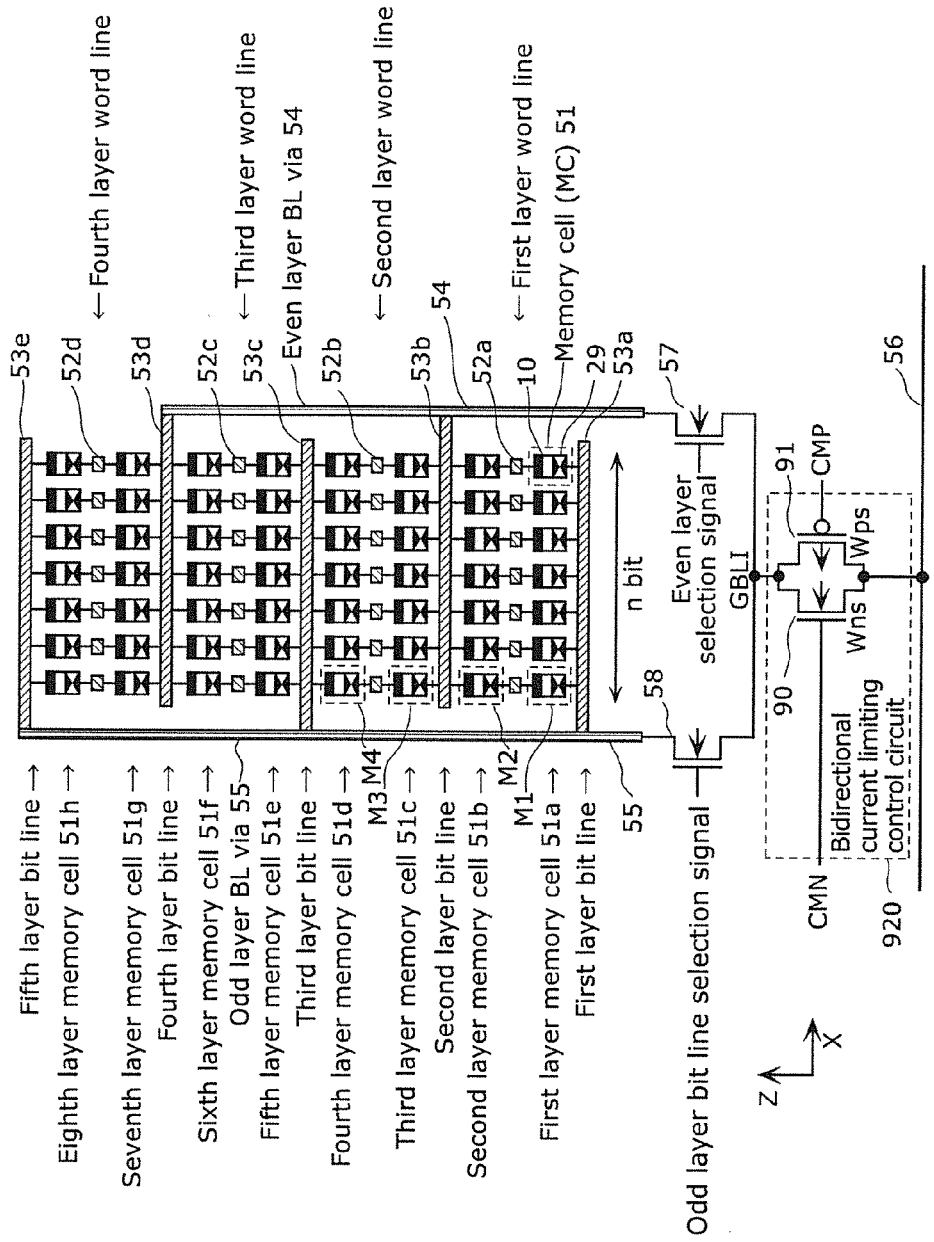

FIG. 28 is a cross section diagram of an eight-layer cross point memory cell array according to Embodiment 2 of the present invention.

Figure 29:
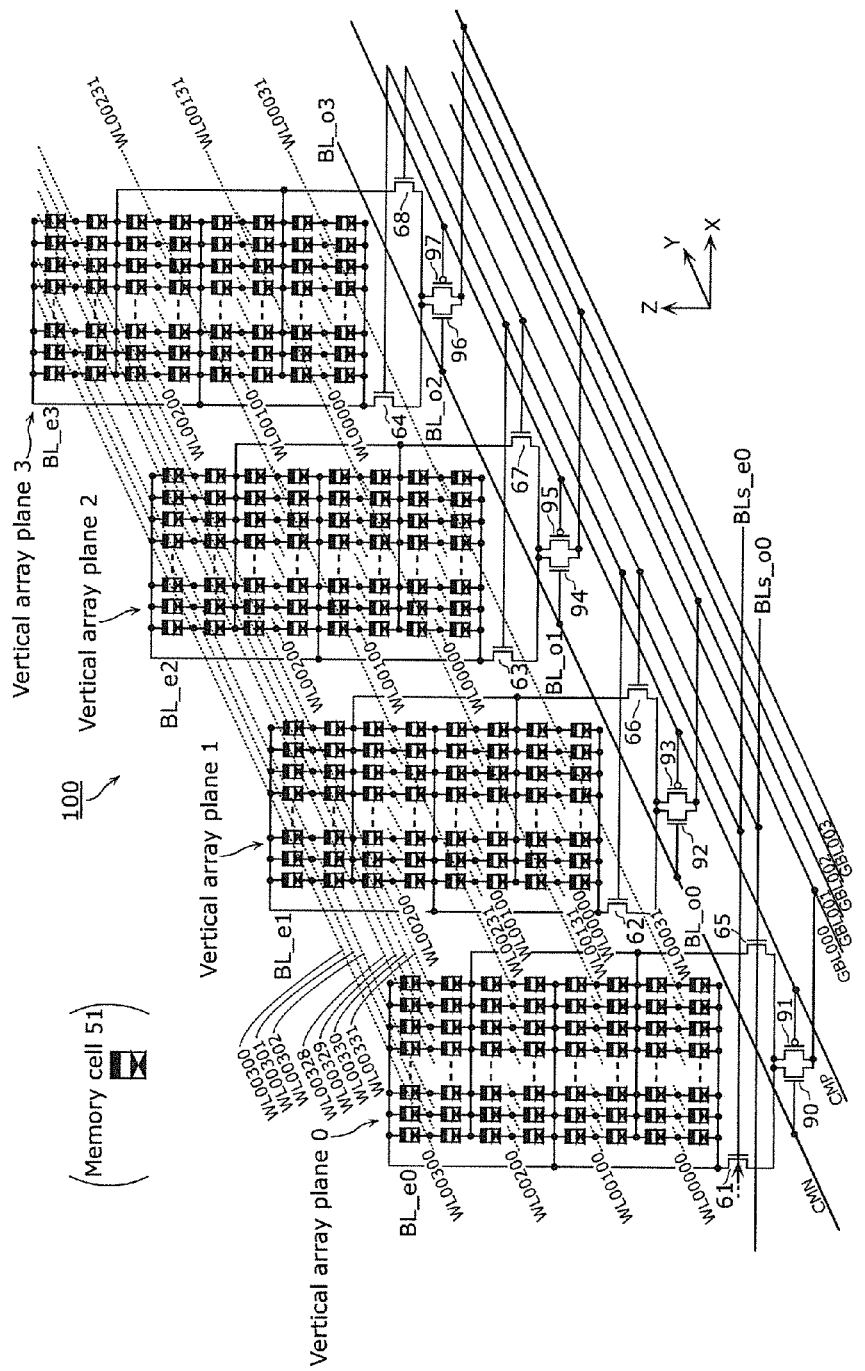

FIG. 29 is a circuit diagram showing a configuration of a memory cell array according to Embodiment 2 of the present invention.

Figure 30:
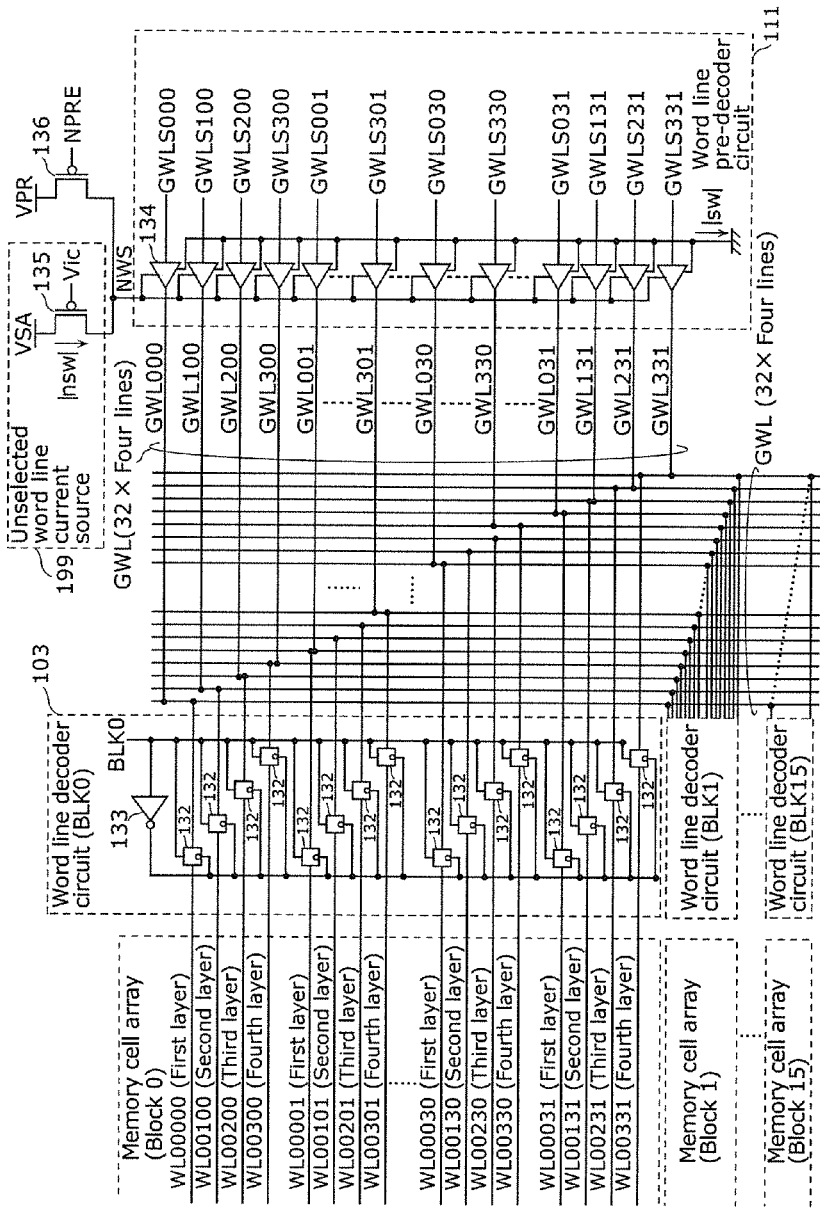

FIG. 30 is a circuit diagram showing exemplary word line control peripheral circuitry according to Embodiment 2 of the present invention.

DESCRIPTION OF EMBODIMENTS

Before describing embodiments of the present invention, a problem to be solved by the present invention is described in detail with reference to the drawings.

[Structure and Characteristics of Memory Cell]

Figure 1:
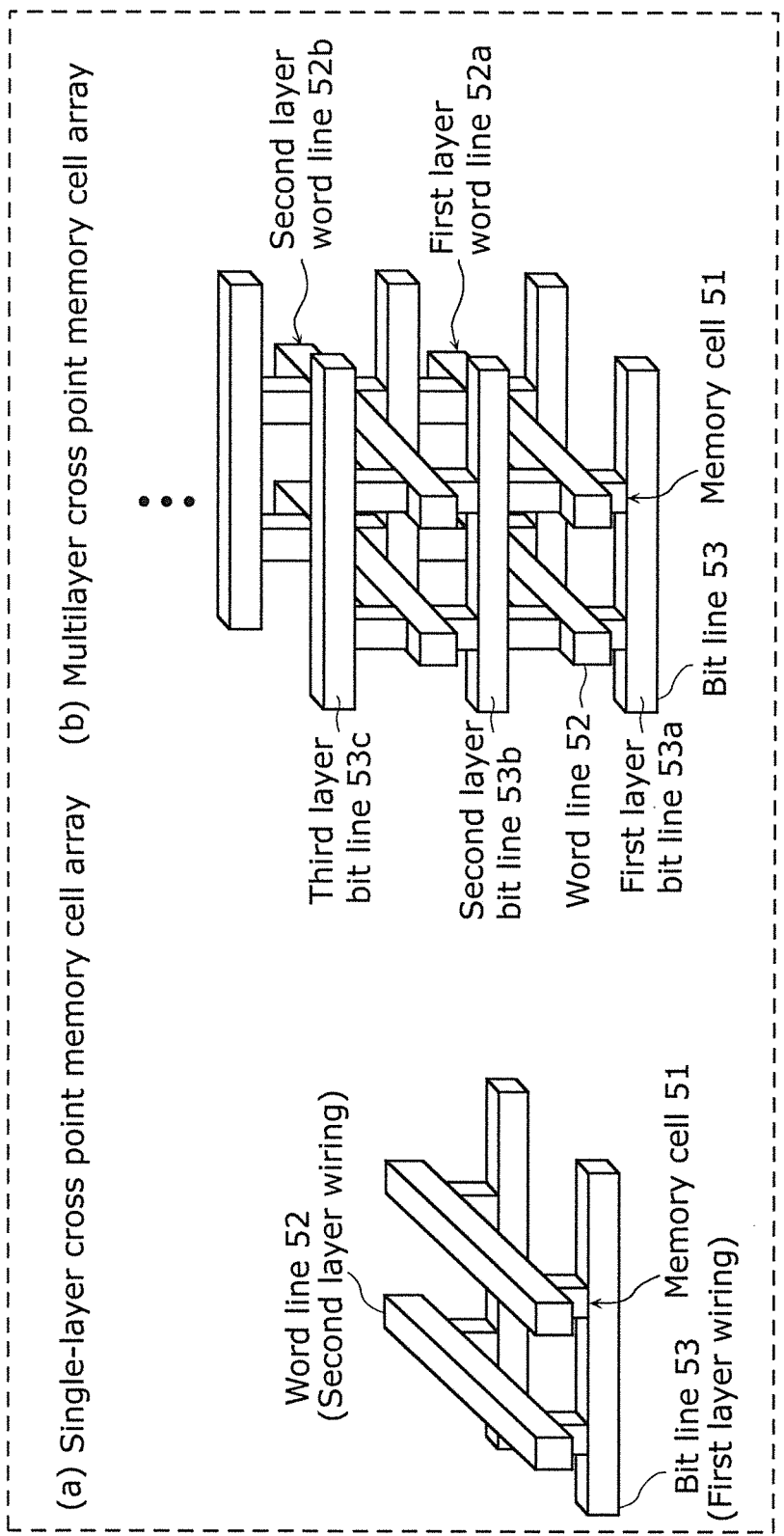
FIG. 1 is a diagram showing a three-dimensional structure of each of a single-layer cross point memory cell and a multilayer cross point memory cell.

(a) of FIG. 1 is a diagram showing a three-dimensional structure of a single-layer cross point memory cell array. Specifically, (a) of FIG. 1 shows word lines 52 (e.g., second layer wirings) that are arranged in a direction and in parallel with each other, bit lines 53 (e.g., first layer wirings) that are arranged in a direction and in parallel with each other so as to be orthogonal to the word lines 52, and memory cells 51 each of which is placed at a different one of cross points of the word lines 52 and the bit lines 53 and is electrically connected to a corresponding one of the word lines 52 and a corresponding one of the bit lines 53.

(b) of FIG. 1 is a diagram showing a three-dimensional structure of a multilayer cross point memory cell array. Specifically, (b) of FIG. 1 shows a stack structure in multiple layers in which: bit lines 53 (first layer bit lines 53a) are placed in a first wiring layer; word lines 52 (first layer word lines 52a) are placed in a second wiring layer above the first wiring layer so as to be orthogonal to the bit lines 53; bit lines 53 (second layer bit lines 53b) are placed in a third wiring layer above the second wiring layer so as to be orthogonal to the word lines 52; word lines 52 (second layer word lines 52b) are placed in a fourth wiring layer above the third wiring layer so as to be orthogonal to the bit lines 53; and bit lines 53 (third layer bit lines 53c) are placed in a fifth wiring layer above the fourth wiring layer so as to be orthogonal to the word lines 52. Each memory cell 51 is placed at a different one of cross points of the word lines 52 and the bit lines 53 so as to be provided between a corresponding one of the word lines 52 and a corresponding one of the bit lines 53.

Thus, a cross point memory cell array achieves a reduction in memory cell area per unit area without relying on a miniaturization process, by vertically stacking simple structures in each of which memory cells are formed at cross points of wires. Hence, the cross point memory cell array is known as a structure suitable for high integration.

The following describes problems newly found when actually configuring a cross point memory cell array, using a multilayer cross point memory cell array invented earlier by the inventors of the present invention as an example.

[Structure of Memory Cell]

Figure 2:
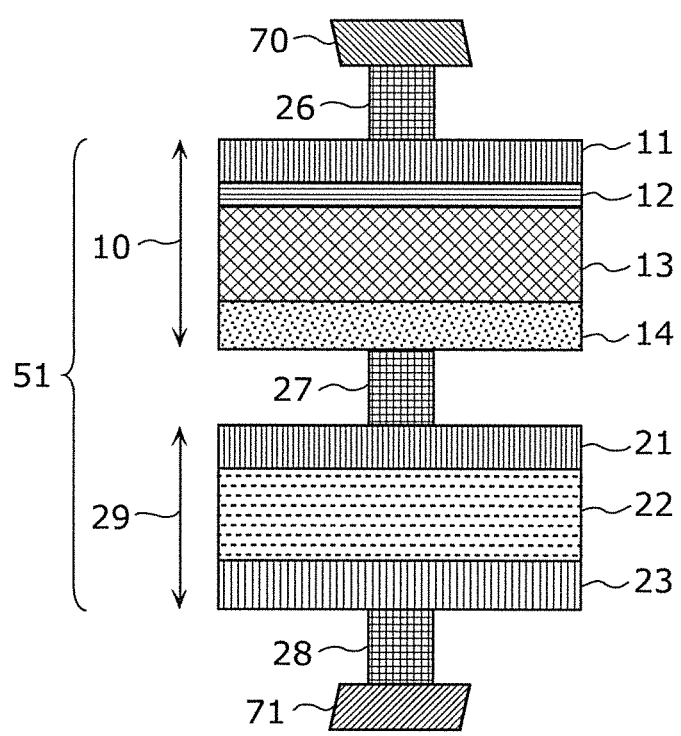
FIG. 2 is a cross section diagram of a memory cell.

FIG. 2 is a cross section diagram of the memory cell 51 used for the cross point memory cell array. The memory cell 51 is a 1-bit memory cell including a variable resistance element 10 and a current steering element 29 that are connected in series with each other.

The variable resistance element 10 is formed by stacking a first variable resistance layer (here, a first transition metal oxide layer) 13 and a second variable resistance layer (here, a second transition metal oxide layer) 12. Here, the variable resistance element 10 is formed by stacking, for instance, a first tantalum oxide layer (an example of the first variable resistance layer 13) and a second tantalum oxide layer (an example of the second variable resistance layer 12).

The variable resistance element 10 has the following structure. Oxygen-deficient first tantalum oxide ($TaO_x$, $0<x<2.5$) is formed on a lower electrode 14 comprising tantalum nitride (TaN), as a first variable resistance layer 13 (a first region included in a variable resistance layer). An upper interface of the first variable resistance layer 13 is irradiated with oxygen plasma at 300° C. and 200 W for 20 seconds, thereby forming a thin second variable resistance layer 12 (a second region included in the variable resistance layer) comprising second tantalum oxide ($TaO_y$, $x<y$) having an oxygen concentration higher than that of $TaO_x$ in the first variable resistance layer 13. An upper electrode 11 comprising platinum (Pt) is formed on the second variable resistance layer 12. The term "oxygen-deficient" means a composition state of a metal oxide that is lower in oxygen content than a metal oxide having a stoichiometric composition typically exhibiting an insulating property, and exhibits a semiconducting electric property. The second variable resistance layer (hereafter, referred to as the second tantalum oxide layer) 12 comprising the second tantalum oxide has an oxygen content atomic percentage higher than that of the first variable resistance layer (hereafter, referred to as the first tantalum oxide layer) 13 comprising the first tantalum oxide. For instance, the oxygen content atomic percentage of $Ta_2O_5$, a stoichiometric composition, is calculated according to the ratio of oxygen to a total number of atoms (O/(Ta+O)), that is, 71.4 atm %. Therefore, oxygen-deficient tantalum oxide has an oxygen content atomic percentage that is greater than 0 atm % and less than 71.4 atm %. Here, the resistance value of a transition metal oxide used for a variable resistance element increases as the oxygen content atomic percentage increases.

To put it another way, the second tantalum oxide layer 12 has a degree of oxygen deficiency lower than that of the first tantalum oxide layer 13.

The term "degree of oxygen deficiency" means a proportion of deficient oxygen to an amount of oxygen of an oxide having a stoichiometric composition of each transition metal. For example, when a transition metal is tantalum (Ta), a composition of a stoichiometric oxide of the same is $Ta_2O_5$, which can be expressed as $TaO_{2.5}$. The degree of oxygen deficiency of $TaO_{2.5}$ is expressed as 0%. For instance, an oxygen-deficient tantalum oxide having a composition expressed as $TaO_{1.5}$ is calculated as $(2.5-1.5)/2.5=40\%$.

Moreover, the first variable resistance layer and the second variable resistance layer may comprise a transition metal other than tantalum. Tantalum (Ta), titanium (Ti), hafnium (Hf), zirconium (Zr), niobium (Nb), tungsten (W), and so on may be used as the transition metal. Since the transition metal can take a plurality of oxidation states, this can provide different resistance states by an oxidation-reduction reaction. For example, it was found that the resistance value of a variable resistance layer can be stably changed at high speed in the case where a tantalum oxide is used so that the first tantalum oxide layer 13 has a composition expressed as $TaO_x$ and the second tantalum oxide layer 12 has a composition expressed as $TaO_y$, where x is between 0.8 and 1.9 inclusive and y is larger than x in value. In this case, preferably, the second tantalum oxide layer 12 has a thickness between 1 nm and 8 nm inclusive. It was found that the resistance value of a variable resistance layer can be stably changed at high speed in the case where a hafnium oxide is used so that a first hafnium oxide layer 13, an example of the first variable resistance layer 13, has a composition expressed as $HfO_x$ and a second hafnium oxide layer 12, an example of the second variable resistance layer 12, has a composition expressed as $HfO_y$, where x is between 0.9 and 1.6 inclusive and y is larger than x in value. In this case, preferably, the second hafnium oxide layer 12 has a thickness between 3 nm and 4 nm inclusive. In addition, it was found that the resistance value of a variable resistance layer can be stably changed at high speed in the case where a zirconium oxide is used so that a first zirconium oxide layer 13, an example of the first variable resistance layer 13, has a composition expressed as $ZrO_x$ and a second zirconium oxide layer 12, an example of the second variable resistance layer 12, has a composition expressed as $ZrO_y$, where x is between 0.9 and 1.4 inclusive and y is larger than x in value. In this case, preferably, the second zirconium oxide layer 12 has a thickness between 1 nm and 5 nm inclusive. As stated above, the variable resistance film is formed by stacking the second variable resistance layer having the high resistance and thin thickness and the first variable resistance layer having the low resistance, and thus the voltage applied to the variable resistance element is divided more to the second variable resistance layer having the high resistance, which causes the oxidation-reduction reaction more likely to occur in the second variable resistance layer.

Furthermore, a first transition metal comprised in a first transition metal oxide layer 13, an example of the first variable resistance layer 13, may be different in material from a second transition metal comprised in a second transition metal oxide layer 12, an example of the second variable resistance layer 12. In this case, preferably, the second transition metal oxide layer 12 has a degree of oxygen deficiency lower than that of the first transition metal oxide layer 13, that is, a resistance higher than that of the first transition metal oxide layer 13. With this configuration, a voltage applied between the upper electrode 11 and the lower electrode 14 at the time of resistance change is divided more to the second transition metal oxide layer 12, which causes the oxidation-reduction reaction more likely to occur in the second transition metal oxide layer 12. Moreover, when the first transition metal and the second transition metal are made of different materials, preferably, the second transition metal has a standard electrode potential lower than that of the first transition metal. The oxidation-reduction reaction in a tiny filament formed in the second transition metal oxide layer 12 having a high resistance changes a resistance value of the second transition metal oxide layer, which results in a resistance change phenomenon. For instance, using the oxygen-deficient tantalum oxide for the first transition metal oxide layer 13 and a titanium oxide ($TiO_2$) for the second transition metal oxide layer 12 results in a stable resistance change operation. Titanium (with the standard electrode potential=−1.63 eV) is a material having a standard electrode potential lower than that of tantalum (with the standard electrode potential=−0.6 eV). The standard electrode potential having a larger value represents a property of being more difficult to oxidize. Providing to the second transition metal oxide layer 12 a metal oxide having a standard electrode potential lower than that of the first transition metal oxide layer 13 causes the oxidation-reduction reaction more likely to occur in the second transition metal oxide layer 12.

Here, although platinum (Pt) is used for the upper electrode 11, an electrode in contact with the second variable resistance layer 12, the material is not limited to platinum. Preferably, a material is used which has a standard electrode potential higher than that of tantalum (Ta) comprised in the first variable resistance layer 13 and that of tantalum nitride (TaN) comprised in the lower electrode 14. In the case of a structure that satisfies such a standard electrode potential condition, a resistance change occurs in the second variable resistance layer 12 that is in contact with the upper electrode comprising platinum (Pt) and comprises $TaO_y$ having a higher oxygen concentration. When a voltage higher than or equal to a predetermined voltage is applied to the upper electrode 11 with respect to the lower electrode 14, the variable resistance element 10 changes to a high resistance state. When a voltage higher than or equal to a predetermined voltage is applied to the lower electrode 14 with respect to the upper electrode 11, the variable resistance element 10 changes to a low resistance state.

The current steering element 29 is a diode element having nonlinear current-voltage characteristics in both positive and negative directions of an applied voltage, and is formed by providing a current steering layer 22 comprising nitrogen-deficient silicon nitride between a lower electrode 23 and an upper electrode 21 comprising tantalum nitride (TaN) or the like. The bidirectional nonlinear current-voltage characteristics are such characteristics of the current steering element 29 that is in a high resistance (OFF) state with a current flowing bidirectionally and in a predetermined voltage range and in a low resistance (ON) state in voltage ranges higher and lower than the predetermined voltage range. That is, the current steering element 29 is in the high resistance (OFF) state when the applied voltage has an absolute value less than or equal to a predetermined value, and is in the low resistance (ON) state when the applied voltage has an absolute value greater than the predetermined value.

The memory cell 51 is a memory cell formed by connecting the variable resistance element 10 and the current steering element 29 in series by a via 27. The upper electrode 11 of the variable resistance element 10 is connected to an upper wire 70 (corresponding to one of a bit line 53 and a word line 52) by a via 26, while the lower electrode 23 of the current steering element 29 is connected to a lower wire 71 (corresponding to the other of the bit line 53 and the word line 52) by a via 28.

It is to be noted that, in FIG. 2, the current steering element 29 and the variable resistance element 10 may be vertically reversed with each other.

Figure 3:
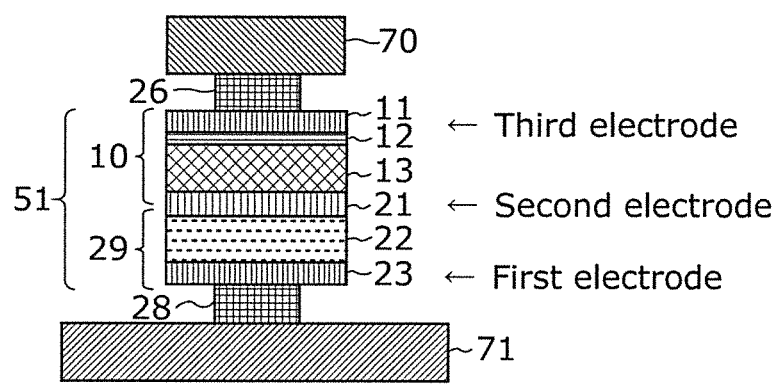
FIG. 3 is a cross section diagram of a memory cell.

Moreover, the memory cell 51 may have a structure that does not include the via 27, as shown in FIG. 3. Furthermore, the memory cell 51 may have a structure that does not include one or both of the via 26 and the via 28.

FIG. 3 is a diagram showing a cross section structure of the memory cell 51 included in a cross point variable resistance nonvolatile memory device having a multilayer memory cell array in an embodiment of the present invention.

The memory cell 51 has a structure formed by sequentially stacking a first electrode 23 comprising tantalum nitride (TaN), a current steering layer 22 comprising nitrogen-deficient silicon nitride, a second electrode 21 comprising TaN, a first variable resistance layer 13 comprising oxygen-deficient tantalum oxide ($TaO_x$), a second variable resistance layer 12 formed by oxidation of the first variable resistance layer 13 in an oxygen plasma atmosphere and comprising $TaO_y$ (x<y) having an oxygen concentration higher than that of $TaO_x$, and a third electrode 11 comprising platinum (Pt). A lower wire 71 comprising aluminum (Al) is disposed below the memory cell 51, and connected to the first electrode 23 of the memory cell 51 by a first via 28. In contrast, an upper wire 70 comprising aluminum (Al) is disposed above the memory cell 51, and connected to the third electrode 11 of the memory cell 51 by a third via 26. The lower wire 71 and the upper wire 70 are arranged so as to be orthogonal to each other.

In this structure, the first electrode 23, the current steering layer 22, and the second electrode 21 constitute a current steering element 29, and the second electrode 21, the first variable resistance layer 13, the second variable resistance layer 12, and the third electrode 11 constitute a variable resistance element 10. That is, the memory cell 51 includes: the variable resistance element 10 that reversibly changes between at least two states including a low resistance state and a high resistance state by application of voltages of different polarities; and the current steering element 29 that is connected in series with the variable resistance element 10.

Here, the second electrode 21 serves as an electrode of the current steering element 29 and an electrode of the variable resistance element 10. As described regarding the structure shown by FIG. 2, in this memory cell structure, a resistance change occurs in the second variable resistance layer 12 that (i) is in contact with the third electrode comprising a material (platinum (Pt) in this example) having a standard electrode potential higher than that of tantalum, the material of the first variable resistance layer 13, or that of TaN, the material of the second electrode 21 corresponding to a lower electrode of the variable resistance element 10, and (ii) comprises $TaO_y$ having an oxygen concentration higher than that of the first variable resistance layer 13. When a voltage higher than or equal to a predetermined voltage is applied to the upper wire 70 with respect to the lower wire 71, the variable resistance element 10 changes to the high resistance state. When a voltage higher than or equal to a predetermined voltage is applied to the lower wire 71 with respect to the upper wire 70, the variable resistance element 10 changes to the low resistance state. That is, the variable resistance element 10 includes the second electrode, the first variable resistance layer 13, the second variable resistance layer 12, and the third electrode that are stacked in the Z direction (stacking direction) so that the first variable resistance layer 13 and the second variable resistance layer 12 are provided between the second electrode and the third electrode; is asymmetrical in that the variable resistance element 10 differs in structure between when viewed in a direction from the second electrode to the third electrode and when viewed in a direction from the third electrode to the second electrode; and has characteristics of changing to the high resistance state when a voltage higher than or equal to a predetermined voltage is applied to the third electrode with respect to the second electrode and changing to the low resistance state when a voltage higher than or equal to a predetermined voltage is applied to the second electrode with respect to the third electrode.

Figure 4:
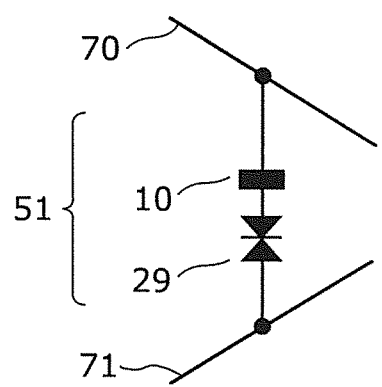
FIG. 4 is an equivalent circuit diagram of a memory cell.

FIG. 4 is a circuit diagram showing a connection relationship corresponding to the structure of the variable resistance element 10, i.e., an equivalent circuit diagram corresponding to the memory cell 51.

[Memory Cell Characteristics]

Figure 5:
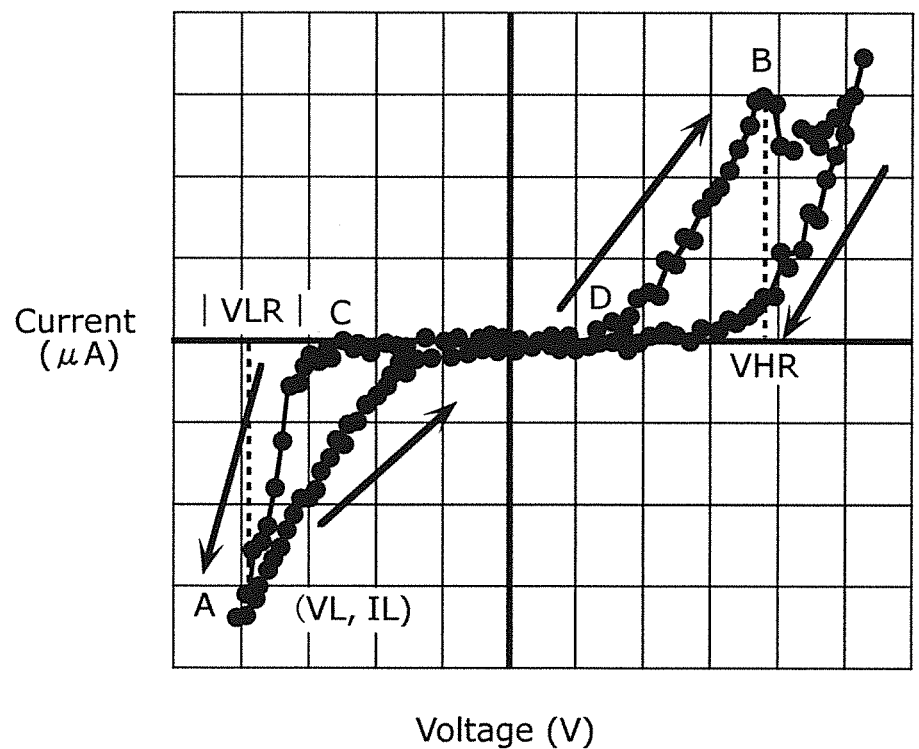
FIG. 5 is an I-V characteristic graph for a memory cell.

The following describes an operation of the memory cell 51, with reference to FIG. 5. FIG. 5 is a characteristic graph obtained by actually measuring a current-voltage relationship in the case of applying, to the memory cell 51 having the structure shown by FIG. 2, a positive-polarity voltage when the upper wire 70 has a voltage higher than that of the lower wire 71.

Suppose the memory cell 51 is initially in the high resistance state. When a negative-polarity voltage that causes the lower wire 71 to be higher in potential than the upper wire 70 is gradually applied to the memory cell 51, starting from an applied voltage of 0 V, a current begins to flow at point C, and the variable resistance element starts to change from the high resistance state to the low resistance state. When the voltage is further applied up to point A in a negative direction, the variable resistance element is rapidly changing to the low resistance state according to the applied voltage. Subsequently, the voltage is gradually applied until it reaches 0 V, while the variable resistance element is in the low resistance state. Point A is determined according to a value of a current that flows through the variable resistance element when the variable resistance element changes to the low resistance state.

After this, when the positive-polarity voltage that causes the upper wire 70 to be higher in potential than the lower wire 71 is applied to the memory cell 51, a current begins to flow at point D, and the variable resistance element starts to change from the low resistance state to the high resistance state at point B where the voltage is substantially point-symmetrical to a voltage (point A) at which the low resistance state is reached. When the voltage is further applied up to point E, a current increases. Subsequently, the current is lower when the applied voltage is decreased than when the applied voltage is increased, which indicates that the variable resistance element has changed to the high resistance state.

That is, the actual measurement data shown by FIG. 5 indicates, for the memory cell 51 having the structure shown by FIG. 2, (i) bidirectional resistance change characteristics of changing to the low resistance state when the voltage of the lower wire 71 is higher than or equal to a predetermined voltage VLth (point C) with respect to the voltage of the upper wire 70 and changing to the high resistance state when the voltage of the upper wire 70 is higher than or equal to a predetermined voltage VHth (point B) with respect to the voltage of the lower wire 71, and (ii) a current-voltage relationship in which the applied voltage in the low resistance state (point A) and the voltage at which the change to the high resistance state starts (point B) are substantially symmetrical.

Moreover, when the variable resistance element 10 of the memory cell 51 is changed from the high resistance state to the low resistance state, a resistance value of the low resistance state changes to a low resistance value (point A) corresponding to a value of a current flowing through the variable resistance element 10, by applying, to the memory cell 51, a predetermined voltage (an absolute value being a voltage higher than or equal to VLth) that causes a resistance change in the variable resistance element 10. Furthermore, the applied voltage and the current in the low resistance state (point A) and the voltage and the current at which the variable resistance element 10 starts changing to the high resistance state (point B) show substantial point symmetrical characteristics relative to the origin. Hence, it is required that a high resistance writing voltage and a current have the same absolute values as (be opposite in polarity to) a low resistance writing voltage and a current or the variable resistance element 10 be driven by a voltage and a current having absolute values greater than or equal to those of the low resistance writing voltage and the current.

In other words, for a stable resistance change operation, low resistance writing needs to be performed by limiting a current to a predetermined current value to thereby attain a predetermined low resistance state, whereas high resistance writing needs to be performed by applying a voltage in an opposite direction to that in the low resistance writing and causing a larger current to flow than in the low resistance writing.

It is to be noted that a voltage section from 0 V to point C in the low resistance writing (i.e., the high resistance state) and a voltage section from 0 V to point D in the high resistance writing (i.e., the low resistance state) are a voltage range in which there is no noticeable current flow even when a voltage is applied to the memory cell 51.

Point C and point D each correspond to a total voltage of a threshold voltage (hereafter denoted as VF) of the current steering element 29 and a resistance change voltage of the variable resistance element 10. Preferably, an operation of reading or writing a cross point memory cell array is performed by applying a voltage higher than or equal to this total voltage to a selected cell while causing an operating point to be between point C and point D for an unselected memory cell, to reduce a leakage current to the unselected memory cell.

[Cross Point Memory Cell Array and Array Equivalent Circuit]

The following describes an array equivalent circuit of a cross point memory cell array.

Figure 6:
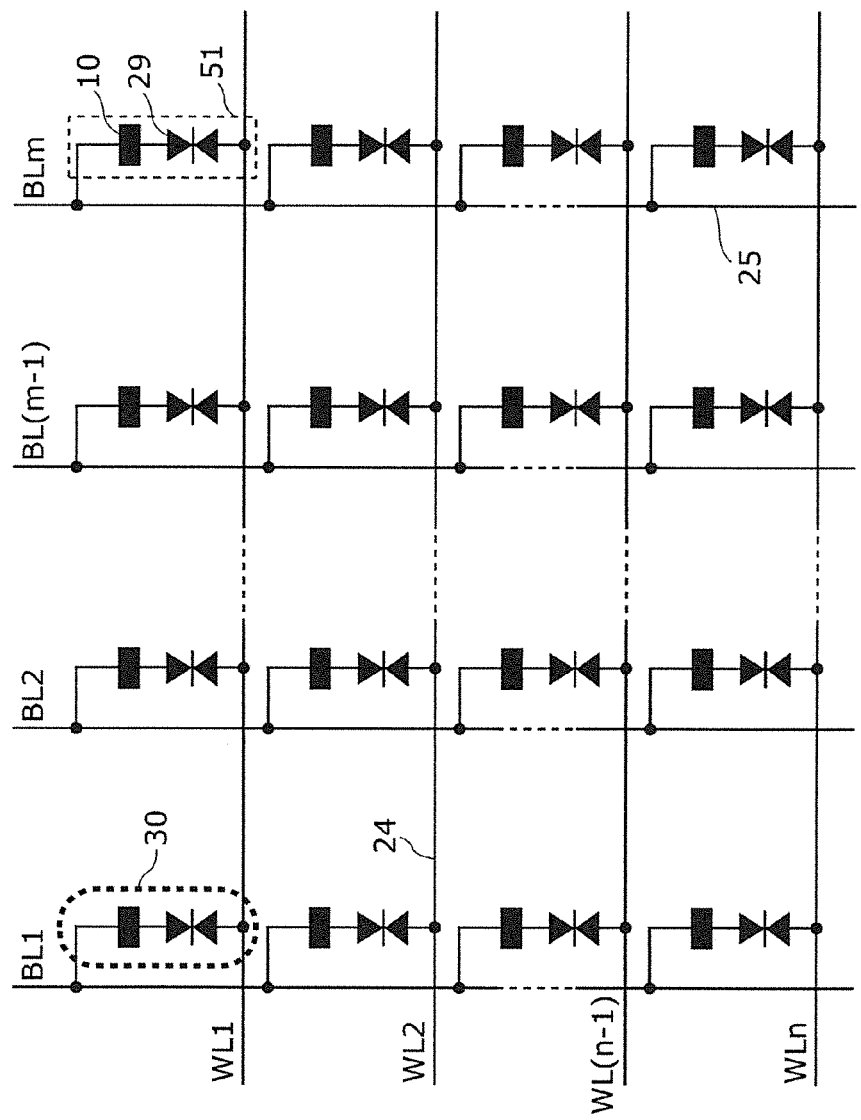
FIG. 6 is a circuit diagram showing a memory cell array in which memory cells are arranged in a matrix.

As with FIG. 1, FIG. 6 shows a circuit diagram of a memory cell array 1 in which memory cells 51 are arranged in a matrix.

In FIG. 6, each reference sign 24 indicates a word line formed by placing n wires in parallel with each other, and each reference sign 25 indicates a bit line that is formed by placing m wires in parallel with each other and is orthogonal to the word line in a non-contact manner. Each memory cell 51 in which the variable resistance element 10 and the current steering element 29 are connected in series is placed at a different one of cross points of the word lines 24 and the bit lines 25. The variable resistance element 10 has one end connected to a corresponding one of the bit lines 25, and the current steering element 29 has one end connected to a corresponding one of the word lines 24. To put it differently, the memory cell array 1 shown by FIG. 6 includes n memory cells 51 arranged in a bit line direction and m memory cells 51 arranged in a word line direction, that is, (n×m) memory cells 51.

Figure 7:
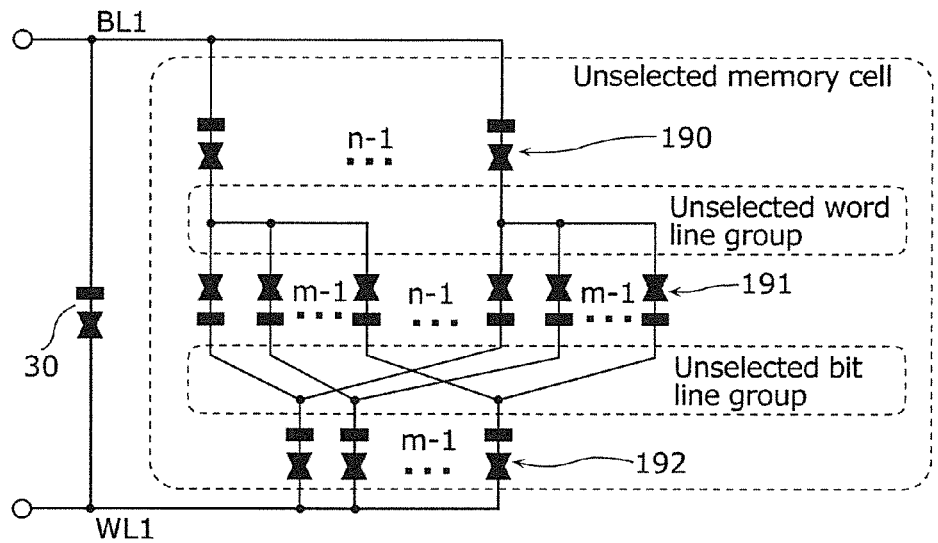
FIG. 7 is a diagram illustrating a development of a memory cell array into an array equivalent circuit.

FIG. 7 is a selected view diagram that schematically shows a connection relationship between a selected memory cell and unselected memory cells that are included between a selected bit line and a selected word line, with reference to the selected bit line and the selected word line, in order to describe the development of the memory cell array into the array equivalent circuit.

A selected memory cell 30 shown by FIG. 6 is connected to a selected bit line BL1 and a selected word line WL1. FIG. 7 is a diagram showing an equivalent circuit of FIG. 6 which illustrates the configuration of FIG. 6 in terms of the selected memory cell 30 and unselected memory cell groups. The selected memory cell 30 has one end connected to the selected bit line BL1, and the other end connected to the selected word line WL1. Other unselected memory cells 51 are classified into (1) a first unselected memory cell group 190 consisting of (n−1) memory cells 51 each having one end connected to the selected bit line BL1, (2) a third unselected memory cell group 192 consisting of (m−1) memory cells 51 each having one end connected to the selected word line WL1, and (3) a second unselected memory cell group 191 consisting of (n−1)×(m−1) memory cells 51 each of which is (i) connected via a corresponding one of unselected word lines in an unselected word line group to the other end of a corresponding one of (n−1) memory cells 51 in the first unselected memory cell group 190 and (ii) connected via a corresponding one of unselected bit lines in an unselected bit line group to the other end of a corresponding one of (m−1) memory cells 51. It is to be noted that in the Description, as abbreviated notation, the bit line and the word line are also denoted by "BL" and "WL", respectively.

One of (n−1) memory cells 51 in the first unselected memory cell group 190 has the other end connected to one ends of (m−1) memory cells 51 in the second unselected memory cell group 191. At least (n−1) relationships each between the first unselected memory cell group 190 and the second unselected memory cell group 191 are present. One of (m−1) memory cells 51 in the third unselected memory cell group 192 has the other end connected to the other ends of (n−1) memory cells 51 in the second unselected memory cell group 191. At least (m−1) relationships each between the third unselected memory cell group 192 and the second unselected memory cell group 191 are present.

Since as many states in each of which one of (n−1) memory cells 51 in the first unselected memory cell group 190 is connected to (m−1) memory cells 51 in the second unselected memory cell group 191 as the relationships each between the first unselected memory cell group 190 and the second unselected memory cell group 191 are present, each node of the unselected word line group has the substantially same voltage. Moreover, since as many states in each of which one of (m−1) memory cells 51 in the third unselected memory cell group 192 as the relationships each between the third unselected memory cell group 192 and the second unselected memory cell group 191 are present, each node of the unselected bit line group has the substantially same voltage.

Figure 8:
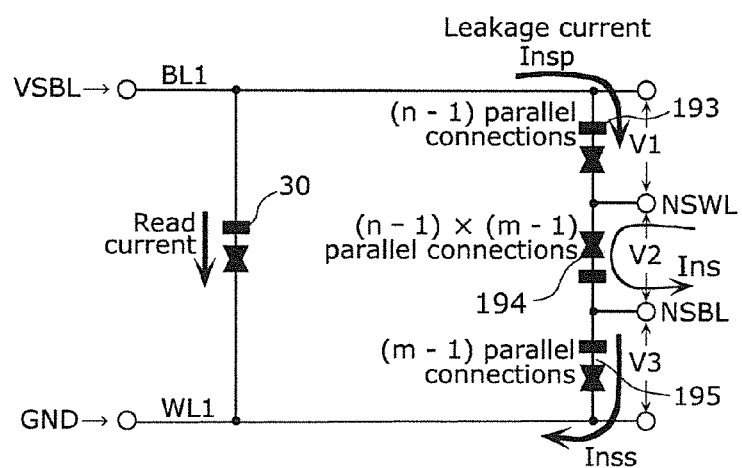
FIG. 8 is a reduced equivalent circuit diagram of a memory cell.

Thus, it is possible to degenerate the equivalent circuit shown by FIG. 7 in such a manner that all the nodes of the unselected word line group and all the nodes of the unselected bit line group are represented by respective single lines. FIG. 8 shows the equivalent circuit thus degenerated.

In FIG. 8, the selected memory cell 30 has the one end connected to the selected bit line BL1, and the other end connected to the selected word line WL1. A first unselected memory cell 193 is equivalent to the first unselected memory cell group 190, and has (n−1) parallels. A second unselected memory cell 194 is equivalent to the second unselected memory cell group 191, and has (n−1)×(m−1) parallels. A third unselected memory cell 195 is equivalent to the third unselected memory cell group 192, and has (m−1) parallels. The first unselected memory cell 193, the second unselected memory cell 194, and the third unselected memory cell 195 are connected in series. The first unselected memory cell 193 has a terminal that is not connected to the second unselected memory cell 194 but connected to the selected bit line BL1, and the third unselected memory cell 195 has a terminal that is not connected to the second unselected memory cell 194 but connected to the selected word line WL1. An intermediate node that connects the first unselected memory cell 193 and the second unselected memory cell 194 is referred to as an unselected word line NSWL, and an intermediate node that connects the second unselected memory cell 194 and the third unselected memory cell 195 is referred to as an unselected bit line NSBL.

As stated above, the equivalent circuit, which shows the relationship between the selected memory cell and the unselected memory cells of the cross point memory cell array shown by FIG. 6, is degenerated as shown by FIG. 8. Hereinafter, an I-V characteristic of any selected memory cell of the cross point memory cell array and an I-V characteristic of a leakage current through unselected memory cells are touched on in connection with a read characteristic of the selected memory cell. The I-V characteristic of such a memory cell array is described below with reference to the equivalent circuit shown by FIG. 8, for the sake of simplicity.

[Equivalent Circuit and I-V Characteristic at Time of Reading]

Figure 9:
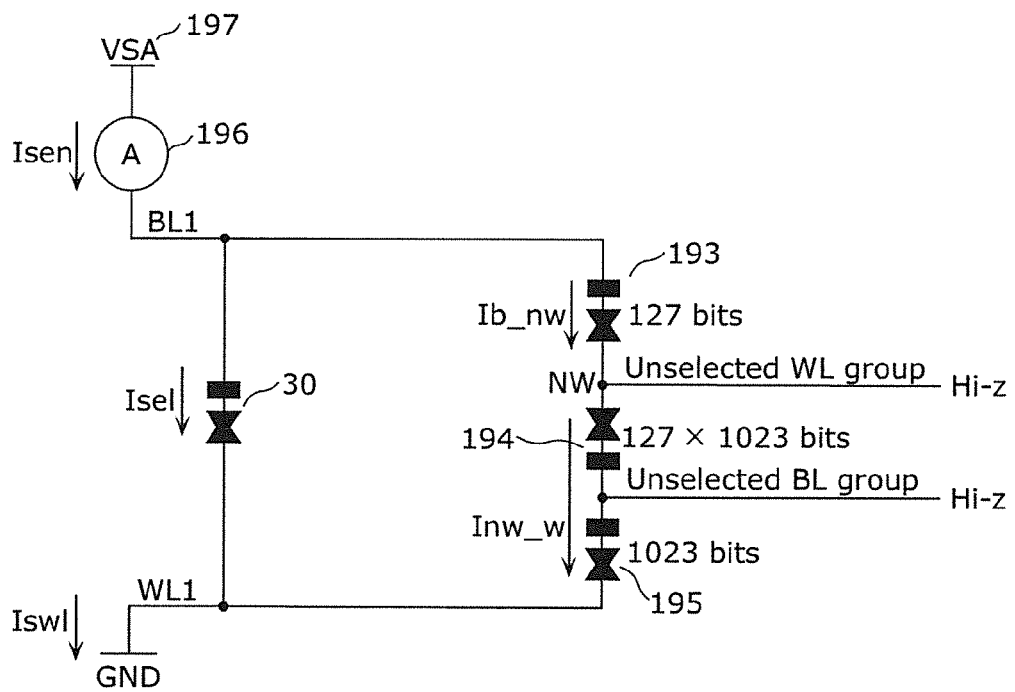
FIG. 9 is a equivalent circuit diagram illustrating a read state of an unselected line at the time of Hi-z.
Figure 10:
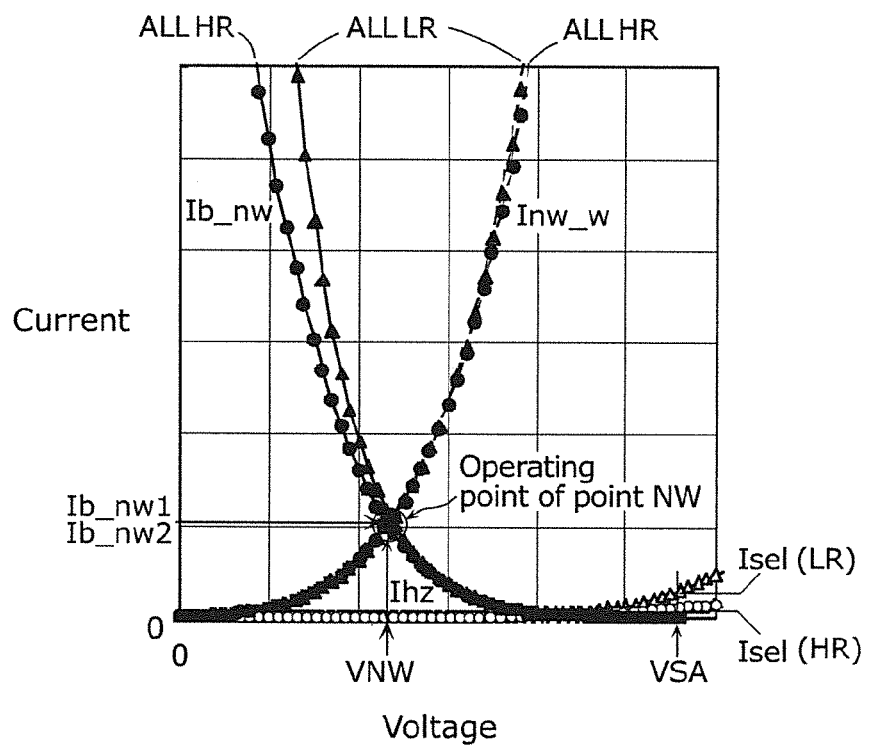
FIG. 10 is an I-V characteristic graph for a memory cell.

The following describes, using the equivalent circuit shown by FIG. 8, a conventional read operation and its characteristics, with reference to FIG. 9 and FIG. 10.

FIG. 9 is a diagram showing a state of a case where a sense amplifier reads a 1-bit selected memory cell when the unselected word line and the unselected bit line are in a high impedance state (hereinafter, referred to as Hi-z state) in the equivalent circuit of the memory cell array shown by FIG. 8.

In FIG. 9, reference sign 197 indicates a sense power source at the time of reading. The sense power source 197 generates a voltage VSA as a read voltage (sense voltage). Reference sign 196 indicates a current detection circuit having one end connected to the sense power source 197 and the other end connected to the selected bit line BL1. The current detection circuit 196 is a sense amplifier that determines whether data held in a selected memory cell indicates 0 or 1. The selected word line WL1 is electrically connected to a ground (GND) voltage of 0 V. The unselected word line (WL) group connecting the first unselected memory cell 193 and the second unselected memory cell 194 is referred to as point NW, and in the Hi-z state. The unselected bit line (BL) group connecting the second unselected memory cell 194 and the third unselected memory cell 195 is also in the Hi-z state. It goes without saying that the selected memory cell 30 has the one end connected to the selected bit line BL1 and the other end connected to the selected word line WL1.

The voltage VSA of the sense power source 197 is applied to the selected bit line BL1 shown by FIG. 9 (assuming that the current detection circuit 196 has an impedance almost equal to 0Ω). In a state where the GND is applied to the selected word line WL1, a current Isel flows through the selected memory cell 30 from the selected bit line BL1 to the selected word line WL1, a current Ib_nw flows through the first unselected memory cell 193 from the selected bit line BL1, a current Inw_w flows through the second unselected memory cell 194 and the third unselected memory cell 195 to the selected word line WL1, a current Isen that is a sum of the current Isel flowing through the selected memory cell 30 and the current Ib_nw flowing through the first unselected memory cell 193 flows through the current detection circuit 196, and a current Iswl that is a sum of the current Isel flowing through the selected memory cell 30 and the current Inw_w flowing through the second unselected memory cell 194 and the third unselected memory cell 195 flows through a GND terminal. In other words, the sense current Isen flowing through the current detection circuit 196 is expressed by Equation 1 below.

$$Isen = Isel + Ib\_nw \quad \text{(Equation 1)}$$

The current Iswl flowing through the GND terminal is expressed by Equation 2 below.

$$Iswl = Isel + Inw\_w \quad \text{(Equation 2)}$$

Here, since both of the unselected WL group and the unselected BL group are in the Hi-z state, the following equation holds.

$$Ib\_nw = Inw\_w \quad \text{(Equation 3)}$$

Thus, the sense current Isen has the same magnitude as the GND current Iswl.

Considering that a size of the memory cell array is defined by 128 bits (n=128) on the same bit line and 1024 bits (m=1024) on the same word line, a bit count of each of the unselected memory cells shown by FIG. 9 is calculated as follows: the first unselected memory cell 193 has n−1=127 bits; the second unselected memory cell 194 has (n−1)×(m−1)=127×1023 bits; and the third unselected memory cell 195 has m−1=1023 bits.

FIG. 10 shows a current-voltage characteristic (an I-V characteristic) of the memory cell array.

In FIG. 10, the horizontal axis represents a voltage applied to each cell, and the vertical axis represents a current flowing through the cell. Two characteristic lines correspond to each of the current Isel flowing through the selected memory cell 30, the current Ib_nw flowing through the first unselected memory cell 193, and the current Inw_w flowing through the second unselected memory cell 194 and the third unselected memory cell 195. Each of the six characteristic lines shows a corresponding one of two states in one of which the variable resistance element is in the high resistance state (HR) and in the other of which the variable resistance element is in the low resistance state (LR) (shows a corresponding one of two states in one of which all variable resistance elements of unselected memory cells are in the high resistance state and in the other of which all the variable resistance elements are in the low resistance state). As an example, the variable resistance element has a resistance value in the high resistance state greater than that in the low resistance state by one digit. A white triangle indicates a case where the selected memory cell is in the low resistance state (LR), a while circle indicates a case where the selected memory cell is in the high resistance state (HR), a black triangle indicates Ib_nw or Inw_w when all the unselected memory cells are in the low resistance state (LR), and a black circle indicates Ib_nw or Inw_w when all the unselected memory cells are in the high resistance state (HR).

Each characteristic line shown by FIG. 10 is formed under one of the following conditions. Stated differently, when a sense voltage is the VSA, the characteristic lines of the selected memory cell 30 correspond to Isel (HR) in the case where the variable resistance element is in the high resistance state and Isel (LR) in the case where variable resistance element is in the low resistance state, respectively. Moreover, when an applied voltage of the selected bit line BL1 is the VSA, each of the characteristic lines of the first unselected memory cell 193 shows a corresponding one of the states in one of which all variable resistance elements of the first unselected memory cell 193 are in the high resistance state (HR) and in the other of which all the variable resistance elements of the first unselected memory cell 193 are in the low resistance state (LR), for the current Ib_nw flowing through the first unselected memory cell 193 when a voltage of the unselected WL group (point PW) is gradually increased from 0 V to the VSA. Each of the characteristic lines for a combination of the second unselected memory cell 194 and the third unselected memory cell 195 shows a corresponding one of the states in one of which all the variable resistance elements are in the high resistance state (HR) and in the other of which all the variable resistance elements are in the low resistance state (LR), for the current Inw_w flowing through the second unselected memory cell 194 and the third unselected memory cell 195 when a voltage of the unselected WL group (point NW) is gradually increased from 0 V to the VSA with reference to 0 V of the selected word line WL1. To put it differently, the characteristic lines of the unselected memory cells show the case where the voltage of the unselected word line group (point NW) is gradually increased with reference to the voltage of the selected bit line BL1 or the selected word line WL1.

In the current-voltage characteristic, for the currents Ib_nw and Inw_w flowing through the unselected memory cells, since the unselected WL group and the unselected BL group are in the Hi-z state, Ib_nw=Inw_w. Thus, an operating point in the I-V characteristic shown by FIG. 10 is at a position of a cross point of the currents Ib_nw and Inw_w. An amount of the current at the operating point is Ib_nw1 when the variable resistance elements of all the unselected memory cells are in the high resistance state (HR), and is Ib_nw2 when the variable resistance elements of all the unselected memory cells are in the low resistance state (LR). Here, Ib_nw1 and Ib_nw2 are substantially equal to Ihz in the figure.

In other words, the current Isel of the selected memory cell 30 is Isel (HR) when the variable resistance element is in the high resistance state, and is the Isel (LR) when the variable resistance element is in the low resistance state, whereas the current flowing through the unselected memory cells varies with a resistance state of the variable resistance elements of the unselected memory cells, is substantially equal to Ihz, and is 10 or more times as much as Isel (HR), that is, great in quantity. Thus, according to Equation 1, the sense current Isen of the current detection circuit 196 is Isel (HR)+Ib_nw2 when the variable resistance element of the selected memory cell 30 is in the high resistance state and all the variable resistance elements of the unselected memory cells are in the low resistance state, and is Isel (LR)+Ib_nw1 when the variable resistance element of the selected memory cell 30 is in the low resistance state and all the variable resistance elements of the unselected memory cells are in the high resistance state. In the example of FIG. 10, the current Isel (LR), which is the current Isel of the selected memory cell 30 in the low resistance state, to the current Isel (HR), which is the current Isel of the same in the high resistance state, are in the ratio of 3.2 to 1, whereas the current (Isel (HR)+Ib_nw2) and the current (Isel (LR)+Ib_nw1) of the sense current Isel are in the ratio of 1.1 to 1. The latter ratio is clearly reduced to by approximately ⅓ of the sense current ratio only for the selected memory cell. It is to be noted that a current ratio for the sense current Isen is the worst value of a current ratio for the sense current Isen between when the variable resistance element of the selected memory cell is in the high resistance state and when the variable resistance element of the same is in the low resistance state, and corresponds to a read margin in the cross point variable resistance nonvolatile memory device.

As just described, when both of the unselected WL group and the unselected BL group are in the Hi-z state, it is highly inefficient to determine, using the current detection circuit 196, the resistance state of the selected memory cell 30, and read the selected memory cell 30.

[Increase in Read Efficiency by Unselected WL Bias and Its Problem]

PTL 2 discloses, as an effort to increase read efficiency, applying a voltage to each of an unselected WL group and an unselected BL group at the time of reading. Since, however, in a read operation, the current detection circuit 196 that is connected to the bit line side determines an amount of current in the selected memory cell 30, the current Isen flowing through the current detection circuit 196 should be the current Isel in the selected memory cell 30. As a result, it is only necessary to reduce a leakage current Ib_nw flowing via the first unselected memory cell 193 from the selected bit line BL1. Thus, a voltage to an unselected line for increasing the read efficiency should be applied only to the unselected WL group of the first unselected memory cell 193.

Figure 11:
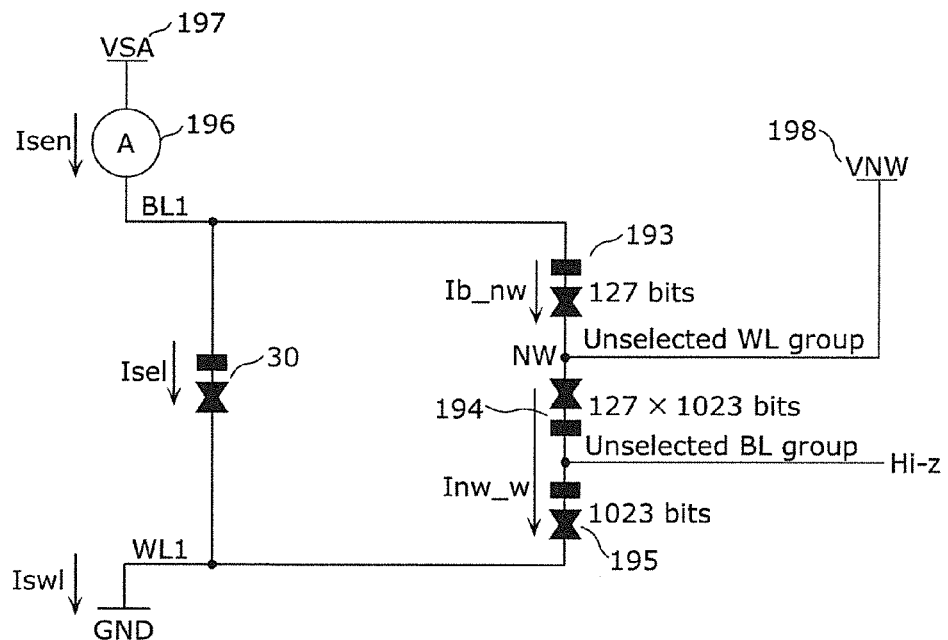
FIG. 11 is an equivalent circuit diagram when a voltage is applied to an unselected word line.

FIG. 11 shows an equivalent circuit when, in the equivalent circuit for reading shown by FIG. 9, a voltage is applied to an unselected word line so as to increase read efficiency.

In FIG. 11, reference sign 198 indicates an unselected word line power source. The unselected word line power source 198 is connected to the unselected WL group (point NW), and generates a voltage VNW. The other elements and the size of the memory cell array are the same as in FIG. 9, and thus descriptions thereof are omitted.

The voltage VNW of the unselected word line power source 198 is less than or equal to the voltage VSA of the sense power source 197. That is, VNW≤VSA.

Figure 12:
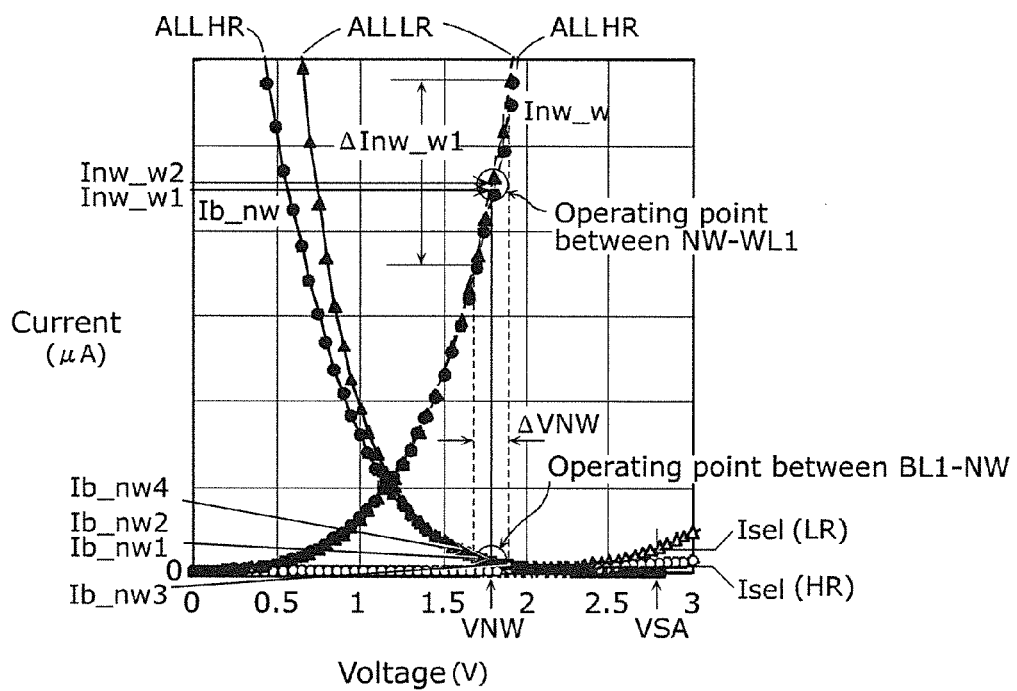
FIG. 12 is an I-V characteristic graph for a memory cell.

FIG. 12 shows a current-voltage characteristic (an I-V characteristic) at the time of reading in the equivalent circuit shown by FIG. 11.

In FIG. 12, the horizontal axis represents a voltage applied to each cell, the vertical axis represents a current flowing through the cell, and the characteristic lines shown are the same as in FIG. 10. It is to be noted that since the voltage VNW is applied from the unselected word line power source 198 to the unselected WL group (point NW), the characteristic lines shown by the figure have operating points different from the operating point in FIG. 10.

Due to the same bias state as in FIG. 9, the cell current Isel of the selected memory cell 30 is Isel (HR) when the variable resistance element is in the high resistance state, and is Isel (LR) when the variable resistance element is in the low resistance state.

Moreover, the characteristic line of the first unselected memory cell 193 and the characteristic line for the combination of the second unselected memory cell 194 and the third unselected memory cell 195, which are shown by FIG. 12, are the same as in FIG. 10. To put it differently, the unselected memory cell characteristic lines of two groups separated at point NW show the case where the voltage of the unselected word line group (point NW) is gradually increased with reference to the voltage of the selected bit line BL1 or the selected word line WL1.

In FIG. 12, as regards the currents Ib_nw and Inw_w flowing through the unselected memory cells, since the unselected word line power source 198 is connected to the unselected WL group (point NW) and the voltage VNW is applied to the unselected WL group, the operating points of the currents Ib_nw and Inw_w are operating points obtained when the operating points of the currents Ib_nw and Inw_w when the unselected WL group is in the Hi-z state, which is shown by FIG. 10, are shifted toward a high voltage side. Stated differently, currents at the operating points of the currents Ib_nw and Inw_w are Ib_nw1 and Inw_w1, respectively, when all the variable resistance elements of the selected memory cells are in the high resistance state (HR), and are Ib_nw2 and Inw_w2, respectively, when all the variable resistance elements of the unselected memory cells are in the low resistance state (LR). Here, Ib_nw1 is substantially equal in value to Ib_nw2.

Since the voltage VNW is applied to the unselected word line group (point NW), a current that flows through the first unselected memory cell 193 via the selected BL from the current detection circuit 196 is Ib_nw.

In other words, the current Isel flowing through the selected memory cell 30 is Isel (HR) when the variable resistance element is in the high resistance state, and is Isel (LR) when the variable resistance element is in the low resistance state, whereas the current flowing through the unselected memory cells varies with the resistance state of the variable resistance elements of the unselected memory cells, and is between Ib_nw1 and Ib_nw2 inclusive. Thus, according to Equation 1, the sense current Isen of the current detection circuit 196 is Isel (HR)+Ib_nw2 when the variable resistance element of the selected memory cell 30 is in the high resistance state and all the variable resistance elements of the unselected memory cells are in the low resistance state, and is Isel (LR)+Ib_nw1 when the variable resistance element of the selected memory cell 30 is in the low resistance state and all the variable resistance elements of the unselected memory cells are in the high resistance state. The current Isel (LR), which is the current Isel of the selected memory cell 30 in the low resistance state, and the current Isel (HR), which is the current Isel of the same in the high resistance state, are in the ratio of 3.2 to 1, whereas the current (Isel (HR)+Ib_nw2) and the current (Isel (LR)+Ib_nw1) of the sense current Isel are in the ratio of 1.98 to 1, which is approximately ⅔ of the former ratio.

As just described, in comparison to the case where both of the unselected WL group and the unselected BL group shown by FIG. 9 or FIG. 10 are in the Hi-z state (in this case, the sense current Isen has the current ratio of 1.1 to 1), the current ratio of the sense current Isen is clearly increased approximately twice as much in the configuration where the voltage is applied to the unselected word line group (point NW) (in this case, because the sense current Isen has the current ratio of 1.98 to 1). Stated differently, the method of applying a voltage to an unselected word line group, which is disclosed in PTL 2, makes it possible to surely increase in theory the read margin.

In the meantime, although the configuration where the voltage is applied to the unselected word line group (point NW) is based on the premise that the applied voltage VNW is stable in every situation, the voltage VNW generally varies due to manufacturing variations of circuit elements or variations caused by external power source noise. Suppose that approximately one-tenth of the voltage VNW varies, as shown by FIG. 12, the voltage VNW varies by ΔVNW with reference to VNW. Here, the unselected memory cell current Inw_w varies by ΔInw_w1, Ib_nw is between (Isel (HR)+Ib_nw3) and (Isel (HR)+Ib_nw4) inclusive when all the variable resistance elements of the unselected memory cells are in the high resistance state (HR), and is between (Isel (LR)+Ib_nw3) and (Isel (LR)+Ib_nw4) inclusive when all the variable resistance elements of the unselected memory cells are in the low resistance state (LR). Thus, according to Equation 1, the sense current Isen of the current detection circuit 196 is between (Isel (HR)+Ib_nw3) and (Isel (HR)+Ib_nw4) inclusive when the variable resistance element of the selected memory cell 30 is in the high resistance state and all the variable resistance elements of the unselected memory cells are in the low resistance state, and is between (Isel (LR)+Ib_nw3) and (Isel (LR)+Ib_nw4) inclusive when the variable resistance element of the selected memory cell 30 is in the low resistance state and all the variable resistance elements of the unselected memory cells are in the high resistance state. The worst sense current by which it is determined whether the selected memory cell 30 is in the high resistance state or the low resistance state has the maximum value (Isel (HR)+Ib_nw4) of the sense current Isen when the variable resistance element of the selected memory cell 30 is in the high resistance state, and the minimum value (Isel (LR)+Ib_nw3) of the sense current Isen when the variable resistance element of the selected memory cell 30 is in the low resistance state. Here, the ratio of (Isel (LR)+Ib_nw3) to the (Isel (HR)+Ib_nw4) is 1.42 to 1.

To put it differently, in view of the voltage fluctuation at the operating point, the current ratio of the sense current Isen is reduced to 1.42:1. This is because the current of the unselected memory cell group varies sensitively with the voltage variation due to nonlinear characteristics that current characteristics of the memory cells resulting from a diode change exponentially with the voltage.

Although PTL 2 discloses, as measures to increase the read efficiency, the configuration where the voltage is applied to the unselected WL group (point NW), the variation in voltage provides significant influence in the memory device using the memory cells having steep current change characteristics relative to the voltage fluctuation. As a result, it has become clear that the actual read margin in consideration of the variation in voltage is reduced.

In view of the problem, the object of the present invention is to provide a nonvolatile memory device that is a cross point variable resistance nonvolatile memory device using memory cells having current characteristics sensitive to a voltage, and increases an actual read margin in consideration of a variation in electrical signal such as applied voltage, to enable stable reading.

Moreover, in view of a problem that a change of a current flowing into unselected word lines via unselected cells causes electromagnetic noise (EMI), another object of the present invention is to provide a cross point variable resistance nonvolatile memory device that operates stably.

In order to achieve the objects, the inventors of the present invention have conceived the following embodiments.

A cross point variable resistance nonvolatile memory device according to one aspect of the present invention includes: a cross point memory cell array having a plurality of memory cells each of which includes a variable resistance element and a bidirectional current steering element and is placed at a different one of cross points of a plurality of bit lines extending in an X direction and a plurality of word lines extending in a Y direction, the variable resistance element reversibly changing between at least two states including a low resistance state and a high resistance state when voltages of different polarities are applied to the variable resistance element, and the bidirectional current steering element being connected in series with the variable resistance element and having nonlinear current-voltage characteristics; a decoder circuit that selects at least one of the memory cells from the memory cell array by selecting at least one of the bit lines and at least one of the word lines; a read circuit that reads data from the selected memory cell; a first current source that supplies a first constant current; and a control circuit that controls the reading of the data from the selected memory cell, wherein the control circuit controls the decoder circuit, the read circuit, and the first current source so that when the read circuit reads data, a first voltage for reading outputted from the read circuit is applied to a selected bit line that is one of the bit lines which is selected by the decoder circuit, a second voltage is applied to a selected word line that is one of the word lines which is selected by the decoder circuit, and the first constant current is supplied to an unselected word line that is, among the word lines, a word line not selected by the decoder circuit.

With this method, not the constant voltage but the constant current is applied to the unselected word line, that is, the unselected word line current application mode is employed. This mode allows the cross point variable nonvolatile memory device using the memory cells having sensitive current-voltage characteristics to increase the actual read margin in consideration of the variation in the applied electrical signal, to achieve stable read characteristics.

Moreover, the variation in current applied to the unselected word line is smaller in such an unselected word line current application mode than in the conventional constant voltage application mode, and thus the problem that the change of the current flowing into the unselected word line via unselected cells causes the electromagnetic nose (EMI) can be solved to enable stable operations.

Here, the read circuit and the first current source may be connected to the same power source that supplies a predetermined voltage at least when the data is read. With this, the read circuit and the first current source are formed by using a single sense power source for the read circuit, and thus the unselected word line current application mode according to the present invention is achieved by a simple circuit.

The cross point variable resistance nonvolatile memory device may further include: a first switch circuit that selectively applies, to the selected bit line, the first voltage or a third voltage for pre-charging prior to reading of data; a second switch circuit that selectively applies, to the selected word line, the second voltage or the third voltage; and a third switch circuit that selectively applies, to the unselected word line, the first constant current or the third voltage. Specifically, in a first step, the control circuit preferably controls the first to third switch circuits so that the third voltage is supplied to the selected bit line through the first switch circuit, to the selected word line through the second switch circuit, and to the unselected word line through the third switch circuit, and in a second step, the control circuit preferably controls the first to third switch circuits so that the first voltage is supplied to the selected bit line through the first switch circuit, the second voltage is supplied to the selected word line through the second switch circuit, and the first constant current is supplied to the unselected word line through the third switch circuit. With this, the pre-charging prior to the reading of data is achieved, which makes more reliable data reading possible.

Moreover, preferably, the third voltage, which is supplied to the unselected word line in the first step, is substantially equal to a voltage, of the unselected word line, which is dependent on a current supplied by the first current source in the second step. This reduces variation in a voltage level of the unselected word line when the first step is switched to the second step, which enables more stable data reading.

Moreover, the cross point variable resistance nonvolatile memory device includes: a plurality of the memory cell arrays, wherein the decoder circuit includes: a word line decoder circuit that may select a predetermined word line from among word lines of the memory cell arrays; and a word line pre-decoder circuit that may control supply of a voltage or a current to the word line selected by the word line decoder circuit, the first current source may supply the first constant current to the word line pre-decoder circuit, and the word line pre-decoder circuit may be supplied with the first constant current or the third voltage through the third switch circuit. With this, the constant current is applied from the first current source to the unselected word line through the third switch circuit and the word line pre-decoder circuit, and the unselected word line current application mode is easily achieved.

Furthermore, the read circuit includes: a first PMOS transistor, a second PMOS transistor, a second current source that supplies a second constant current; and a differential detection circuit, the differential detection circuit may have a first input terminal and a second input terminal, compare a voltage at the first input terminal and a reference voltage connected to the second input terminal, and output a result of the comparison as a logic signal, the first PMOS transistor may have a source terminal connected to the first voltage, a drain terminal connected to the selected bit line through the first switch circuit, and a gate terminal connected to the drain terminal, the second PMOS transistor may have a source terminal connected to the first voltage, a gate terminal connected to the gate terminal of the first PMOS transistor, and a drain terminal connected to one of terminals of the second current source, the second current source may have the other terminal connected to a GND voltage, and the first input terminal of the differential detection circuit may be connected to the drain terminal of the second PMOS transistor. With this, a data read mode in which a resistance state of a variable resistance element in a memory cell is detected by application of a current is achieved.

The cross point variable resistance nonvolatile memory device, wherein in the case where a memory cell placed at a cross point of a bit line and a word line above the bit line is an odd layer memory cell, a memory cell placed at a cross point of a bit line and a word line below the bit line is an even layer memory cell, and XZ planes which are formed for respective bit line groups arranged in a Z direction and are aligned in the Y direction are vertical array planes, each of the bit line groups being composed of the bit lines, and the Z direction being a direction in which layers are stacked: the vertical array planes may share the word lines that perpendicularly pass through each of the vertical array planes; and in each of the vertical array planes, bit lines in all even layers of the layers may be commonly connected to a first via extending in the Z direction, and bit lines in all odd layers of the layers may be commonly connected to a second via extending in the Z direction, the cross point variable resistance nonvolatile memory device further including: a plurality of global bit lines each of which may be provided for a different one of the vertical array planes; a plurality of first bit line selection switch elements each of which may be provided for a different one of the vertical array planes and has one end connected to the first via; a plurality of second bit line selection switch elements each of which may be provided for a different one of the vertical array planes and has one end connected to the second via; a bidirectional current limiting circuit that may be provided for each of the vertical array planes, may be provided between the global bit line corresponding to the vertical array plane and each of (1) other ends of the first bit line selection switch elements corresponding to the vertical array planes and (2) other ends of the second bit line selection switch elements corresponding to the vertical array planes, and may limit a bidirectional current flowing between the global bit line and each of the first bit line selection switch elements and the second bit line selection switch elements; and a current limiting control circuit that may control the bidirectional current limiting circuit, the decoder circuit includes: a global bit line decoder and driver circuit that may provide, to the global bit lines, a signal for selecting memory cells and writing into or reading from the selected memory cells; and a word line decoder circuit and a word line pre-decoder circuit that may provide, to the word lines, a signal for selecting memory cells and writing into or reading from the selected memory cells, and the read circuit may read data from one of the memory cells which is selected by the global bit line decoder and driver circuit, and the word line decoder circuit and the word line pre-decoder circuit. As a result, it is possible to apply, also for the multilayer cross point memory cell array suitable for a large memory capacity, the unselected word line current application mode according to the present invention.

It is to be noted that the present invention is realized not only as the cross point variable resistance nonvolatile memory device but also as a method of reading performed by the cross point variable resistance nonvolatile memory device. The method of reading according to another aspect of the present invention is a method of reading performed by a cross point memory cell array that has a plurality of memory cells each of which includes a variable resistance element and a bidirectional current steering element and is placed at a different one of cross points of a plurality of bit lines extending in an X direction and a plurality of word lines extending in a Y direction, the variable resistance element reversibly changing between at least two states including a low resistance state and a high resistance state when voltages of different polarities are applied to the variable resistance element, the bidirectional current steering element being connected in series with the variable resistance element and having non-linear current-voltage characteristics, and the method including: selecting at least one of the memory cells from the memory cell array by selecting at least one of the bit lines and at least one of the word lines; reading data from the selected memory cell; and applying a first voltage for reading to a selected bit line that is one of the bit lines which is selected in the selecting, applying a second voltage to a selected word line that is one of the word lines which is selected in the selecting, and supplying a first constant current to an unselected word line that is, among the word lines, a word line not selected in the selecting, when the data is read from the selected memory cell.

The following describes embodiments of the present invention for achieving the objects, with reference to the drawings. It is to be noted that each of the embodiments described below shows one specific example of the present invention. The numerical values, shapes, materials, constituent elements, the arrangement and connection of the constituent elements, steps, the processing order of the steps, etc. shown in the following embodiments are mere examples, and therefore do not limit the scope of the present invention. Furthermore, among the constituent elements in the following embodiments, constituent elements not recited in any one of the independent claims indicating the most generic concept are described as arbitrary constituent elements.

Embodiment 1

A cross point variable resistance nonvolatile memory device according to Embodiment 1 of the present invention is characterized by applying to an unselected word line not a constant voltage but a constant current (an unselected word line current application mode). This being the case, first, the following describes how an actual read margin is increased by applying a constant current to an unselected word line, to enable stable reading.

Figure 13:
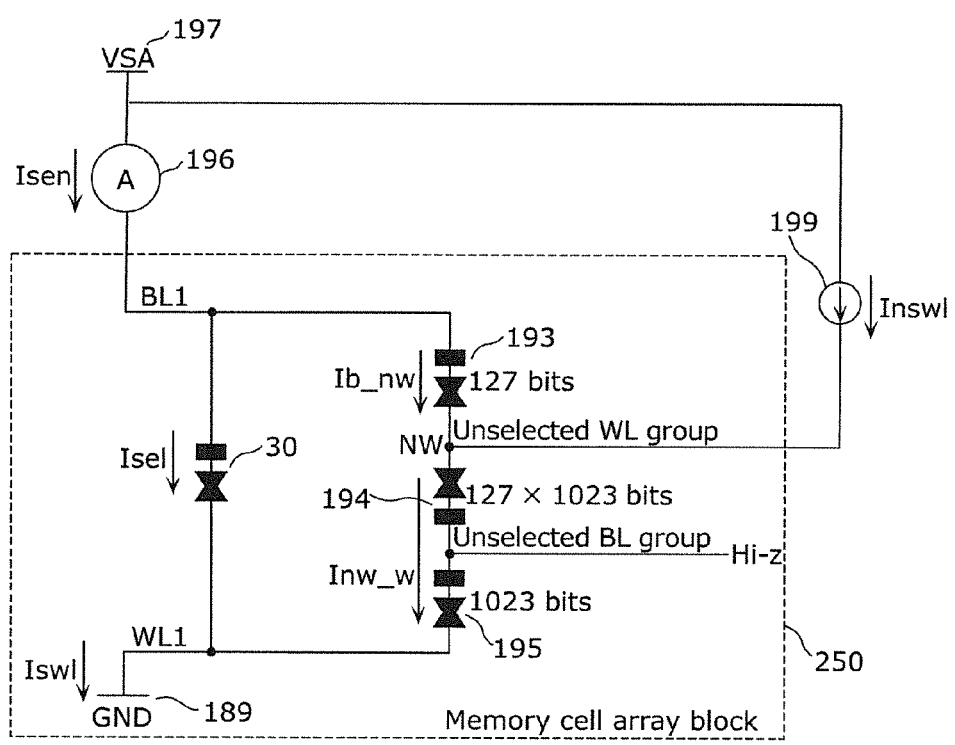
FIG. 13 is an equivalent circuit diagram when a current is applied to an unselected word line according to Embodiment 1 of the present invention.

FIG. 13 shows an equivalent circuit when, in the equivalent circuit for reading shown by FIG. 9, a current is applied to an unselected word line so as to increase read efficiency.

In FIG. 13, reference sign 199 indicates an unselected word line current source. The unselected word line current source 199 is an example of a first power source that generates a constant current (first current) Inswl to an unselected WL group (point NW). The unselected word line current source 199 has one end connected to the unselected WL group (point NW), and the other end connected to the sense power source 197 common to the current detection circuit 196. As a result, the highest voltage of the unselected WL group (point NW) is the voltage VSA of the sense power source 197. The other constituent elements and the size of the memory cell array are the same as in FIG. 9, and thus descriptions thereof are omitted.

FIG. 13 illustrates a relationship between a current path and each of the constituent elements.

In the configuration shown by FIG. 13, the voltage VSA of the sense power source 197 is applied to the selected bit line BL1 (assuming that the current detection circuit 196 has an impedance almost equal to 0Ω), and the selected word line WL1 is connected to the GND terminal 189. A current Isel flows through a selected memory cell 30 from a selected bit line BL1 to a selected word line WL1, a current Ib_nw flows through a first unselected memory cell 193 from the selected bit line BL1, a current Inswl is supplied from the unselected word line current source 199, a current Inw_w that is a sum of the current Ib_nw flowing through the first unselected memory cell 193 and a current Inswl supplied from the unselected word line current source 199 flows through a second unselected memory cell 194 and a third unselected memory cell 195 into the selected word line WL1, a current Isen that is a sum of the current Isel flowing through the selected memory cell 30 and the current Ib_nw flowing through the first unselected memory cell 193 flows through the current detection circuit 196, and a current Iswl that is a sum of the current Isel flowing through the selected memory cell 30 and the current Inw_w flowing through the second unselected memory cell 194 and the third unselected memory cell 195 flows through the GND terminal.

In other words, the sense current Isen flowing through the current detection circuit 196 is as expressed by Equation 1.

In addition, the current Iswl flowing into the GND terminal 189 is as expressed by Equation 2.

In contrast, since the current Inw_w flowing through the second unselected memory cell 194 and the third unselected memory cell 195 as stated above is the sum of the current Ib_nw flowing through the first unselected memory cell 193 and the current Inswl supplied from the unselected word line current source 199, the current Inw_w is expressed as below.

$$Inw\_w = Ib\_nw + Inswl \qquad \text{(Equation 4)}$$

In this embodiment, it is possible to set the current Inswl from the unselected word line current source 199, to any amount of current. As a result, currents other than the current Inswl from the unselected word line current source 199, which is expressed by Equation 4, vary in amount of current according to the set amount of the current Inswl from the unselected word line current source 199. (A voltage of the unselected WL group (point NW) varies according to the set amount of the current Inswl from the unselected word line current source 199, and thus the current Ib_nw flowing through the first unselected memory cell 193 varies accordingly.)

In this embodiment, an operating point that is determined by a current and a voltage on the unselected memory cell side shifts according to the set amount of the current Inswl from the unselected word line current source 199. The following describes, in addition to details of the above, an overview and details of advantages of the unselected word line current application mode according to this embodiment, with reference to the current-voltage characteristic (I-V characteristic) graph shown by FIG. 14, and (a) and (b) of FIG. 15, respectively.

Figure 14:
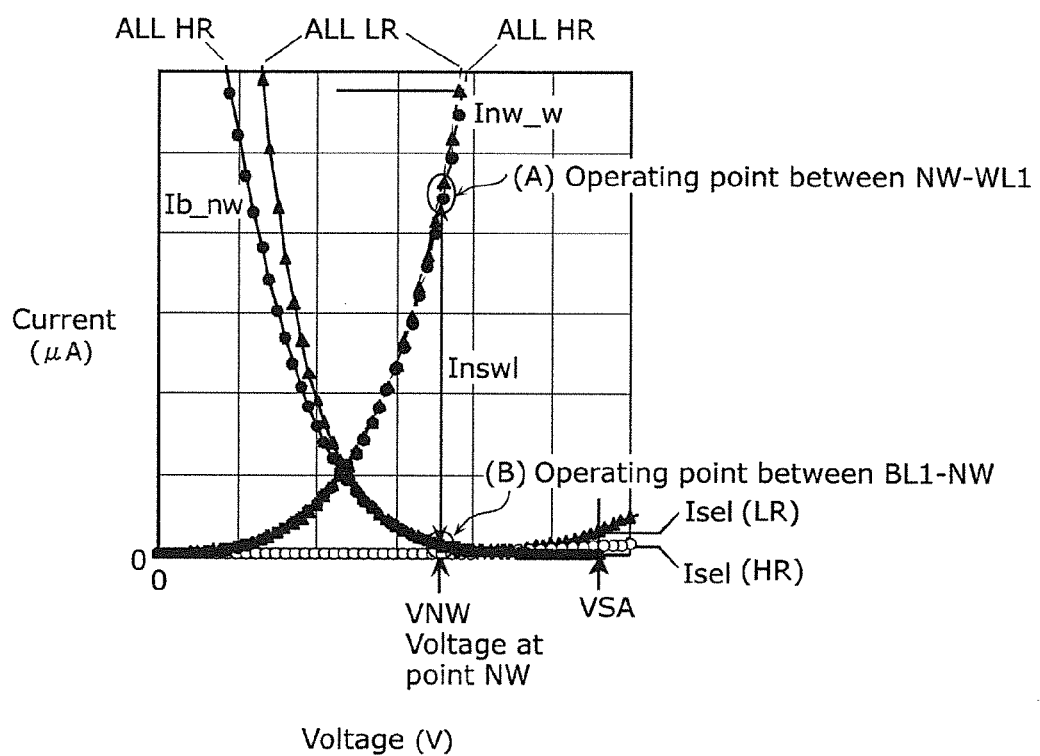
FIG. 14 is an I-V characteristic graph for a memory cell.

FIG. 14 shows a current-voltage characteristic (I-V characteristic) at the time of reading, in the equivalent circuit shown by FIG. 13 in the unselected word line current application mode.

In FIG. 14, the horizontal axis represents a voltage applied to each cell, the vertical axis represents a current flowing through the cell, and the characteristic lines shown are the same as in FIG. 10. It is to be noted that since the current Inswl from the unselected word line current source 199 is applied to the unselected WL group (point NW), the characteristic lines shown by the figure have operating points different from the operating point in FIG. 10.

The following describes a read operation when reference sign VNW is the operating point and the current Inswl from the unselected word line current source 199 is applied to the unselected word lines in FIG. 14.

Due to the same bias state as in FIG. 9, the cell current Isel of the selected memory cell 30 is Isel (HR) when the variable resistance element is in the high resistance state, and is Isel (LR) when the variable resistance element is in the low resistance state.

In contrast, in order that the currents flowing through the unselected memory cells satisfy Inswl=Inw_w−Ib_nw formed from the relational expression of Equation 4, with a voltage at point NW being common, Inw_w operates at operating point (A), Ib_nw operates at operating point (B), and the voltage at point NW operates at VNW.

Moreover, the characteristics of the current Inw_w or Ib_nw slightly vary depending on states of the variable resistance elements of the unselected memory cells. Thus, the following describes in detail states of the operating points with reference to (a) and (b) of FIG. 15 each of which shows a corresponding one of opposite states of the variable resistance elements of the memory cells, that is, which respectively show a case where all the variable resistance elements of the memory cells are in the high resistance state and a case where all the variable resistance elements of the memory cells are in the low resistance state.

Figure 15:
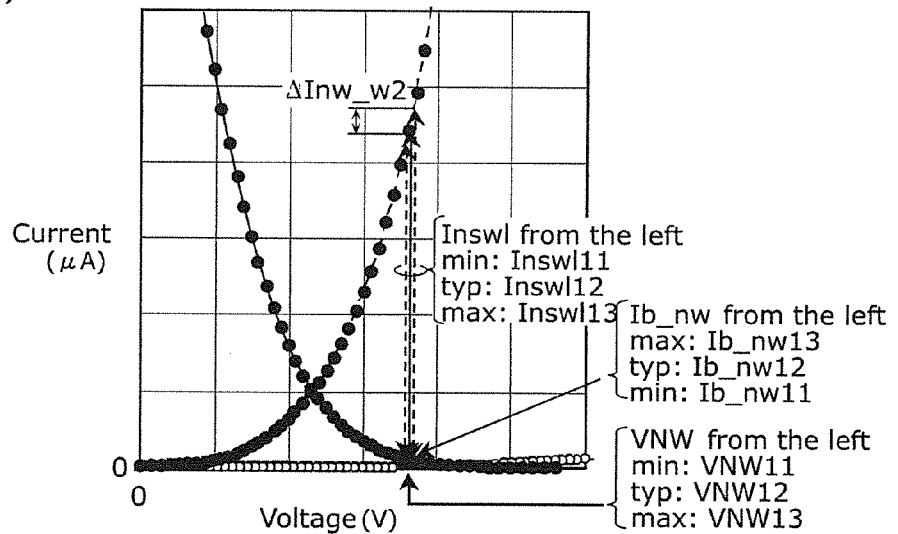
FIG. 15 is an I-V characteristic graph for a memory cell.
Figure 15:
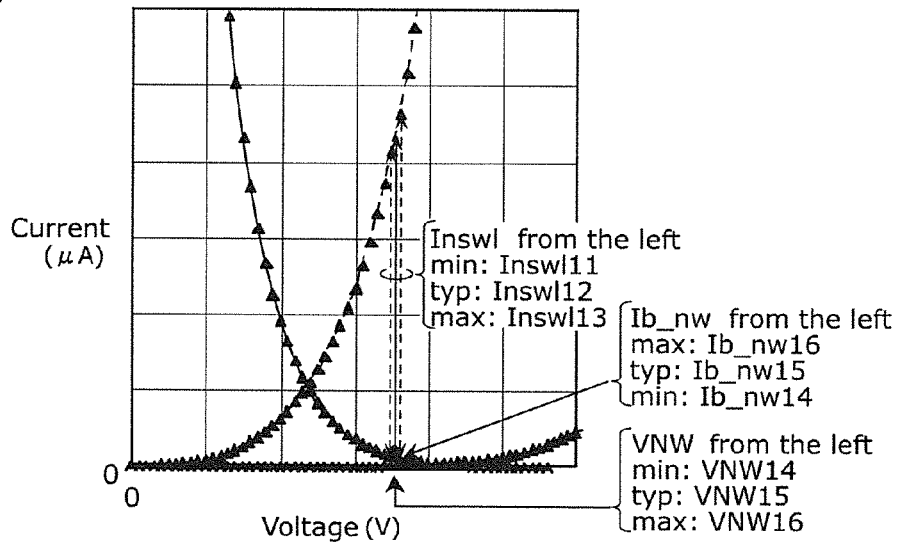

(a) of FIG. 15 is a graph showing the operating points when all the variable resistance elements shown by FIG. 14 are in the high resistance state. (b) of FIG. 15 is a graph showing the operating points when all the variable resistance elements shown by FIG. 14 are in the low resistance state.

In (a) of FIG. 15, when an applied current from the unselected word line current source 199 is Inswl12, the voltage VNW is VNW12, and the current Ib_nw flowing through the first unselected memory cell 193 is Ib_nw12.

On the other hand, although the applied current Inswl from the unselected word line current source 199 is preferably stable in every situation, the applied current Inswl generally varies due to the manufacturing variations of the circuit elements or the variations caused by the external power source noise. Suppose that approximately one-tenth of the current Inswl varies, when a displacement is ΔInswl with reference to Inswl=Inswl12, the current Inswl varies in a range from Inswl=Inswl11=Inswl12−ΔInswl to Inswl=Inswl13=Inswl12+ΔInswl.

In (a) of FIG. 15, when the applied current Inswl from the unselected word line current source 199 has the lowest amount of current Inswl11, the voltage VNW is VNW11, and the current Ib_nw flowing through the first unselected memory cell 193 is Ib_nw13. In addition, when the applied current Inswl from the unselected word line current source 199 has the highest amount of current Inswl13, the voltage VNW is VNW13, and the current Ib_nw flowing through the first unselected memory cell 193 is Ib_nw11. Here, VNW11<VNW12<VNW13 and Ib_nw11<Ib_nw12<Ibnw13.

Thus, when all the variable resistance elements are in the high resistance state, and the current Inswl from the unselected word line current source 199 and with center value Inswl12 and 10%-variation ΔInswl is applied, the current Ib_nw flowing through the first unselected memory cell 193 fluctuates in a range from Ib_nw11 to Ib_nw13.

In (b) of FIG. 15, when the applied current Inswl from the unselected word line current source 199 has a standard amount of current Inswl12, the voltage VNW is VNW12, and the current Ib_nw flowing through the first unselected memory cell 193 is Ib_nw15.

As above, the following assumes a case where the applied current Inswl from the unselected word line current source 199 varies in a range from Inswl=Inswl11 to Inswl=Inswl13.

In (b) of FIG. 15, when the applied current Inswl from the unselected word line current source 199 has the lowest amount of current Inswl11, the voltage VNW is VNW14, and the current Ib_nw flowing through the first unselected memory cell 193 is Ib_nw16. In addition, when the applied current Inswl from the unselected word line current source 199 has the highest amount of current Inswl13, the voltage VNW is VNW16, and the current Ib_nw flowing through the first unselected memory cell 193 is Ib_nw14. Here, VNW14<VNW15<VNW16 and Ibnw14<Ibnw15<Ibnw16.

Thus, when all the variable resistance elements are in the low resistance state, and the current Inswl from the unselected word line current source 199 and with center value Inswl12 and 10%-variation ΔInswl is applied, the current Ib_nw flowing through the first unselected memory cell 193 fluctuates in a range from Inswl14 to Inswl16.

The following performs a trial calculation of a degree of ease of reading in the unselected word line current application mode in consideration of the variation.

Thus, according to Equation 1, the sense current Isen of the current detection circuit 196 is between (Isel (HR)+Ib_nw14) and (Isel (HR)+Ib_nw16) inclusive when the variable resistance element of the selected memory cell 30 is in the high resistance state and all the variable resistance elements of the unselected memory cells are in the low resistance state, and is between (Isel (LR)+Ib_nw11) and (Isel (LR)+Ib_nw13) inclusive when the variable resistance element of the selected memory cell 30 is in the low resistance state and all the variable resistance elements of the unselected memory cells are in the high resistance state.

The worst sense current by which it is determined whether the selected memory cell 30 is in the high resistance state or the low resistance state has the maximum value (Isel (HR)+Ib_nw16) of the sense current Isen when the variable resistance element of the selected memory cell 30 is in the high resistance state, and the minimum value (Isel (LR)+Ib_nw11) of the sense current Isen when the variable resistance element of the selected memory cell 30 is in the low resistance state. Here, the ratio of (Isel (LR)+Ib_nw11) to the (Isel (HR)+Ib_nw16) is 1.78 to 1.

In other words, even in consideration of the variation of the applied current Inswl by 10%, the current ratio of the sense current Isen in the unselected word line current application mode according to this embodiment is 1.78 to 1. The current ratio is better than 1.42 to 1, the current ratio of the sense current Isen in the unselected word line voltage application mode, and thus this means that the state of the selected memory cell can be read more easily (i.e., the read margin is greater) in the unselected word line current application mode according to this embodiment than in the unselected word line voltage application mode. To put it differently, the unselected word line current application mode according to this embodiment clearly increases the actual read margin in consideration of the variation in electrical signal to be applied, to enable the stable reading.

Moreover, in this embodiment, the variation ΔInw_ws of the current Inw_w applied to the unselected word line group (point NW) is substantially equal to ΔInswl, and is approximately one-fifth of the variation (ΔInw_w1 in FIG. 12) of the current Inw_w. Thus, the unselected word line current application mode according to this embodiment also produces an effect of reducing the electromagnetic noise (EMI) caused by the change of the current. Stated differently, the unselected word line current application mode according to this embodiment solves the problem of the electromagnetic noise (EMI) caused by the change of the current flowing via the unselected cells into the selected word line, to enable the stable operation.

The following describes a method of determining an amount of applied current in the unselected word line current application mode according to this embodiment.

(a) of FIG. 16A is a graph showing a current ratio, expressed by Isen (LR)/Isen (HR), of a leakage current Ib_nw flowing through all the unselected memory cells connected to the selected bit line (i.e., a current ratio between a sense current including the leakage current at the time of HR cell selection and a sense current at the time of LR cell selection). (b) of FIG. 16A is a graph showing the sense current Isen relative to the leakage current Ib_nw flowing through all the unselected memory cells connected to the selected bit line.

In (a) of FIG. 16A, in terms of the degree of ease in reading, the current ratio between the sense current including the leakage current at the time of HR cell selection and the sense current at the time of LR cell selection is preferably 1.5 to 1 or more. (It is to be noted that it is difficult to specify the value, because the current ratio depends on the performance of the sense amplifier.)

Here, a method of determining a current ratio based on a cell current of a single selected memory cell is described as the method of determining an amount of applied current in the unselected word line current application mode according to this embodiment.

As shown by (b) of FIG. 16A, the leakage current is added to a selected memory cell current (Isel (HR), point s) when the variable resistance element is in the high resistance state. When a current flowing through a single LR cell and an HR cell current including the leakage current have a similar value to that of the selected memory cell current (Isel (LR)) when the variable resistance element is in the low resistance state (at point P), the current flowing through the single LR cell and the HR cell current including the leakage current are equal to each other. In this case, although the current ratio is approximately 1.6 to 1 (point r in (a) of FIG. 16A), that is, almost half the current ratio (about 3.2:1 in (a) of FIG. 16A) of the selected single cell, this situation differs depending on the characteristics of the variable resistance element. The situation can be used as an indication of the maximum current of the unselected current Ib_nw (Ib_nw=Ib_nw21 in (b) of FIG. 16A).

Stated differently, an unselected WL applied current (Inswl21) when the leakage current in Isel (HR)+leakage current=Isel (LR) flows from the selected BL to an unselected WL is determined based on the characteristic diagram shown by (b) of FIG. 15, and a current greater than or equal to Inswl21 is applied to the unselected WL.

When the method of determination is described in detail using the above value, with reference to FIG. 16B (the same graph as (b) of FIG. 15), the current flowing into the unselected BL is Ib_nw=Ib_nw21, and a voltage at point NW is VNW21. Since the leakage current Inw_w flowing through all the unselected memory cells connected to the selected word line is Inw_w21 when the voltage at point NW is VNW21, according to Equation 4, the unselected WL applied current (Inswl21) is expressed as Inswl2132 Inw_w21-Ib_nw21.

Since the original current Ib_nw21 has the largest value, the applied current Inswl21 thus determined is the minimum current. Thus, the unselected WL applied current Inswl in this case is preferably at least Inswl21, and can be set to have a current value greater than or equal to that of Inswl21.

[Circuit Configuration of Cross Point Variable Resistance Nonvolatile Memory Device in Unselected WL Current Application Mode]

The following describes an exemplary entire circuit of the cross point variable resistance nonvolatile memory device using the unselected word line current application mode according to this embodiment, and an exemplary specific circuit of a word line driving system. In the following description, a configuration is assumed in which rectangle memory cell array mats each having 32 WLs×m BLS (where m is an integer number, and m>32) are stacked in two layers.

FIG. 17 is a cross section diagram of memory cells when the memory cells 51 used for the cross point memory cell array are stacked in two layers. (The memory cells 51 in each layer have the same structure as in FIG. 2 or FIG. 3, and here the memory cells 51 have the same structure as in FIG. 2 for the sake of simplicity.)

In FIG. 17, each of the memory cells 51 is a 1-bit memory cell including the variable resistance element 10 and the current steering element 29 that are connected in series with each other, and the memory cells 51 are vertically stacked in two layers. In the two-layer structure, the first layer memory cell has a lower terminal connected to one of the bit lines 71 and an upper terminal connected to the word line 70, and the second layer memory cell has a lower terminal connected to the word line 70 and an upper terminal to another one of the bit lines 71. In other words, the word line 70 is provided between the first layer memory cell and the second layer memory cell, and is connected to the upper terminal of the first layer memory cell as well as the lower terminal connected to the second layer memory cell, to form a shared structure.

It is to be noted that, in FIG. 17, the current steering element 29 and the variable resistance element 10 may be vertically reversed with each other.

FIG. 18 is a representation of the memory cell 51. The memory cell 51 is depicted by the diagram showing the structure in which the variable resistance element 10 and the current steering element 29 are connected in series with each other. Here, in the representation of the memory cell 51, to clarify, for the variable resistance element 10, an orientation of the second variable resistance layer 12 on the side of the upper electrode 11, the orientation is indicated by a portion colored in black. In other words, in FIG. 18, the variable resistance element 10 changes to the high resistance state when a positive voltage is applied to the word line 70 relative to the bit line 71, and conversely the variable resistance element 10 changes to the low resistance state when the positive voltage is applied to the word line 70 relative to the bit line 71.

FIG. 19 is a diagram showing a part (one vertical array plane) of the cross point variable resistance nonvolatile memory device in this embodiment. A cross section structure of a multilayer cross point memory cell array in which memory cells are stacked in the same pattern as in FIG. 17 as viewed from a word line direction, and a circuit structure provided below the multilayer cross point memory cell array are shown by FIG. 19.

Each memory cell 51 is placed at a cross point of a first layer bit line 53a comprising a wiring material such as aluminum and extending in a direction (the X direction) horizontal to the plane of paper and a first layer word line 52a comprising a wiring material such as aluminum and extending in a direction (the Y direction not shown) perpendicular to the plane of paper. Memory cells 51 corresponding to n bits are arranged above the first layer bit line 53a along the X direction, constituting first layer memory cells 51a.

In a layer above (the Z direction) the first layer memory cells 51a, each memory cell 51 is placed at a cross point of the first layer word line 52a and a second layer bit line 53b comprising a wiring material such as aluminum and extending in the X direction horizontal to the plane of paper, with the first layer word line 52a being below the memory cell 51 this time. Memory cells 51 corresponding to n bits are arranged above the second layer bit line 53b along the X direction, constituting second layer memory cells 51b. The first layer memory cells 51a and the second layer memory cells 51b form a three-dimensional memory cell array in which the memory cells 51 are stacked in two layers.

Thus, each memory cell Si is placed at a different one of the cross points of (i) the bit lines 53a and 53b extending in the X direction and formed in layers and (ii) the first layer word lines 52a extending in the Y direction and formed in layers between the first bit lines 53a and the second bit lines 53b, so as to be provided between the corresponding bit line and word line. Here, a memory cell placed at a cross point of a bit line and a word line above the bit line is referred to as an odd layer (first layer) memory cell (referred to as a first layer memory cell 51a here), and a memory cell placed at a cross point of a bit line and a word line below the bit line is referred to as an even layer (second layer) memory cell (referred to as a second layer memory cell 51b here).

The first layer bit line 53a is commonly connected by an odd layer bit line via (odd layer BL via) 55 which is an example of a second via, while the second layer bit line 53b is commonly connected by an even layer bit line via (even layer BL via) 54 which is an example of a first via. Since memory cell groups of adjacent layers in the Z direction share a bit line or a word line in this way, the multilayer cross point memory cell array can be produced with a minimum number of wiring layers, which contributes to a lower cost.

This embodiment has a feature that, in all layers from the first layer memory cells 51a to the second layer memory cells 51b, the variable resistance element 10 in each memory cell 51 can be formed in the same manufacturing condition and structure in the Z direction (e.g., in all layers the variable resistance element 10 can be formed by stacking the second electrode 21, the first variable resistance layer 13, the second variable resistance layer 12, and the third electrode 11 in this order from bottom to top). Hence, each memory cell of the same structure can be manufactured regardless of whether the memory cell belongs to an odd layer or an even layer. In other words, the variable resistance element 10 included in each even layer memory cell and the variable resistance element 10 included in each odd layer memory cell are positioned in the same orientation in the Z direction.

The even layer bit line via 54 is connected to one of a drain and a source of an even layer bit line selection switch element 57 that is an example of a first bit line selection switch element including an NMOS transistor. The odd layer bit line via 55 is connected to one of a drain and a source of an odd layer bit line selection switch element 58 that is an example of a second bit line selection switch element including an NMOS transistor. The other of the drain and the source of the even layer bit line selection switch element 57 and the other of the drain and the source of the odd layer bit line selection switch element 58 are commonly connected to a common contact (GBLI). A gate of the even layer bit line selection switch element 57 is connected to an even layer bit line selection signal line, while a gate of the odd layer bit line selection switch element 58 is connected to an odd layer bit line selection signal line.

The common contact GBLI is connected to one of a drain and a source of an N-type current limiting element 90 including an NMOS transistor, and also connected to one of a drain and a source of a P-type current limiting element 91 including a PMOS transistor. The other of the drain and the source of the N-type current limiting element 90 is connected to a global bit line 56 (GBL), and the other of the drain and the source of the P-type current limiting element 91 is also connected to the global bit line 56 (GBL). In other words, the N-type current limiting element 90 and the P-type current limiting element 91 are connected in parallel with each other, and constitute a bidirectional current limiting circuit 920 that limits a bidirectional current flowing between the global bit line 56 (GBL) and each of the even layer bit line selection switch element 57 and the odd layer bit line selection switch element 58.

A gate of the N-type current limiting element 90 is connected to a signal line that is connected to a node CMN, and a gate of the P-type current limiting element 91 is connected to a signal line that is connected to a node CMP. Since the present invention is a technique relating to reading, and the N-type current limiting element 90 and the P-type current limiting element 91 are always in on-state in a reading mode, voltages applied from the node CMP and the node CMN to the gates are 0 V and VSA, respectively. When performing a write operation, the N-type current limiting element 90 and the P-type current limiting element 91 function as a current limiting element.

It is to be noted that a group having a structure obtained by slicing in a direction in which the bit lines 53a and the bit lines 53b shown by FIG. 19 are aligned is referred to as a vertical array plane. In detail, XZ planes that each correspond to a different one of bit line groups each of which has bit lines aligned in the Z direction which is a layer stacking direction, that share word lines perpendicularly passing through the XZ planes, and that are aligned in the Y direction are referred to as vertical array planes. FIG. 20 is a diagram showing a structure in which four vertical array planes are arranged face to face.

In FIG. 20, the X direction is a direction in which bit lines extend, the Y direction is a direction in which word lines extend, and the Z direction is a direction in which the bit lines or the word lines are stacked in layers.

In FIG. 20, bit lines (BL) extend in the X direction and are formed in layers (two layers in FIG. 20), word lines (WL) extend in the Y direction and are formed in a layer (one layer in FIG. 20) between the bit lines. In a memory cell array 100, each memory cell (MC) 51 is placed at a different one of cross points of the bit lines and the word lines so as to be provided between the corresponding bit line and word line. It is to be noted that a part of the memory cells 51 and a part of the word lines are not shown for the sake of simplicity.

Each of vertical array planes 0 to 3 that corresponds to a different one of bit line groups each composed of bit lines BL arranged in layers in the Z direction includes memory cells 51 placed between the bit lines BL and the word lines WL. The vertical array planes 0 to 3 share the word lines (WL). In the example shown by FIG. 20, the number of memory cells 51 in the X direction is 32 (n=32 in FIG. 19) and the number of memory cells 51 in the Z direction is 2, in each of the vertical array planes 0 to 3. The memory cell array 100 is composed of the four vertical array planes 0 to 3 aligned in the Y direction.

It is to be noted that the number of memory cells in each vertical array plane and the number of vertical array planes in the Y direction are not limited to such.

In each of the vertical array planes 0 to 3, the even layer bit lines BL are commonly connected by the even layer bit line via 54 in FIG. 19 (BL_e0 to BL_e3), and the odd layer bit lines BL are commonly connected by the odd layer bit line via 55 in FIG. 19 (BL_o0 to BL_o3). It is to be noted that the even layer bit line via 54 in FIG. 19 is an example of the first via that connects all the even layer bit lines in the Z direction. In addition, the odd layer bit line via 55 is an example of the second via that connects all the odd layer bit lines in the Z direction.

Moreover, global bit lines GBL000 to GBL003 respectively corresponding to the vertical array planes 0 to 3 extend in the Y direction. Furthermore, odd layer bit line selection switch elements 61 to 64 and even layer bit line selection switch elements 65 to 68 are respectively provided for the vertical array planes 0 to 3. It is to be noted that the even layer bit line selection switch elements 65 to 68 are examples of first bit line selection switch elements each of which is provided for a different one of the vertical array planes and has one terminal connected to the first via (even layer bit line via 54). In addition, the odd layer bit line selection switch elements 61 to 64 are examples of second bit line selection switch elements each of which is provided for a different one of the vertical array planes and has one terminal connected to the second via (odd layer bit line via 55).

In FIG. 20, the odd layer bit line selection switch elements 61 to 64 and the even layer bit line selection switch elements 65 to 68 each include an NMOS transistor. In addition, the odd layer bit line selection switch elements 61 to 64 and the even layer bit line selection switch elements 65 to 68 corresponding to N-type current limiting elements 90, 92, 94, and 96 each including an NMOS transistor and P-type current limiting elements 91, 93, 95, and 97 each including a PMOS transistor are respectively connected to the global bit lines GBL000 to GBL003 corresponding to the N-type current limiting elements 90, 92, 94, and 96 and the P-type current limiting elements 91, 93, 95, and 97, each at a diffusion layer terminal of one of a drain and a source of a corresponding pair of the odd layer bit line selection switch elements 61 to 64 and the even layer bit line selection switch elements 65 to 68. Gate terminals of the N-type current limiting elements 90, 92, 94, and 96 are commonly connected to the control voltage node CMN, and gate terminals of the P-type current limiting elements 91, 93, 95, and 97 are commonly connected to the control voltage node CMP. Moreover, voltages of the node CMN and the node CMP cause the current limiting elements connected to the respective nodes to be in on-state, when reading is performed.

The odd layer bit line selection switch elements 61 to 64 respectively switch, according to an odd layer bit line selection signal BLs_o0, electrical connection and disconnection between the global bit lines GBL000 to GBL003 for the vertical array planes 0 to 3 and the odd layer bit lines BL_o0 to BL_o3 commonly connected in each of the vertical array planes 0 to 3, through the N-type current limiting elements 90, 92, 94, and 96 and the P-type current limiting elements 91, 93, 95, and 97. Meanwhile, the even layer bit line selection switch elements 65 to 68 respectively switch, according to an even layer bit line selection signal BLs_e0, electrical connection and disconnection between the global bit lines GBL000 to GBL003 for the vertical array planes 0 to 3 and the even layer bit lines BL_e0 to BL_e3 commonly connected in each of the vertical array planes 0 to 3, through the N-type current limiting elements 90, 92, 94, and 96 and the P-type current limiting elements 91, 93, 95, and 97.

According to this structure, each of the vertical array planes 0 to 3 can be formed by placing the memory cells 51 so that their variable resistance elements 10 have the same structure in the Z direction in all memory cell layers. Moreover, in FIG. 19, the even layer bit lines 53b and 53d are commonly connected by separate vias (the even layer bit line via 54 and the odd layer bit line via 55), and these vias are further connected to the global bit line GBL through the bidirectional current limiting circuit 920 and one of the even layer bit line selection switch element 57 and the odd layer bit line selection switch element 58. A multilayer cross point structure according to a hierarchical bit line system is achieved in this way.

FIG. 21 is a circuit diagram showing the memory cell array 100 shown by FIG. 20 and peripheral circuitry of the same. It is to be noted that as shown by the right bottom corner of the figure, for the sake of simplicity, each memory cell formed by a series connection of the variable resistance element 10 and the current steering element 29 is represented by a quadrangle having a white area and a black area.

In FIG. 21, a global bit line decoder and driver circuit 98 is a circuit that supplies a signal for selecting a memory cell 51 to each of the global bit lines GBL000 to GBL003, and selectively drives and controls the global bit lines GBL000 to GBL003.

A current limiting control circuit 99 is a circuit that controls the bidirectional current limiting circuit 920, and activates, when performing a read operation for detecting a resistance state of a selected memory cell, the N-type current limiting elements 90, 92, 94, and 96 and the P-type current limiting elements 91, 93, 95, and 97 so that all of the N-type current limiting elements 90, 92, 94, and 96 and the P-type current limiting elements 91, 93, 95, and 97 are in on-state.

To put it differently, the current limiting control circuit 99 is a circuit that controls the bidirectional current limiting circuit 920, and is a control circuit that causes, when performing a read operation, both a pair of the N-type current limiting elements 90, 92, 94, and 96 and a pair of the P-type current limiting elements 91, 93, 95, and 97 to be in on-state. In the case of a reading mode, too, the current limiting control circuit 99 generates, as output voltages VCMN and VCMP for the nodes CMN and CMP, a sufficiently high voltage VCMN and a sufficiently low voltage VCMP so as to avoid limiting an amount of current for a read pulse.

A sub-bit line selection circuit 73 is a circuit that controls the odd layer bit line selection switch elements 61 to 64 and the even layer bit line selection switch elements 65 to 68, and outputs the even layer bit line selection signal BLs_e0 and the odd layer bit line selection signal BLs_o0 according to address signals A0 to Ax.

A word line decoder circuit 74 is a decoder switching circuit that selectively switches supply of a signal for selecting a memory cell 51 to each of word lines WL00000 to WL00331, according to an address signal Ay. A word line pre-decoder circuit 111 is a pre-decoder circuit that selectively controls supply of pre-decode signals GWL0 to GWL31 according to the address signal Ay. A given word line is selected and controlled so that the given word line is in a predetermined state, depending on the pre-decode signals GWL0 to GWL31 of the word line pre-decoder circuit 111 and a switch selection state of the word line decoder circuit 74.

It is to be noted that the global bit line decoder and driver circuit 98, the sub-bit line selection circuit 73, the word line decoder circuit 74, and the word line pre-decoder circuit 111 constitute a decoder circuit according to this embodiment, that is, a decoder circuit that selects at least one memory cell from the memory cell array 100 by selecting at least one bit line from the bit lines and at least one word line from the word lines.

FIG. 22 is a circuit diagram showing a main part 300 of the cross point variable resistance nonvolatile memory device in this embodiment.

As shown in FIG. 22, in the main part of 300 of an actual cross point variable resistance nonvolatile memory device, a memory cell array 200 is formed by providing the memory cell arrays 100 (each corresponding to one of the vertical array planes) shown by FIG. 20. In the configuration shown by FIG. 20, the memory cell array 100 includes the memory cells corresponding to n bits in the X (bit line) direction and 4 bits in the Y (word line) direction. In the example shown by FIG. 22, a memory cell array block 250 that is obtained by providing p (here p (integer number)=(m/4)) memory cell arrays 100 in the Y direction and arranging the memory cells corresponding to n bits in the X direction and m bits in the Y direction in a matrix is considered as a unit block, and the memory cell array 200 is formed by providing 16 memory cell array blocks 250.

The word line pre-decoder circuit 111 selectively controls supply of a pre-decode signal GWLi (here, i is an integer number from 0 to n−1, where n=32) to the word line decoder circuit 74. A word line decoder circuit 103 (the word line decoder circuit 74 in FIG. 21) selects a given memory cell array block according to a block selection signal BLKj (here, j is an integer number from 0 to 15), and outputs, for the selected memory cell array block, the pre-decode signal GWLi to n word lines. Stated differently, the n word lines of the block selected according to the block selection signal BLKj are directly controlled according to the pre-decode signals GWL0 to GWL31. The details of the configuration are described later with reference to a detail diagram separately.

A global bit line decoder and driver circuit 102 is a circuit that selects a memory cell and supplies, to the global bit lines, a signal for writing and reading. More specifically, the global bit line decoder and driver circuit 102 selects, according to the block selection signal BLKj, a global bit line group (here, global bit lines GBLj0 to GBLj3, where j is from 00 to 15) corresponding to the selected block, and drives and controls each of the selected global bit lines GBLj0 to GBLj3 in a writing mode or a reading mode.

A current limiting control circuit 104 separately generates, to the memory cell array block 250 selected according to the block selection signal BLKj, voltages VCMNj and VCMPj (where j is an integer from 0 to 15) for controlling the bidirectional current limiting circuit 920 according to an operation mode. It is to be noted that VCMNj=0 V and VCMPj=VPoff (VPoff is a voltage with which the P-type current limiting element 91 corresponding to an unselected memory cell array block 250 is turned OFF) are generated and supplied to the unselected memory cell array block 250.

A sub-bit line selection circuit 101 (the sub-bit line selection circuit 73 in FIG. 21) controls, according to address signals A0 to Ax, an even layer bit line selection signal BLs_ek (here, k is an integer number from 0 to (p−1)) and an odd layer bit line selection signal BLs_ok (here, k is an integer number from 0 to (p−1)) for each of the memory cell arrays 100 so that, in the memory cell array 200, an odd layer bit line selection switch element (one of the odd layer bit line selection switch elements 61 to 64 in FIG. 20) or an even layer bit line selection switch element (one of the even layer bit line selection switch elements 65 to 68 in FIG. 20) belonging to a selected given vertical array plane becomes conductive.

FIG. 23 is a circuit diagram showing an entire configuration of a cross point variable resistance nonvolatile memory device 400 in this embodiment. A main part 300 in FIG. 23 corresponds to the configuration shown by FIG. 22.

In FIG. 23, an address input circuit 110 temporarily latches address signals from outside during a high resistance writing cycle, a low resistance writing cycle, or a reading cycle, and outputs the latched address signals to the sub-bit line selection circuit 101, the global bit line decoder and driver circuit 102, the word line pre-decoder circuit 111, the word line decoder circuit 103, and the current limiting control circuit 104.

The unselected word line current source 199 is an example of a first current source according to this embodiment that generates a predetermined constant current (first constant current) when performing a read operation, and applies the predetermined constant current to unselected word lines through the word line pre-decoder circuit 111 and the word line decoder circuit 103.

A control circuit 109 receives input signals, and outputs a signal indicating a state in the high resistance writing cycle, the low resistance writing cycle, the reading cycle, or standby, to each of the decoder circuit according to this embodiment (the sub-bit line selection circuit 101, the global bit line decoder and driver circuit 102, the word line pre-decoder circuit 111, and the word line decoder circuit 103), the current limiting control circuit 104, a write circuit 105, a read circuit 106, and a data input-output circuit 107. The control circuit 109 also outputs a pulse generation trigger signal for high resistance writing, low resistance writing, or reading in the high resistance writing cycle, the low resistance writing cycle, or the reading cycle, to a write pulse generating circuit 108.

In particular, to achieve the unselected word line current application mode according to this embodiment, when the read circuit 106 reads data, the control circuit 109 controls the decoder circuit according to this embodiment, the read circuit 106, and the unselected word line current source 199 so that a first voltage (VSA) for reading is applied to a selected bit line that is a bit line selected by the decoder circuit, a second voltage (GND potential) is applied to a selected word line that is a word line selected by the decoder circuit, and a first constant current (Inswl) is supplied from the first current source (the unselected word line current source 199) to an unselected word line that is a word line not selected by the decoder circuit.

The write pulse generating circuit 108 generates a pulse for a given period (tp_E, tp_P, tp_R) in a high resistance writing time in the high resistance writing cycle, a low resistance writing time in the low resistance writing cycle, or a reading time in the reading cycle, and outputs the generated pulse to the global bit line decoder and driver circuit 102, the word line pre-decoder circuit 111, and the word line decoder circuit 103.

The data input-output circuit 107 is a circuit block that transfers data to and from the outside. In a write operation, the data input-output circuit 107 latches data DQ, and outputs write data to the write circuit 105 until the data input-output circuit 107 receives the next data. In a read operation, the data input-output circuit 107 latches read data from the read circuit 106, and outputs the read data to an external terminal DQ until the data input-output circuit 107 receives the next output data.

The write circuit 105 is a circuit that writes data to a memory cell selected by the global bit line decoder and driver circuit 102 and the word line decoder circuit 103. Upon receiving a data signal from the data input-output circuit 107, the write circuit 105 outputs a write command signal to the global bit line decoder and driver circuit 102, the word line pre-decoder circuit 111, and the current limiting control circuit 104.

The read circuit 106 is the decoder circuit according to this embodiment, that is, a circuit that reads data from a memory cell selected by the sub-bit line selection circuit 101, the global bit line decoder and driver circuit 102, the word line pre-decoder circuit 111, and the word line decoder circuit 103. The read circuit 106 detects a stored data state of the selected memory cell (a resistance state of a variable resistance element included in the memory cell), and outputs a detection result to the data input-output circuit 107 as a data signal. The current detection circuit 196 in FIG. 9 corresponds to the read circuit 106.

The following fully describes, in connection with selection of a word line at the time of reading and application of current and voltage to the word line, (i) a circuit configuration across the unselected word line current source 199, the word line pre-decoder circuit 111, the word line decoder circuit 103, and the word lines and (ii) operations of the circuit, with reference to FIG. 24.

FIG. 24 shows a configuration example of the unselected word line current source 199 that generates a first constant current Inswl determined by a VSA voltage and a predetermined fixed voltage Vic, in which a PMOS transistor 135 is a main element, and has a source terminal connected to a read power source VSA, a gate terminal connected to the predetermined fixed voltage Vic under control of the control circuit 109, and a drain terminal connected to an output terminal of the unselected word line current source 199. The unselected word line current source 199 has the output terminal connected to a node NWS. A PMOS transistor 136 has a source terminal connected to a pre-charge power source VPR when a read operation is performed, a gate terminal connected to a pre-charge signal NPRE, and a drain terminal connected to the node NWS, and functions to set the node NWS at the time of pre-charging during the read operation. The PMOS transistors 135 and 136 also constitute a third switch circuit according to this embodiment, that is, a third switch circuit that selectively connects one of the unselected word line current source 199 and a third voltage (VPR) to the node NWS (i.e., an unselected word line) under control of the control circuit 109.

A buffer circuit 134 selects and outputs a high-voltage-side voltage or a low-voltage-side voltage according to an input signal. The buffer circuit 134 has a terminal for supplying the high-voltage-side voltage connected to the node NWS, a terminal for supplying the low-voltage-side voltage connected to GND (0 v), each of input terminals connected to one of global word line selection signals GWLSi (where i is an integer from 0 to n−1), and each of output terminals connected to one of global word lines GWLi (where i is an integer from 0 to n−1). The word line pre-decoder circuit 111 composed of n (here, n=32) buffer circuits 13 selects and controls a predetermined one of the global word lines GWLi according to a global word line selection signal GWLSi, sets the selected global word line GWLi to a GND voltage (second voltage), and causes unselected global word lines to be in a node NWS state (a state where the third voltage VPR is applied at the time of pre-charging, and the first constant current InswL is applied at the time of sensing). Each of the buffer circuits 134 functions as a second switch circuit according to this embodiment, that is, a second switch circuit that selectively selects one of the second voltage (GND voltage) and the third voltage (VPR) to the selected word line under control of the control circuit 109.

A PMOS transistor 130 has one of a source terminal and a drain terminal connected to one of global word lines WLi (where i is an integer from 0 to n−1), the other of the source terminal and the drain terminal connected to a corresponding word line WL000i, and a gate terminal connected to an output terminal of an inverter (inversion logic circuit) 133. An NMOS transistor 131 has one of a source terminal and a drain terminal connected to one of the global word lines WLi, the other of the source terminal and the drain terminal connected to the corresponding WL000i, and a gate terminal connected to a corresponding block selection signal BLKj. (Here, j is an integer number from 0 to 15.) A CMOS switch circuit 132 is formed by connecting in parallel the PMOS transistor 130 and the NMOS transistor 131, that is, the drain terminal of the PMOS transistor 130 and the source terminal of the NMOS transistor 131, and the source terminal of the PMOS transistor 130 and the drain terminal of the NMOS transistor 131. The CMOS switch circuit 132 is included in a word line selection switch circuit. The word line selection switch circuit 132 is provided to each word line in the memory cell array block 250. (In FIG. 24, the number of word lines in one memory cell array block is n=32, and 32 word line selection switch circuits 132 are provided.) All of n word line selection switch circuits 132 corresponding to one memory cell array block 250 are turned ON when selected according to a block selection signal BLKj corresponding to the memory cell array block 250, and are turned OFF when not selected according to the block selection signal BLKj. The n word line selection switch circuits 132 are provided to each of 16 memory cell array blocks, and constitute the word line decoder circuit 103.

In the case of selecting a given word line in this configuration, a block selection signal BLKj selecting the memory cell array block 250 to which the selected word line belongs is initially in a selection (high) state, and upon receiving the block selection signal BLKj, the word line decoder circuit 103 turns ON all of the 32 word line selection switch circuits corresponding to the selected block. (All of word line selection switch circuits corresponding to unselected blocks other than the selected block are turned OFF.) Moreover, upon reception of a global word line selection signal GWLSn0 (Low state), one selected global word line GWLn0 (n0 is an integer number corresponding to the selected global word line) corresponding to a selected word line in the word line pre-decoder circuit 111 is set to a GND state, and the other 31 unselected global word lines GWLn are set to a voltage state of the node NWS. Upon reception of an NPRE signal indicating a low state, the node NWS is set to a VPR voltage at the time of pre-charging for reading (in the first step), and upon reception of an NPRE signal indicating a high state, the PMOS transistor 136 is turned OFF at the time of sensing for reading (in the second step). Thus, the output current Inswl of the unselected word line current source 199 is set to flow.

It is to be noted that in a memory cell array block 250 of which all of word lines are unselected, all of related word line selection switch circuits are turned OFF, and thus the unselected word lines are in a high impedance (Hi-z) state.

Next, FIG. 25 shows a circuit diagram of a read configuration including a selected memory cell array block 250, the read circuit 106 corresponding to the selected memory cell array block 250 at the time of reading, a bit line system selection circuit including the global bit line decoder and driver circuit 102 and an odd-even layer selection switch element 158, the unselected word line current source 199 for a selected word line system circuit and an unselected word line system circuit, and various switch circuits for supplying a pre-charge voltage at the time of pre-charging.

In FIG. 25, a selected memory cell 30 is selected by a selected bit line BLe1 and a selected word line WL1, a first unselected memory cell 193 is represented by an equivalent circuit including 31 unselected memory cells connected to the selected bit line BLe1, a third unselected memory cell 195 is represented by a circuit including 1023 unselected memory cells connected to the selected word line WL1, and a second unselected memory cell 194 is represented by an equivalent circuit including 31×1023 unselected memory cells connected to unselected word lines and unselected bit lines. In the figure, an equivalent circuit represented by the selected memory cell 30 and a serial architecture of the three unselected memory cells that are included in the memory cell array block 250 is shown as an internal configuration of the memory cell array block 250.

Through the operations of the word line decoder circuit 103 and the word line pre-decoder circuit 111 shown by FIG. 24, a pre-charge voltage (third voltage) VPR is applied to the selected word line at the time of pre-charging (in the first step), and a GND voltage (second voltage) is applied to the selected word line at the time of sensing (in the second step). Through the operations of the word line decoder circuit 103 and the word line pre-decoder circuit 111 shown by FIG. 24, the pre-charge voltage (third voltage) VPR is applied to an unselected word line group (point NW) at the time of pre-charging (in the first step), an unselected word line current (first constant current) Inswl is applied to the unselected word line group (point NW) from the unselected word line current source 199 at the time of sensing (in the second step).

The selected bit line BL_e1 is selectively connected to a node YD by the odd-even layer selection switch element 158 and the global bit line decoder and driver circuit 102 that are selectively turned ON according to an odd-even layer selection signal BLs_o0.

Reference sign 140 indicates a diode-connected PMOS transistor that is an example of a first PMOS transistor included in the read circuit 106, and has a source terminal connected to a VSA power source, and a gate terminal and a drain terminal connected to each other.

Reference sign 146 indicates a switch element that controls connection/disconnection between the drain terminal of the PMOS transistor 140 and the YD node. The switch element 146 connects the drain terminal of the PMOS transistor 140 and the YD node when a control signal NACT indicates Low. Reference sign 145 indicates a switch element that controls connection/disconnection between the pre-charge voltage (third voltage) VPR and the YD node. The switch element 145 connects the pre-charge voltage VPR and the YD node when a control signal NPRE indicates Low. The switch elements 145 and 146 constitute a first switch circuit according to this embodiment, that is, a first switch circuit that selectively connects, to the selected bit line, one of the read circuit 106 and the third voltage for pre-charging prior to reading of data, under control of the control circuit 109.

A PMOS transistor 141 is an example of a second PMOS transistor included in the read circuit 106, and is a PMOS transistor that has a source terminal connected to the VSA power source, a gate terminal connected to the gate terminal of the PMOS transistor 140, and a drain terminal connected to an SEN node. Since the PMOS transistors 140 and 141 are current-mirror-connected, a current having the same amount as a current Iload0 flowing through the PMOS transistor 140 also flows through the PMOS transistor 141.

A PMOS transistor 144 has a source terminal connected to the VSA power source, a gate terminal connected to a VPRM voltage, and a drain terminal connected to a node s0. The PMOS transistor 144 operates as a constant current source that supplies a constant current Iso0 when a predetermined VPRM voltage is applied to the gate terminal.

An NMOS transistor 143 is a diode-connected NMOS transistor that has a source terminal connected to a GND power source, and a gate terminal and a drain terminal connected to each other. The drain terminal is connected to the node s0. An NMOS transistor 142 is an NMOS transistor that is a example of a second power source included in the read circuit 106, and has a source terminal connected to a GND terminal, a gate terminal connected to the gate terminal of the NMOS transistor 143, and a drain terminal connected to the SEN node. Since the NMOS transistors 143 and 142 are current-mirror-connected, a current having the same amount as a current Iso0 flowing through the NMOS transistor 143 also flows through the NMOS transistor 142.

Thus, a voltage state of the SEN node is determined by a magnitude relationship between the mirror current Iload0 of the PMOS transistor 141 and the mirror current Iso0 of the NMOS transistor 142 (actually, a magnitude relationship between a current drive capability of the PMOS transistor 141 determined by the current of the PMOS transistor and a current drive capability of the NMOS transistor 142 determined by the current of the NMOS transistor 143). Stated differently, when the current Iload0 is greater than a predetermined current Iso0 (Iload0>Iso0), a SEN node voltage VSEN becomes close to the VSA, and when the current Iload0 is less than a predetermined current Iso0 (Iload0<Iso0), a SEN node voltage VSEN becomes close to the GND voltage.

Reference sign 148 indicates a differential detection circuit that compares a voltage of a VREF terminal (a second input terminal) and a voltage of the SEN node (a voltage of a first input terminal) to determine which one of the voltages is greater, and outputs the comparison result as a logic signal DOUT. The differential detection circuit 148 outputs DOUT=Low when VSEN>VREF, and DOUT=High when VSEN<VREF.

The read circuit 106 reads data from a memory cell selected by the decoder circuit, and includes the PMOS transistors 140, 141, and 144, the NMOS transistors 142 and 143, the switch elements 145 and 146, and the differential detection circuit 148.

It is to be noted that to set a voltage of a selected bit line and a source voltage VSA of the PMOS transistor 140 at the same level, the PMOS transistor 141 current-mirror-connected to the PMOS transistor 140 may be in a depletion mode.

The following describes a read operation of the read system circuit shown by FIG. 25 under control of the control circuit 109, with reference to a diagram of a reading sequence shown by FIG. 26. The reading sequence shown by FIG. 26 shows two cycles each consisting of pre-charging (the first step) and sensing (the second step).

In the reading sequence shown by FIG. 26, a time t0 to t1 is a pre-charging time (the first step), a time t1 to t2 is a sensing time (the second step), and t0 to t2 represents one cycle for reading. The unselected word line current source 199 constantly generates the current Inswl.

A memory cell array block 0 is selected in this read operation, and thus a block selection signal BLK0 indicates High, and block selection signals BLK 1 to 15 indicate Low.

In the pre-charging time (the first step), according to NPRE=Low and NACT=High, the switch elements 145 and 136 are turned ON, the switch element 146 is turned OFF, all of a selected bit line, a selected word line, and unselected word lines that belong to a selected memory cell array block 250 are set to the pre-charge voltage (third voltage) VPR, under control of the control circuit 109. It is to be noted that all of bit lines and word lines that belong to an unselected memory cell array block 250 are in a high impedance (Hi-z) state.

When a sense state (the second step) starts at time t1, NPRE=High and NACT=Low, the supply of the pre-charge voltage VPR to an unselected word line group is stopped, and only the constant current (first constant current) Inswl is supplied to the unselected word line group, under control of the control circuit 109. Thus, a VPR voltage level of the unselected word lines slightly changes to a voltage level determined by the current Inswl. Here, preferably, the VPR voltage level is set as close as possible to a stable voltage of a selected word line group which is determined by the supply of the constant current Inswl from the unselected word line current source 199 to the unselected word line group at the time of sensing. As above, the third voltage VPR that is supplied to the unselected word lines in the first step (at the time of pre-charging) is set to be substantially equal to a voltage of the unselected word lines which is determined by the supply of the constant current Inswl from the unselected word line current source 199 in the second step (at the time of sensing). Preferably, a difference between the third voltage VPR and the voltage of the unselected word lines determined by the supply of the constant current Inswl from the unselected word line current source 199 is within 10% of the third voltage VPR. This reduces variation in the voltage level of the unselected word lines when the first step (pre-charging) is switched to the second step (sensing), which enables more stable data reading.

In contrast, the pre-charge voltage VPR of a selected global bit line (GBL001 in FIG. 26) changes to the sense voltage (first voltage) VSA, the pre-charge voltage (third voltage) VPR of a selected bit line (BL_e1 in FIG. 26) changes to the sense voltage (first voltage) VSA in response to the state change of the global bit line, and the pre-charge voltage (third voltage) VPR of a selected word line (WL00001 in FIG. 26) changes to the GND voltage (second voltage) 0 V.

In the sense state (second step), since, as described above, the selected bit line voltage and the selected word line voltage become the VSA level (first voltage) and the GND voltage (second voltage), respectively, a cell current flows through the selected memory cell 30 under control of the control circuit 109. A resistance state of the variable resistance element 10 determines whether an amount of current in the selected memory cell 30 is large or small. The amount of the memory cell current is smaller when the variable resistance element 10 is in the high resistance state than when the variable resistance element 10 is in the low resistance state. To put it differently, when the selected memory cell 30 has a higher (lower) resistance value, the selected memory cell 30 has a smaller (larger) amount of current.

In the sense state (second step), the current flows through the selected memory cell 30 as above, and is transferred to the PMOS transistor 140 through the selected global bit line or the YD node. A difference in an amount of current depending on the resistance state of the variable resistance element 10 of the selected memory cell 30 appears almost directly as a difference in an amount of current in the PMOS transistor 140. In other words, when the variable resistance element 10 of the selected memory cell 30 is in the high resistance state, the amount of current in the PMOS transistor 140 is small as the amount of the cell current is small, and conversely when the variable resistance element 10 of the selected memory cell 30 is in the low resistance state, the amount of current in the PMOS transistor 140 is large as the amount of the cell current is large. Thus, detecting and determining an amount of current in the PMOS transistor 140 makes it possible to determine a logic data value stored as indicating whether the variable resistance element 10 of the selected memory cell is in the high resistance state or the low resistance state.

A current that is the same as the current flowing through the PMOS transistor 140 flows through the PMOS transistor 141 current-mirror-connected to the PMOS transistor 140. The SEN node voltage is determined depending on which is larger, an amount of current flowing through the PMOS transistor 141 (amount of current flowing through the PMOS transistor 140) or an amount of current flowing through the NMOS transistor 142 that performs control to maintain a certain current drive capability. When the amount of current in the PMOS transistor 140 is small, the SEN node voltage decreases close to the GND voltage, and when the amount of current in the PMOS transistor 140 is large, the SEN node voltage increases close to the VSA. Thus, when the variable resistance element 10 of the selected memory cell 30 is in the high resistance state (HR), the SEN node voltage decreases close to the GND voltage, and when the variable resistance element 10 of the selected memory cell 30 is in the low resistance state (LR), the SEN node voltage increases close to the VSA.

Setting a voltage of an input terminal VREF of the differential detection circuit 148 to a predetermined voltage such as a voltage half the VSA voltage enables the differential detection circuit 148 to output, to an DOUT terminal, a level of the SEN node voltage as a High/Low logic level. As a result, the resistance state of the variable resistance element 10 of the selected memory cell 30 is converted into the High/Low logic level of the DOUT terminal, and thus it is possible to determine stored data of the variable resistance element 10.

As stated, the stored data of the selected memory cell 30 is detected and determined, and outputted through the DOUT terminal during the time of sensing from t1 to t2.

Since a pre-charging state (first step) starts again at time t2, under control of the control circuit 109, NPRE and NACT changes to NPRE=Low and NACT=High, the switch elements 145 and 136 are turned ON, the switch element 146 is turned OFF, and all of the selected bit line, the selected word line, and the unselected word lines are set again to the precharge voltage VPR.

One cycle consists of pre-charging from t0 to t1 and sensing from t1 to t2. By repeating the cycle while sequentially changing a selected memory cell per cycle, it is possible to read the stored data of each memory cell in the memory cell array.

As stated above, the control circuit 109 controls the first to third switch circuits so that in the first step (at the time of pre-charging), the third voltage VPR is supplied to the selected bit line through the first switch circuit (the switch elements 145 and 146), the third voltage VPR is supplied to the selected word line through the second switch circuit (the buffer circuit 134), and the third voltage VPR is supplied to the unselected word lines through the third switch circuit (the PMOS transistors 135 and 136). In contrast, the control circuit 109 controls the first to third switch circuits so that in the second step (at the time of sensing), the read circuit 106 is connected to the selected bit line through the first switch circuit (the switch elements 145 and 146), the second voltage (the GND voltage) is connected to the selected word line through the second switch circuit (the buffer circuit 134), and the unselected word line current source 199 is connected to the unselected word lines through the third switch circuit (the PMOS transistors 135 and 136).

As described above, according to this embodiment, the cross point variable resistance nonvolatile memory device 400 that is capable of applying the predetermined current to the unselected word line group of the memory cell array block to which the selected memory cell belongs increases the read margin for the written data at the time of reading, to enable the stable reading.

Embodiment 2

FIG. 27 is a cross section diagram of memory cells according to Embodiment 2 of the present invention when memory cells 51 used for a cross point memory cell array are stacked to have a four-layer structure. (The memory cells 51 in each layer have the same structure as in FIG. 2 or FIG. 3, and here the memory cells 51 have the same structure as in FIG. 2 for the sake of simplicity.)

In FIG. 27, each of the memory cells 51 is a 1-bit memory cell including a variable resistance element 10 and a current steering element 29 that are connected in series with each other, and the memory cells 51 are vertically stacked in four layers. In the four-layer structure, a first layer memory cell has a lower terminal connected to a bit line 71a and an upper terminal connected to a word line 70a, a second layer memory cell has a lower terminal connected to the word line 70a and an upper terminal connected to a bit line 71b, a third layer memory cell has a lower terminal connected to the bit line 71b and an upper terminal connected to a word line 70b, and a fourth layer memory cell has a lower terminal connected to the word line 70b and an upper terminal connected to a bit line 71c.

In other words, the word line 70a is provided between the first layer memory cell and the second layer memory cell, and is connected to the upper terminal of the first layer memory cell and the lower terminal of the second layer memory cell, to form a shared structure. Likewise, the bit line 71b is provided between the second layer memory cell and the third layer memory cell, and is connected to the upper terminal of the second layer memory cell and the lower terminal of the third layer memory cell, to form a shared structure. Furthermore, similarly, the word line 70b is provided between the third layer memory cell and the fourth layer memory cell, and is connected to the upper terminal of the third layer memory cell and the lower terminal of the fourth layer memory cell, to form a shared structure.

It is to be noted that, in FIG. 27, a current steering element 29 and the variable resistance element 10 may be vertically reversed with each other.

FIG. 28 is a diagram showing a part (one vertical array plane) of the cross point variable resistance nonvolatile memory device in this embodiment. A cross section structure of a multilayer cross point memory cell array in which memory cells are stacked in eight layers in the same pattern as in FIG. 27 as viewed from a word line direction, and a circuit structure provided below the multilayer cross point memory cell array are shown by FIG. 28.

Each memory cell 51 is placed at a cross point of a first layer bit line 53a comprising a wiring material such as aluminum and extending in a direction (the X direction) horizontal to the plane of paper and a first layer word line 52a comprising a wiring material such as aluminum and extending in a direction (the Y direction not shown) perpendicular to the plane of paper. Memory cells 51 corresponding to n bits are arranged above the first layer bit line 53a along the X direction, constituting first layer memory cells 51a.

In a layer above (the Z direction) the first layer memory cells 51a, each memory cell 51 is placed at a cross point of a first layer word line 52a and a second layer bit line 53b comprising a wiring material such as aluminum and extending in the X direction horizontal to the plane of paper, with the first layer word line 52a being below the memory cell 51 this time. Memory cells 51 corresponding to n bits are arranged above the second layer bit line 53b along the X direction, constituting second layer memory cells 51b. It is to be noted that the Z direction is a layer stacking direction.

Likewise, in a manner that a word line or a bit line is shared, a third layer memory cell 51c is placed at a cross point of a second layer bit line 53b and a second layer word line 52b, a fourth layer memory cell 51d is placed at a cross point of the second layer word line 52b and a third layer bit line 53c, a fifth layer memory cell 51e is placed at a cross point of the third layer bit line 53c and a third layer word line 52c, a sixth layer memory cell 51f is placed at a cross point of the third layer word line 52c and a fourth layer bit line 53d, a seventh memory cell 51g is placed at a cross point of the fourth layer bit line 53d and a fourth layer word line 52d, and an eighth memory cell 51h is placed at a cross point of the fourth layer word line 52d and a fifth layer bit line 53e. A three-dimensional memory cell array in which the memory cells 51 are stacked in eight layers is formed in this way.

Thus, each memory cell 51 is placed at a different one of the cross points of (1) the bit lines 53a to 53e extending in the X direction and formed in layers and (2) the first layer word line 52a extending in the Y direction and formed in a layer between the first layer bit line 53a and the second layer bit line 53b, the second layer word line 52b formed in a layer between the second layer bit line 53b and the third layer bit line 53c, the third layer word line 52c formed in a layer between the third layer bit line 53c and the fourth layer bit line 53d, and the fourth layer word line 52d formed in a layer between the fourth layer bit line 53d and the fifth layer bit line 53e, so as to be provided between the corresponding bit line and word line. Here, a memory cell placed at a cross point of a bit line and a word line above the bit line is referred to as an odd layer (first, third, fifth, or seventh layer) memory cell, and a memory cell placed at a cross point of a bit line and a word line below the bit line is referred to as an even layer (second, fourth, sixth, or eighth layer) memory cell.

The first layer bit line 53a, the third layer bit line 53c, and the fifth layer bit line 53e are commonly connected by an odd layer bit line via 55 that is an example of the second via, while the second layer bit line 53b and the fourth layer bit line 53d are commonly connected by an even layer bit line via 54 that is an example of the first via. Since memory cell groups of adjacent layers in the Z direction share a bit line or a word line in this way, a multilayer cross point memory can be produced with a minimum number of wiring layers, which contributes to a lower cost.

This embodiment has a feature that, in all layers from the first layer memory cells 51a to the second layer memory cells Sib, the variable resistance element 10 in each memory cell 51 can be formed in the same manufacturing condition and structure in the Z direction (e.g., in all layers the variable resistance element 10 can be formed by stacking a second electrode 21, a first variable resistance layer 13, a second variable resistance layer 12, and a third electrode 11 in this order from bottom to top). Hence, each memory cell of the same structure can be manufactured regardless of whether the memory cell belongs to an odd layer or an even layer. In other words, the variable resistance element 10 in each even layer memory cell and the variable resistance element 10 in each odd layer memory cell are positioned in the same orientation in the Z direction.

The even layer bit line via (even layer BL via) 54 is connected to one of a drain and a source of an even layer bit line selection switch element 57 that is an example of the first bit line selection switch element including an NMOS transistor, while the odd layer bit line via (odd layer BL via) 55 is connected to one of a drain and a source of an odd layer bit line selection switch element 58 that is an example of the second bit line selection switch element including an NMOS transistor. The other of the drain and the source of the even layer bit line selection switch element 57 and the other of the drain and the source of the odd layer bit line selection switch element 58 are commonly connected to a common contact (GBLI). A gate of the even layer bit line selection switch element 57 is connected to an even layer bit line selection signal line, while a gate of the odd layer bit line selection switch element 58 is connected to an odd layer bit line selection signal line.

The common contact GBLI is connected to one of a drain and a source of an N-type current limiting element 90 including an NMOS transistor, and also connected to one of a drain and a source of a P-type current limiting element 91 including a PMOS transistor. The other of the drain and the source of the N-type current limiting element 90 is connected to a global bit line (GBL), and the other of the drain and the source of the P-type current limiting element 91 is also connected to the global bit line (GBL). That is, the N-type current limiting element 90 and the P-type current limiting element 91 are connected in parallel with each other, and constitute a bidirectional current limiting circuit 920 that limits each bidirectional current flowing between the global bit line (GBL) and each of the even layer bit line selection switch element 57 and the odd layer bit line selection switch element 58.

A gate of the N-type current limiting element 90 is connected to a signal line that is connected to a node CMN, and a gate of the P-type current limiting element 91 is connected to a signal line that is connected to a node CMP. Since the present invention is a technique relating to reading, and the N-type current limiting element 90 and the P-type current limiting element 91 are always in on-state in a reading mode, voltages applied from the node CMP and the node CMN to the gates are 0 V and VSA, respectively. When performing a write operation, the N-type current limiting element 90 and the P-type current limiting element 91 function as a current limiting element.

It is to be noted that a group having a structure obtained by slicing in a direction in which the bit lines 53a to 53e shown by FIG. 28 are aligned is referred to as a vertical array plane. In detail, XZ planes that each correspond to a different one of bit line groups each of which has bit lines aligned in the Z direction which is a layer stacking direction, that share word lines perpendicularly passing through the XZ planes, and that are aligned in the Y direction are each referred to as a vertical array plane.

FIG. 29 is a diagram showing a structure in which four vertical array planes are arranged face to face.

In FIG. 29, the X direction is a direction in which bit lines extend, the Y direction is a direction in which word lines extend, and the Z direction is a direction in which the bit lines or the word lines are stacked in layers.

In FIG. 29, bit lines (BL) 53 extend in the X direction and are formed in layers (five layers in FIG. 29). Word lines (WL) 52 extend in the Y direction and are formed in each of layers (four layers in FIG. 29) between the bit lines. In a memory cell array 100, each memory cell (MC) 51 is placed at a different one of cross points of the bit lines 53 and the word lines 52 so as to be provided between the corresponding bit line and word line. It is to be noted that a part of the memory cells 51 and a part of the word lines 52 are not shown for the sake of simplicity.

Each of vertical array planes 0 to 3 that corresponds to a different one of bit line groups each composed of bit lines BL arranged in layers in the Z direction includes memory cells 51 placed between the bit lines BL and word lines WL. The vertical array planes 0 to 3 share the word lines WL. In the example shown in FIG. 29, the number of memory cells 51 in the X direction is 32 (n=32 in FIG. 11) and the number of memory cells 51 in the Z direction is 8, in each of the vertical array planes 0 to 3. The memory cell array 100 is composed of the four vertical array planes 0 to 3 aligned in the Y direction.

It is to be noted that the number of memory cells in each vertical array plane and the number of vertical array planes in the Y direction are not limited to such.

In each of the vertical array planes 0 to 3, even layer bit lines BL are commonly connected by the even layer bit line via 54 in FIG. 28 (BL_e0 to BL_e3), and odd layer bit lines BL are commonly connected by the odd layer bit line via 55 in FIG. 28 (BL_o0 to BL_o3).

Moreover, global bit lines GBL000 to GBL003 respectively corresponding to the vertical array planes 0 to 3 extend in the Y direction. Furthermore, odd layer bit line selection switch elements 61 to 64 and even layer bit line selection switch elements 65 to 68 are respectively provided for the vertical array planes 0 to 3. In FIG. 29, the odd layer bit line selection switch elements 61 to 64 and the even layer bit line selection switch elements 65 to 68 each include an NMOS transistor. In addition, the odd layer bit line selection switch elements 61 to 64 and the even layer bit line selection switch elements 65 to 68 corresponding to N-type current limiting elements 90, 92, 94, and 96 each including an NMOS transistor and P-type current limiting elements 91, 93, 95, and 97 each including a PMOS transistor are respectively connected to the global bit lines GBL000 to GBL003 corresponding to the N-type current limiting elements 90, 92, 94, and 96 and the P-type current limiting elements 91, 93, 95, and 97, each at a diffusion layer terminal of one of a drain and a source of the corresponding pair of the odd layer bit line selection switch elements 61 to 64 and the even layer bit line selection switch elements 65 to 68. Gate terminals of the N-type current limiting elements 90, 92, 94, and 96 are commonly connected to the node CMN for a control voltage, and gate terminals of the P-type current limiting elements 91, 93, 95, and 97 are commonly connected to the node CMP for a control voltage. The voltage of the node CMN and the voltage of the node CMP can be arbitrarily set according to an amount of current to be limited.

The odd layer bit line selection switch elements 61 to 64 respectively switch, according to an odd layer bit line selection signal BLs_o0, electrical connection and disconnection between the global bit lines GBL000 to GBL003 for the vertical array planes 0 to 3 and the odd layer bit lines BL_o0 to BL_o3 commonly connected in each of the vertical array planes 0 to 3, through the N-type current limiting elements 90, 92, 94, and 96 and the P-type current limiting elements 91, 93, 95, and 97. Meanwhile, the even layer bit line selection switch elements 65 to 68 respectively switch, according to an even layer bit line selection signal BLs_e0, electrical connection and disconnection between the global bit lines GBL000 to GBL003 for the vertical array planes 0 to 3 and the even layer bit lines BL_e0 to BL_e3 commonly connected in each of the vertical array planes 0 to 3, through the N-type current limiting elements 90, 92, 94, and 96 and the P-type current limiting elements 91, 93, 95, and 97.

According to this structure, each of the vertical array planes 0 to 3 can be formed by placing the memory cells 51 so that their variable resistance elements 10 have the same structure in the Z direction in all memory cell layers. Moreover, in FIG. 28, the even layer bit lines 53b and 53d are commonly connected by separate vias (the even layer bit line via 54 and the odd layer bit line via 55), and these vias are further connected to the global bit line GBL through the bidirectional current limiting circuit 920 and one of the even layer bit line selection switch element 57 and the odd layer bit line selection switch element 58. A multilayer cross point structure according to a hierarchical bit line system is achieved in this way.

The following fully describes, in connection with selection of a word line at the time of reading a multilayer cross point memory cell array in which memory cells are stacked in eight layers and application of current and voltage to the word line, (i) a circuit configuration across the unselected word line current source 199, a word line pre-decoder circuit 111, a word line decoder circuit 103, and word lines and (ii) operations of the circuit, with reference to FIG. 30.

FIG. 30 shows a configuration example of the unselected word line current source 199 that generates a constant current Inswl determined by a VSA voltage and a predetermined fixed voltage Vic, in which a PMOS transistor 135 is a main element, and has a source terminal connected to a read power source VSA, a gate terminal connected to the predetermined fixed voltage Vic under control of the control circuit 109, and a drain terminal connected to an output terminal of the unselected word line current source 199. The unselected word line current source 199 has the output terminal connected to a node NWS. A PMOS transistor 136 has a source terminal connected to a pre-charge power source VPR when a read operation is performed, a gate terminal connected to a pre-charge signal NPRE, and a drain terminal connected to the node NWS, and functions to set the node NWS at the time of pre-charging during the read operation.

A buffer circuit 134 selects and outputs a high-voltage-side voltage or a low-voltage-side voltage according to an input signal. The buffer circuit 134 has a terminal for supplying the high-voltage-side voltage connected to the node NWS, a terminal for supplying the low-voltage-side voltage connected to a GND terminal (0 V), each of input terminals connected to one of word line selection signals GWLSgi (where g is an integer number from 0 to l−1, and i is an integer number from 00 to n−1. More specifically, according to a memory cell array in which word lines are stacked in l layers (here l=4), g denotes a layer number in the Z direction, and i denotes a layout number, in the X direction, expressed in a two-digit number.), and each of output terminals connected to one of global word lines GWLgi (where g is an integer umber 0 to l−1, and i is an integer number from 00 to n−1). A word line pre-decoder circuit 111 that includes l×n buffer circuits 134 selects and controls, as a selected global word line, a predetermined global word line GWLln according to the global word line selection signal GWLSgi. In other words, one of the global word line selection signals GWLSgi is set to Low level, and the other global word line selection signals GWLSgi are set to High level. The selected global word line GWLsgi is set to the GND voltage, and the other unselected global word lines GWLsgi are connected to the unselected word line current source 199.

A word line selection switch circuit 132 is a CMOS word line selection switch circuit that (i) is formed by connecting in parallel the PMOS transistor 130 and the NMOS transistor 131, that is, the drain terminal of the PMOS transistor 130 and the source terminal of the NMOS transistor 131, and the source terminal of the PMOS transistor 130 and the drain terminal of the NMOS transistor 131, and (ii) controls, using each gate terminal, drain-source conduction/non-conduction. An inverter 133 receives a block selection signal BLKj (where j is an integer number from 0 to 15), and outputs an inversion signal of the block selection signal BLKj. The PMOS transistor 130 has the gate terminal connected to an output terminal of the inverter 133, and the NMOS transistor 131 has the gate terminal connected to a corresponding block selection signal BLKj. The word line decoder circuit 103 that controls electrical connection between word lines and global word lines on a memory cell array block basis is formed by providing the word line selection switch circuit 132 is provided to each word line.

The word line selection switch circuit 132 is present on each word line in the memory cell array block 250. (In FIG. 30, since the number of word lines in one memory cell array block is n×l=32 lines×4 layers=128 lines, 128 word line selection switch circuits 132 are present.) All the 4×32 word line selection switch circuits 132 corresponding to the memory cell array block 250 are turned ON when the memory cell array block 250 is selected according to the block selection signal BLKj selecting the memory cell array block 250, and are turned OFF when the memory cell array block 250 is not selected. The 4×32 word line selection switch circuits 132 are present for each of 16 memory cell array blocks, and constitute the word line decoder circuit 103.

According to this configuration, when any word line is selected, a block selection signal BLKj selecting one memory cell array block to which the selected word line belongs is outputted (High state), and upon reception of the block selection signal BLKj, the word line decoder circuit 103 turns ON all the 4×32 word line selection switches corresponding to selected one block. In contrast, all the 4×32 word line selection switches corresponding to unselected blocks other than the selected block are turned OFF. Moreover, upon reception of a global word line selection signal GWLn0 (Low state), one selected global word line GWLn0 (n0 is an integer number corresponding to the selected global word line) corresponding to a selected word line in the word line pre-decoder circuit 111 is set to a GND state, and the other 4×31 unselected global word lines GWLn are connected to the node NWS. Upon reception of an NPRE signal indicating Low state, the node NWS is set to a VPR voltage at the time of pre-charging for reading (in the first step), and upon reception of an NPRE signal indicating High state, the PMOS transistor 136 is turned OFF at the time of sensing for reading (in the second step). Thus, only an output current Inswl of the unselected word line current source 199 is set to be applied.

It is to be noted that in the memory cell array block 250 of which all of the word lines are unselected, all of related word line selection switch circuits 132 in the word line decoder circuit 103 are turned OFF, and thus the unselected word lines are in a high impedance (Hi-z) state.

As with the above memory cell array, it is possible to operate a multilayer cross point memory cell array including word lines in layers, in the same manner as a single-layer word line structure, by providing, in the multilayer cross point memory cell array, a word line pre-decoder circuit or a word line decoder circuit corresponding to the plural-layer word line structure. To put it differently, application of the reading sequence described for the single-layer word line structure in Embodiment 1 enables reading of the multilayer cross point memory cell array including word lines in layers.

As described above, according to this embodiment, it is possible to provide the cross point variable resistance nonvolatile memory device that is capable of applying, in the at least two-layer cross point memory cell array, the predetermined current to the unselected word line group of the memory cell array block to which the selected memory cell belongs, and such a nonvolatile memory device increases the read margin for the written data at the time of reading, to enable the stable reading.

Although the cross point variable resistance nonvolatile memory device according to the present invention is described based on Embodiments 1 and 2, the present invention is not limited to such embodiments. Modifications resulting from various modifications to the respective embodiments that can be conceived by those skilled in the art and modifications realized by arbitrarily combining the constituent elements of the respective embodiments without materially departing from the teachings of the present invention are intended to be included in the scope of the present invention.

For instance, the present invention is realized not only as the cross point variable resistance nonvolatile memory device but also as a method of reading performed by a cross point variable resistance nonvolatile memory device.

More specifically, according to one aspect of the present invention, a method of reading performed by a cross point variable resistance nonvolatile memory device 400 having a cross point memory cell array 200 having memory cells each of which includes a variable resistance element 10 and a bidirectional current steering element 29 and is placed at a different one of cross points of a plurality of bit lines extending in an X direction and a plurality of word lines extending in a Y direction is a method of reading data from the cross point variable resistance nonvolatile memory device 400 under control of a control circuit 109, the resistance element 10 reversibly changing between at least two states including a low resistance state and a high resistance state when voltages of different polarities are applied to the variable resistance element, and the bidirectional current steering element 29 being connected in series with the variable resistance element and having nonlinear current-voltage characteristics.

The method of reading includes: selecting at least one of the memory cells from the memory cell array 200 by selecting at least one of the bit lines and at least one of the word lines, the selecting being performed by a word line decoder circuit 103 or the like; reading data from the selected memory cell, the reading being performed by a read circuit 106; performing control so that when the data is read from the selected memory cell, a first voltage for reading is applied to a selected bit line that is one of the bit lines which is selected in the selecting, a second voltage is applied to a selected word line that is one of the word lines which is selected in the selecting, and a first constant current is supplied to an unselected word line that is, among the word lines, a word line not selected in the selecting, the performing being performed by the control circuit 109.

With this method, not the constant voltage but the constant current is applied to the unselected word line, that is, the unselected word line current application mode is employed. This mode allows the cross point variable nonvolatile memory device 400 using the memory cells having sensitive current-voltage characteristics to increase the actual read margin in consideration of the variation in the applied electrical signal, to achieve stable read characteristics.

Moreover, the variation in current applied to the unselected word line is smaller in such an unselected word line current application mode than in the conventional constant voltage application mode, and thus the problem that the change of the current flowing into the unselected word line via unselected cells causes the electromagnetic nose (EMI) can be solved to enable stable operations.

Here, in the applying, the first voltage and the first constant current may be generated by the same power source that supplies a predetermined voltage at least when the data is read. With this, the unselected word line current application mode according to the present invention can be easily achieved.

The method of reading may further include: selectively applying, to the selected bit line, the first voltage or a third voltage for pre-charging prior to reading of data, the selectively applying to the selected bit line being performed by the first switch circuit; selectively applying, to the selected word line, the second voltage or the third voltage, the selectively applying to the selected word line being performed by the second switch circuit; and selectively applying, to the unselected word line, the first constant current or the third voltage, the selectively applying to the unselected word line being performed by the third switch circuit.

More specifically, in the applying, in a first step, preferably, operations in the selectively applying to the selected bit line, the selectively applying to the selected bit line, and the selectively applying to the unselected word line are controlled so that the third voltage is supplied to the selected bit line in the selectively applying to the selected bit line, to the selected bit line in the selectively applying to the selected bit line, and to the unselected word line in the selectively applying to the unselected word line, and in a second step, operations in the selectively applying to the selected bit line, the selectively applying to the selected bit line, and the selectively applying to the unselected word line are controlled so that the first voltage is supplied to the selected bit line in the selectively applying to the selected bit line, the second voltage is supplied to the selected word line in the selectively applying to the selected word line, and the first constant current is supplied to the unselected word line in the selectively applying to the unselected word line. With this, the pre-charging prior to the reading of data is achieved, which makes more reliable data reading possible.

It is to be noted that, preferably, the third voltage, which is supplied to the unselected word line in the first step, is substantially equal to a voltage, of the unselected word line, which is dependent on a current supplied by the first current source in the second step. This reduces variation in the voltage level of the unselected word line when the first step is switched to the second step, which enables more stable data reading.

Moreover, the selecting may include: selecting a predetermined word line from among word lines of memory cell arrays, the selecting of a predetermined word line being performed by the word line decoder circuit 103; and supplying a voltage or a current to the word line selected in the selecting of a predetermined word line, the supplying of a voltage being performed by the word line pre-decoder circuit 111. With this, the constant current is applied from the first current source to the unselected word line through the third switch circuit and the word line pre-decoder circuit, and the unselected word line current application mode is easily achieved.

Here, in the reading, preferably, the data is read using a first PMOS transistor, a second PMOS transistor, a second current source that supplies a second constant current, and a differential detection circuit 148. With this, a data read mode in which a resistance state of a variable resistance element in a memory cell is detected by application of a current is achieved.

Furthermore, the method of reading, wherein in the case where a memory cell placed at a cross point of a bit line and a word line above the bit line is an odd layer memory cell, a memory cell placed at a cross point of a bit line and a word line below the bit line is an even layer memory cell, and XZ planes which are formed for respective bit line groups arranged in a Z direction and are aligned in the Y direction are vertical array planes 0 to 3, each of the bit line groups being composed of the bit lines, and the Z direction being a direction in which layers are stacked: the vertical array planes 0 to 3 share the word lines that perpendicularly pass through each of the vertical array planes 0 to 3; and in each of the vertical array planes 0 to 3, bit lines in all even layers of the layers are commonly connected to a first via extending in the Z direction, and bit lines in all odd layers of the layers are commonly connected to a second via extending in the Z direction, the cross point variable resistance nonvolatile memory device 400 further includes: a plurality of global bit lines GBLs each of which is provided for a different one of the vertical array planes; a plurality of first bit line selection switch elements each of which is provided for a different one of the vertical array planes 0 to 3, and has one end connected to the first via; a plurality of second bit line selection switch elements each of which is provided for a different one of the vertical array planes 0 to 3, and has one end connected to the second via; a bidirectional current limiting circuit 920 that is provided for each of the vertical array planes 0 to 3, is provided between the global bit line GBL corresponding to the vertical array plane and each of (1) other ends of the first bit line selection switch elements corresponding to the vertical array planes and (2) other ends of the second bit line selection switch elements corresponding to the vertical array planes, and limits a bidirectional current flowing between the global bit line GBL and each of the first bit line selection switch elements and the second bit line selection switch elements; and a current limiting control circuit 104 that controls the bidirectional current limiting circuit 920, the selecting may include: providing, to the global bit lines GBLs, a signal for selecting memory cells and writing into or reading from the selected memory cells, the providing to the global bit lines GBLs being performed by the global bit line decoder and driver circuit 102; and providing, to the word lines, a signal for selecting memory cells and writing into or reading from the selected memory cells, the providing to the word lines being performed by word line decoder circuit 103, and in the reading, data is read from one of the memory cells which is selected in the providing to the global bit lines and the providing to the word lines.

As a result, it is possible to apply, also for the multilayer cross point memory cell array suitable for a large memory capacity, the unselected word line current application mode according to the present invention.

INDUSTRIAL APPLICABILITY

The present invention realizes, as a cross point variable resistance nonvolatile memory device, a nonvolatile memory device that increases, especially when a read operation is performed, a read margin for written data by a simple configuration of applying a predetermined current to an unselected word line group of a memory cell array block to which a selected memory cell belongs, so as to enable stable reading. Therefore, the present invention is useful as a nonvolatile memory device having low-cost and stable memory cell reading characteristics, and a storage device of various electronic devices as represented by mobile terminals.

REFERENCE SIGNS LIST

1, 100, 200 Memory cell array
10 Variable resistance element
11 Upper electrode (third electrode)
12 Second variable resistance layer (second transition metal oxide layer, second tantalum oxide layer, second hafnium oxide layer, second zirconium oxide layer)
13 First variable resistance layer (first transition metal oxide layer, first tantalum oxide layer, first hafnium oxide layer, first zirconium oxide layer)
14 Lower electrode
21 Upper electrode (second electrode)
22 Current steering layer
23 Lower electrode (first electrode)
24 Word line
25 Bit line
26 to 28 Via
29 Current steering element
30 Selected memory cell
51 Memory cell
52, 52a to 52d Word line
53, 53a to 53e Bit line
54 Even layer bit line via
55 Odd layer bit line via
57, 65 to 68 Even layer bit line selection switch element
58, 61 to 64 Odd layer bit line selection switch element
70, 70a, 70b Upper wire (word line)

71, 71a, 71b, 71c Lower wire (bit line)
73, 101 Sub-bit line selection circuit
74, 103 Word line decoder circuit
90, 92, 94, 96 N-type current limiting element
91, 93, 95, 97 P-type current limiting element
98, 102 Global bit line decoder and driver circuit
99, 104 Current limiting control circuit
105 Write circuit
106 Read circuit
107 Data input-output circuit
108 Pulse generation circuit
109 Control circuit
110 Address input circuit
111 Word line pre-decoder circuit
130, 135, 136, 140, 141, 144 PMOS transistor
131, 142, 143 NMOS transistor
132 Word line selection switch circuit (CMOS switch circuit)
133 Inverter (inversion logic circuit)
134 Buffer circuit
145, 146 Switch element
148 Differential detection circuit
158 Odd layer selection switch element
190 First unselected memory cell group
191 Second unselected memory cell group
192 Third unselected memory cell group
193 First unselected memory cell
194 Second unselected memory cell
195 Third unselected memory cell
196 Current detection circuit
197 Sense power source
198 Unselected word line power source
199 Unselected word line current source
250 Memory cell array block
300 Main part
400 Cross point variable resistance nonvolatile memory device
920 Bidirectional current limiting circuit

The invention claimed is:

1. A cross point variable resistance nonvolatile memory device comprising:
a cross point memory cell array having a plurality of memory cells each of which includes a variable resistance element and a bidirectional current steering element and is placed at a different one of cross points of a plurality of bit lines extending in an X direction and a plurality of word lines extending in a Y direction, the variable resistance element reversibly changing between at least two states including a low resistance state and a high resistance state when voltages of different polarities are applied to the variable resistance element, and the bidirectional current steering element being connected in series with the variable resistance element and having nonlinear current-voltage characteristics;
a decoder circuit that selects at least one of the memory cells from the memory cell array by selecting at least one of the bit lines and at least one of the word lines;
a read circuit that reads data from the selected memory cell;
a first current source that supplies a first constant current; and
a control circuit that controls the reading of the data from the selected memory cell,
wherein the control circuit controls the decoder circuit, the read circuit, and the first current source so that when the read circuit reads data, a first voltage for reading outputted from the read circuit is applied to a selected bit line that is one of the bit lines which is selected by the decoder circuit, a second voltage is applied to a selected word line that is one of the word lines which is selected by the decoder circuit, and the first constant current is supplied to an unselected word line that is, among the word lines, a word line not selected by the decoder circuit.

2. The cross point variable resistance nonvolatile memory device according to claim 1,
wherein the read circuit and the first current source are connected to the same power source that supplies a predetermined voltage at least when the data is read.

3. The cross point variable resistance nonvolatile memory device according to claim 1, further comprising:
a first switch circuit that selectively applies, to the selected bit line, the first voltage or a third voltage for pre-charging prior to reading of data;
a second switch circuit that selectively applies, to the selected word line, the second voltage or the third voltage; and
a third switch circuit that selectively applies, to the unselected word line, the first constant current or the third voltage.

4. The cross point variable resistance nonvolatile memory device according to claim 3,
wherein in a first step, the control circuit controls the first to third switch circuits so that the third voltage is supplied to the selected bit line through the first switch circuit, to the selected word line through the second switch circuit, and to the unselected word line through the third switch circuit, and
in a second step, the control circuit controls the first to third switch circuits so that the first voltage is supplied to the selected bit line through the first switch circuit, the second voltage is supplied to the selected word line through the second switch circuit, and the first constant current is supplied to the unselected word line through the third switch circuit.

5. The cross point variable resistance nonvolatile memory device according to claim 4,
wherein the third voltage, which is supplied to the unselected word line in the first step, is substantially equal to a voltage, of the unselected word line, which is dependent on a current supplied by the first current source in the second step.

6. The cross point variable resistance nonvolatile memory device according to claim 3, comprising
a plurality of the memory cell arrays,
wherein the decoder circuit includes:
a word line decoder circuit that selects a predetermined word line from among word lines of the memory cell arrays; and
a word line pre-decoder circuit that controls supply of a voltage or a current to the word line selected by the word line decoder circuit,
the first current source supplies the first constant current to the word line pre-decoder circuit, and
the word line pre-decoder circuit is supplied with the first constant current or the third voltage through the third switch circuit.

7. The cross point variable resistance nonvolatile memory device according to claim 1,
wherein the read circuit includes: a first PMOS transistor, a second PMOS transistor, a second current source that supplies a second constant current; and a differential detection circuit, the differential detection circuit has a first input terminal and a second input terminal, compares a voltage at the first input terminal and a reference voltage connected to the second input terminal, and outputs a result of the comparison as a logic signal, the first PMOS transistor has a source terminal connected to the first voltage, a drain terminal connected to the selected bit line through the first switch circuit, and a gate terminal connected to the drain terminal, the second PMOS transistor has a source terminal connected to the first voltage, a gate terminal connected to the gate terminal of the first PMOS transistor, and a drain terminal connected to one of terminals of the second current source, the second current source has the other terminal connected to a GND voltage, and the first input terminal of the differential detection circuit is connected to the drain terminal of the second PMOS transistor.

8. The cross point variable resistance nonvolatile memory device according to claim 1, wherein in the case where a memory cell placed at a cross point of a bit line and a word line above the bit line is an odd layer memory cell, a memory cell placed at a cross point of a bit line and a word line below the bit line is an even layer memory cell, and XZ planes which are formed for respective bit line groups arranged in a Z direction and are aligned in the Y direction are vertical array planes, each of the bit line groups being composed of the bit lines, and the Z direction being a direction in which layers are stacked:

the vertical array planes share the word lines that perpendicularly pass through each of the vertical array planes; and in each of the vertical array planes, bit lines in all even layers of the layers are commonly connected to a first via extending in the Z direction, and bit lines in all odd layers of the layers are commonly connected to a second via extending in the Z direction, the cross point variable resistance nonvolatile memory device further comprising:

a plurality of global bit lines each of which is provided for a different one of the vertical array planes;

a plurality of first bit line selection switch elements each of which is provided for a different one of the vertical array planes and has one end connected to the first via;

a plurality of second bit line selection switch elements each of which is provided for a different one of the vertical array planes and has one end connected to the second via;

a bidirectional current limiting circuit that is provided for each of the vertical array planes, is provided between the global bit line corresponding to the vertical array plane and each of (1) other ends of the first bit line selection switch elements corresponding to the vertical array planes and (2) other ends of the second bit line selection switch elements corresponding to the vertical array planes, and limits a bidirectional current flowing between the global bit line and each of the first bit line selection switch elements and the second bit line selection switch elements; and a current limiting control circuit that controls the bidirectional current limiting circuit, the decoder circuit includes:

a global bit line decoder and driver circuit that provides, to the global bit lines, a signal for selecting memory cells and writing into or reading from the selected memory cells; and a word line decoder circuit and a word line pre-decoder circuit that provide, to the word lines, a signal for selecting memory cells and writing into or reading from the selected memory cells, and the read circuit reads data from one of the memory cells which is selected by the global bit line decoder and driver circuit, and the word line decoder circuit and the word line pre-decoder circuit.

9. A method of reading performed by a cross point memory cell array that has a plurality of memory cells each of which includes a variable resistance element and a bidirectional current steering element and is placed at a different one of cross points of a plurality of bit lines extending in an X direction and a plurality of word lines extending in a Y direction, the variable resistance element reversibly changing between at least two states including a low resistance state and a high resistance state when voltages of different polarities are applied to the variable resistance element, the bidirectional current steering element being connected in series with the variable resistance element and having nonlinear current-voltage characteristics, and the method comprising:

selecting at least one of the memory cells from the memory cell array by selecting at least one of the bit lines and at least one of the word lines;

reading data from the selected memory cell; and applying a first voltage for reading to a selected bit line that is one of the bit lines which is selected in the selecting, applying a second voltage to a selected word line that is one of the word lines which is selected in the selecting, and supplying a first constant current to an unselected word line that is, among the word lines, a word line not selected in the selecting, when the data is read from the selected memory cell.

10. The method of reading performed by a cross point variable resistance nonvolatile memory device according to claim 9, wherein in the applying, the first voltage and the first constant current are generated by the same power source that supplies a predetermined voltage at least when the data is read.

11. The method of reading performed by a cross point variable resistance nonvolatile memory device according to claim 9, further comprising:

selectively applying, to the selected bit line, the first voltage or a third voltage for pre-charging prior to reading of data;

selectively applying, to the selected word line, the second voltage or the third voltage; and selectively applying, to the unselected word line, the first constant current or the third voltage.

12. The method of reading performed by a cross point variable resistance nonvolatile memory device according to claim 11, wherein in the applying, in a first step, operations in the selectively applying to the selected bit line, the selectively applying to the selected bit line, and the selectively applying to the unselected word line are controlled so that the third voltage is supplied to the selected bit line in the selectively applying to the selected bit line, to the selected bit line in the selectively applying to the selected bit line, and to the unselected word line in the selectively applying to the unselected word line, and in a second step, operations in the selectively applying to the selected bit line, the selectively applying to the selected bit line, and the selectively applying to the unselected word line are controlled so that the first voltage is supplied to the selected bit line in the selectively applying to the selected bit line, the second voltage is supplied to the selected word line in the selectively applying to the selected word line, and the first constant current is supplied to the unselected word line in the selectively applying to the unselected word line.

13. The method of reading performed by a cross point variable resistance nonvolatile memory device according to claim 12,
wherein the third voltage, which is supplied to the unselected word line in the first step, is substantially equal to a voltage, of the unselected word line, which is dependent on a current supplied by the first current source in the second step.

14. The method of reading performed by a cross point variable resistance nonvolatile memory device according to claim 9,
wherein the selecting includes:
selecting a predetermined word line from among word lines of memory cell arrays; and
supplying a voltage or a current to the word line selected in the selecting of a predetermined word line.

15. The method of reading performed by a cross point variable resistance nonvolatile memory device according to claim 9,
wherein in the reading, the data is read using a first PMOS transistor, a second PMOS transistor, a second current source that supplies a second constant current, and a differential detection circuit.

16. The method of reading performed by a cross point variable resistance nonvolatile memory device according to claim 9,
wherein in the case where a memory cell placed at a cross point of a bit line and a word line above the bit line is an odd layer memory cell, a memory cell placed at a cross point of a bit line and a word line below the bit line is an even layer memory cell, and XZ planes which are formed for respective bit line groups arranged in a Z direction and are aligned in the Y direction are vertical array planes, each of the bit line groups being composed of the bit lines, and the Z direction being a direction in which layers are stacked:
the vertical array planes share the word lines that perpendicularly pass through each of the vertical array planes; and
in each of the vertical array planes, bit lines in all even layers of the layers are commonly connected to a first via extending in the Z direction, and bit lines in all odd layers of the layers are commonly connected to a second via extending in the Z direction,
the cross point variable resistance nonvolatile memory device further includes:
a plurality of global bit lines each of which is provided for a different one of the vertical array planes;
a plurality of first bit line selection switch elements each of which is provided for a different one of the vertical array planes, and has one end connected to the first via;
a plurality of second bit line selection switch elements each of which is provided for a different one of the vertical array planes, and has one end connected to the second via;
a bidirectional current limiting circuit that is provided for each of the vertical array planes, is provided between the global bit line corresponding to the vertical array plane and each of (1) other ends of the first bit line selection switch elements corresponding to the vertical array planes and (2) other ends of the second bit line selection switch elements corresponding to the vertical array planes, and limits a bidirectional current flowing between the global bit line and each of the first bit line selection switch elements and the second bit line selection switch elements; and
a current limiting control circuit that controls the bidirectional current limiting circuit,
the selecting includes:
providing, to the global bit lines, a signal for selecting memory cells and writing into or reading from the selected memory cells; and
providing, to the word lines, a signal for selecting memory cells and writing into or reading from the selected memory cells, and
in the reading, data is read from one of the memory cells which is selected in the providing to the global bit lines and the providing to the word lines.

* * * * *